United States Patent [19]

Smurkoski et al.

[11] Patent Number: 5,260,171
[45] Date of Patent: Nov. 9, 1993

[54] PAPERMAKING BELT AND METHOD OF MAKING THE SAME USING A TEXTURED CASTING SURFACE

[75] Inventors: John A. Smurkoski, Meshoppen; Gary L. Leggitt, Springville, both of Pa.; Gregory L. Wilson, Cincinnati, Ohio

[73] Assignee: The Procter & Gamble Company, Cincinnati, Ohio

[21] Appl. No.: 812,193

[22] Filed: Dec. 20, 1991

Related U.S. Application Data

[62] Division of Ser. No. 546,350, Jun. 29, 1990, Pat. No. 5,098,522.

[51] Int. Cl.$^5$ ................................. G03F 7/00
[52] U.S. Cl. ..................... 430/320; 430/322; 162/116; 162/117; 162/348; 162/903; 428/152; 428/290
[58] Field of Search .............. 430/320, 322; 162/DIG. 1, 162, 348, 116, 117, 358, 358.1–358.5, 903; 428/225, 257, 152, 290

[56] References Cited

U.S. PATENT DOCUMENTS

| | | | |
|---|---|---|---|
| Re. 28,459 | 7/1975 | Cole et al. | 34/6 |
| 1,033,992 | 7/1912 | Crane | 162/117 |
| 1,454,323 | 5/1923 | MacInnes | 427/188 |
| 1,813,587 | 7/1931 | Sindler . | |
| 1,876,432 | 9/1932 | Phillips . | |
| 2,245,014 | 6/1941 | Sherman | 162/117 |
| 2,271,058 | 1/1942 | Binns | 18/59 |

(List continued on next page.)

FOREIGN PATENT DOCUMENTS

| | | |
|---|---|---|
| 0033988 | 8/1981 | European Pat. Off. . |
| 0349779A2 | 1/1990 | European Pat. Off. . |
| 41-9125 | 5/1966 | Japan . |

OTHER PUBLICATIONS

Derwent Abstract of Japanese Patent 53-51253 issued May 10, 1978.
Derwent Abstract of Japanese Patent 55-49230 issued Apr. 9, 1980.
Derwent Abstract of Japanese Patent 56-067226 issued Jun. 6, 1981.
Derwent Abstract of Japanese Patent 57-31535 issued Feb. 20, 1982.

Primary Examiner—Marion E. McCamish
Assistant Examiner—Janis L. Dote
Attorney, Agent, or Firm—Jeffrey V. Bamber; Steven W. Miller; Larry L. Huston

[57] ABSTRACT

A backside textured papermaking belt is disclosed which is comprised of a framework and a reinforcing structure. The framework has a first surface which defines the paper-contacting side of the belt, a second surface opposite the first surface, and conduits which extend between first and second surfaces of the belt. The first surface of the framework has a paper side network formed therein which defines the conduits. The second surface of the framework has a backside network with passageways that provide surface texture irregularities in the backside network. The papermaking belt is made by casting a photosensitive resinous material over and through the reinforcing structure while the reinforcing structure travels over a textured surface, and then exposing the photosensitive resinous material to light of an activating wavelength through a mask which has transparent and opaque regions. A process for making paper products is also disclosed which involves applying a fluid pressure differential from a vacuum source through the belt to a partially-formed embryonic web of papermaking fibers. The fibers in the embryonic web are deflected into the conduits of the papermaking belt by the vacuum pressure while the papermaking belt and the embryonic web travel over the vacuum source. Following the deflection, the paper web is impressed with the paper side network of the belt, and dried to form the final product.

10 Claims, 24 Drawing Sheets

U.S. PATENT DOCUMENTS

| | | | |
|---|---|---|---|
| 2,480,749 | 8/1949 | Marks | 18/58 |
| 2,556,504 | 6/1951 | Prestwich | 18/57 |
| 2,860,576 | 11/1958 | Short | 101/128.3 |
| 2,862,251 | 12/1958 | Kauwaites | 19/161 |
| 3,061,505 | 10/1962 | Heiasti | 162/109 |
| 3,121,660 | 2/1964 | Hall, Jr. | 162/348 |
| 3,301,746 | 1/1967 | Sanford et al. | 162/113 |
| 3,322,617 | 5/1967 | Osborne | 162/296 |
| 3,438,504 | 4/1969 | Furman | 210/483 |
| 3,549,742 | 12/1970 | Benz | 264/250 |
| 3,613,258 | 10/1971 | Jamieson | 34/95 |
| 3,617,442 | 11/1971 | Hurschman | 162/212 |
| 3,658,620 | 4/1972 | Hall | 156/272 |
| 3,713,935 | 1/1973 | Grecchi | 156/231 |
| 3,878,019 | 4/1975 | Chapman et al. | 156/272 |
| 3,974,025 | 8/1976 | Ayers | 162/113 |
| 3,994,771 | 11/1976 | Morgan, Jr. et al. | 162/113 |
| 4,036,684 | 7/1977 | Schmitt et al. | 162/290 |
| 4,042,654 | 8/1977 | Leszyk et al. | 264/22 |
| 4,054,635 | 10/1977 | Schlesinger et al. | 264/219 |
| 4,070,235 | 1/1978 | Marshall | 162/116 |
| 4,119,753 | 10/1978 | Smart | 428/234 |
| 4,172,910 | 10/1979 | Rotar | 427/243 |
| 4,191,609 | 3/1980 | Trokhan | 162/113 |
| 4,239,065 | 12/1980 | Trokhan | 139/383 A |
| 4,251,928 | 2/1981 | Rotar et al. | 34/116 |
| 4,283,454 | 8/1981 | Buchanan | 428/233 |
| 4,291,116 | 9/1981 | Tibbetts | 430/308 |
| 4,340,057 | 7/1982 | Bloch et al. | 128/284 |
| 4,359,069 | 11/1982 | Hahn | 139/425 A |
| 4,382,987 | 5/1983 | Smart | 428/212 |
| 4,405,341 | 9/1983 | Jaschek et al. | 51/298 |
| 4,446,187 | 5/1984 | Eklund | 428/136 |
| 4,507,173 | 3/1985 | Klowak et al. | 162/112 |
| 4,514,345 | 4/1985 | Johnson et al. | 430/308 |
| 4,528,239 | 7/1985 | Trokhan | 428/247 |
| 4,529,480 | 7/1985 | Trokhan | 162/109 |
| 4,637,859 | 1/1987 | Trokhan | 162/109 |
| 4,728,530 | 3/1988 | Waldvogel et al. | 427/44 |
| 4,752,519 | 6/1988 | Boyer et al. | 428/137 |
| 4,759,391 | 7/1988 | Waldvogel et al. | 139/383 A |
| 4,821,780 | 4/1989 | Tate | 139/383 |
| 4,921,750 | 5/1990 | Todd | 428/225 |
| 4,941,514 | 7/1990 | Taipale | 139/383 |
| 4,981,745 | 1/1991 | Lefkowitz | 428/147 |
| 4,995,429 | 2/1991 | Kositzke | 139/383 R |
| 5,059,283 | 10/1991 | Hood et al. | 162/199 |
| 5,073,235 | 12/1991 | Trokhan | 162/199 |

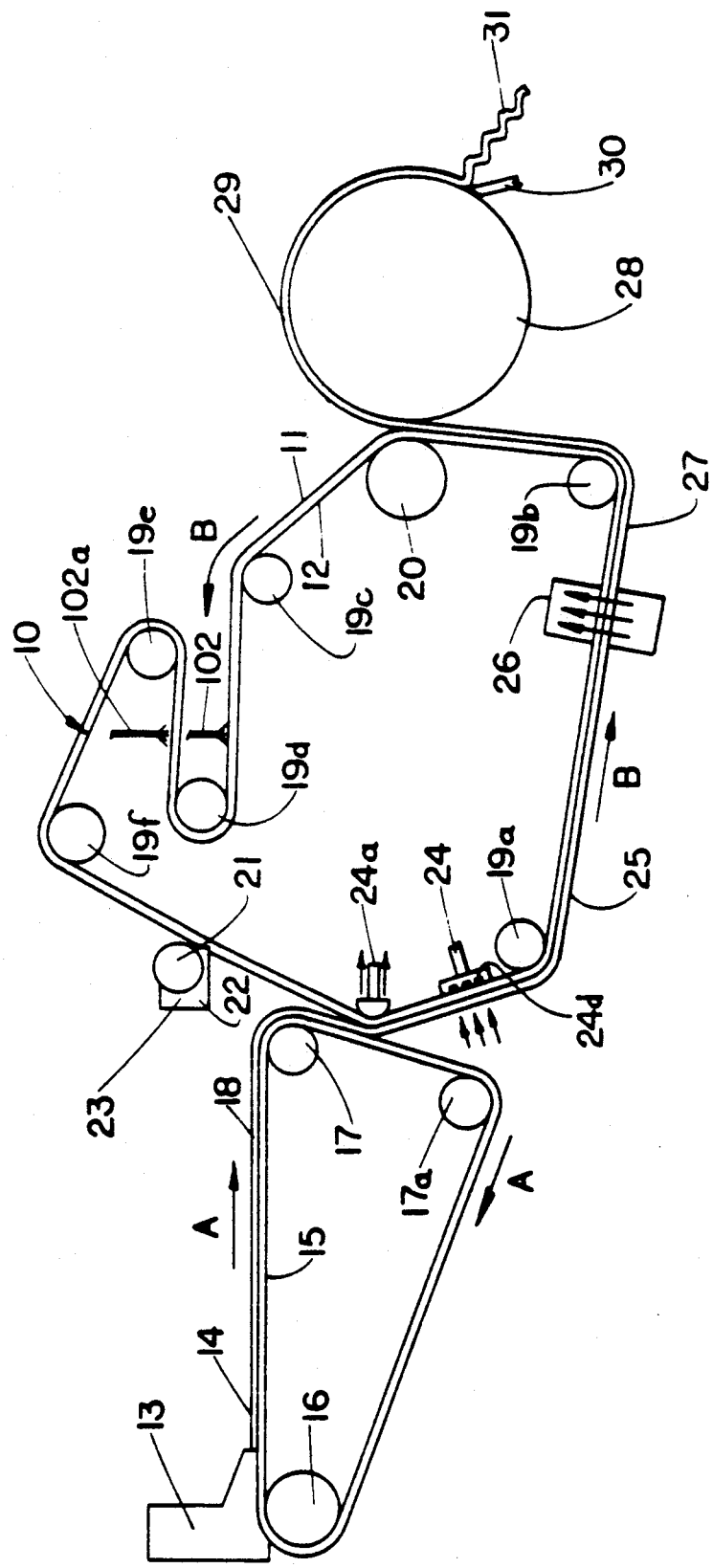

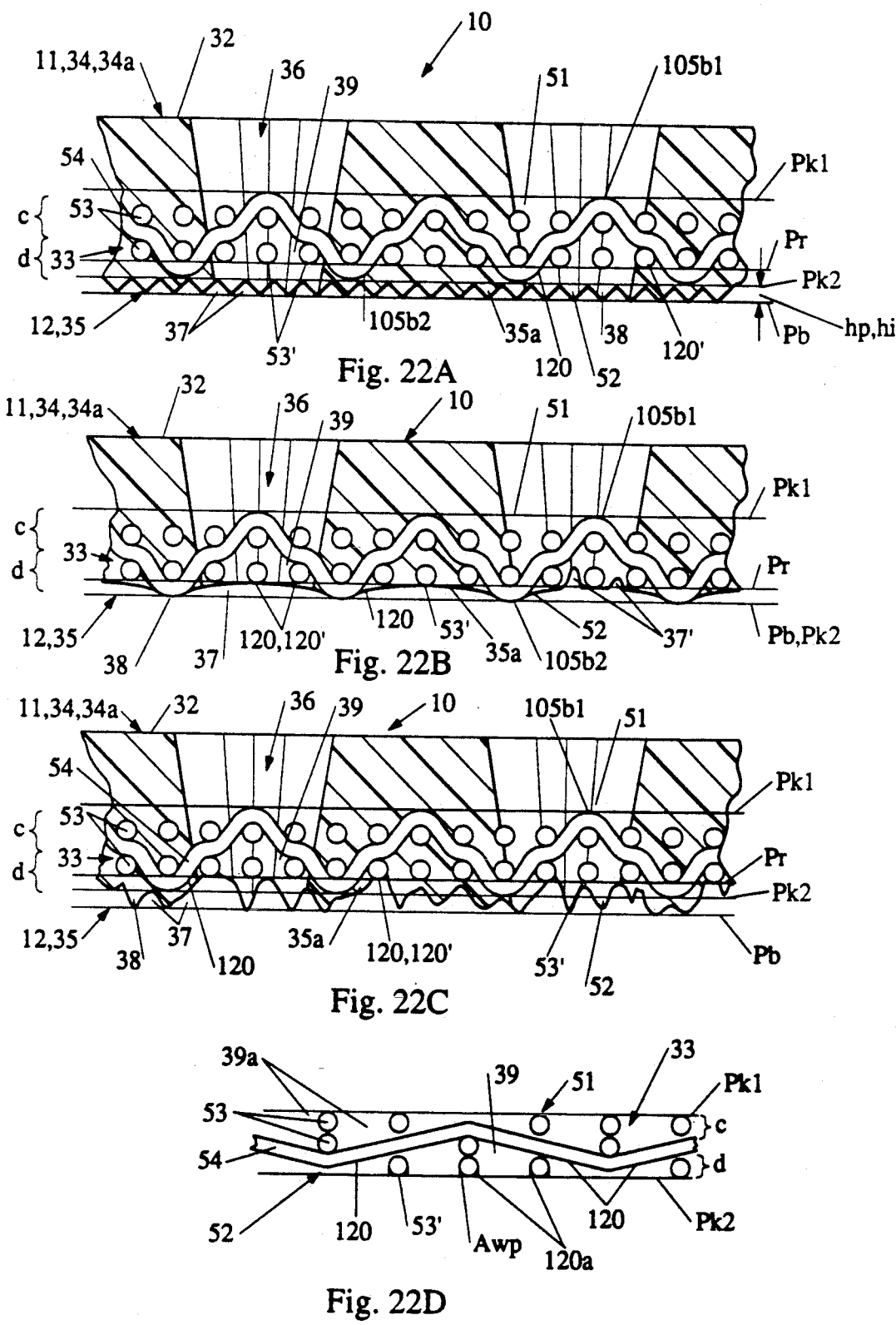

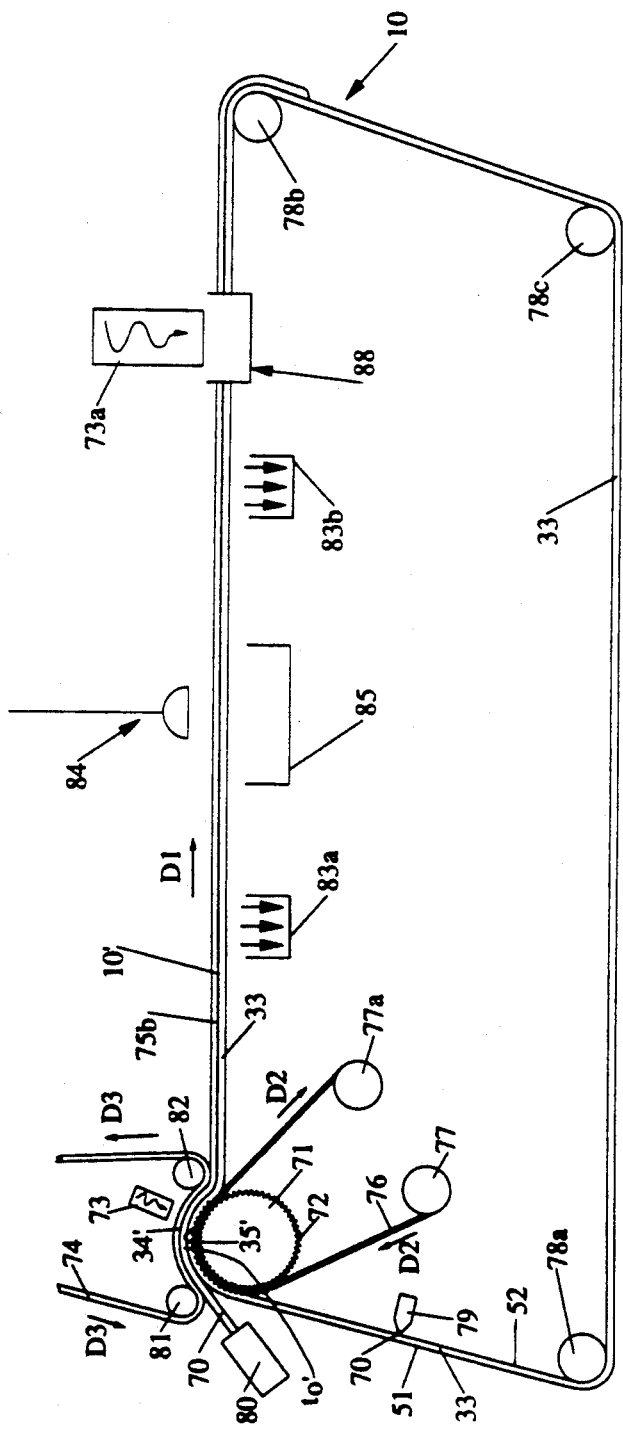
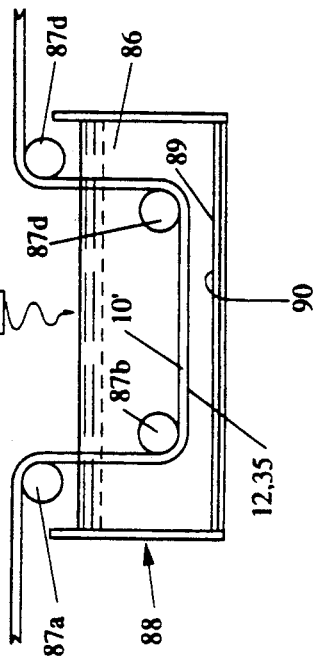
Fig. 25
Fig. 26

PAPERMAKING BELT AND METHOD OF MAKING THE SAME USING A TEXTURED CASTING SURFACE

This is a division of application Ser. No. 07/546,350, filed on Jun. 29, 1990, U.S. Pat. No. 5,098,522.

FIELD OF THE INVENTION

The present invention generally relates to papermaking belts useful in papermaking machines for making strong, soft, absorbent paper products. This invention is also concerned with a method of making such a papermaking belt and papermaking processes which employ these papermaking belts. More particularly, this invention is concerned with papermaking belts comprised of a resinous framework and a reinforcing structure which have a texture on their machine-contacting side, or backside. The texture is imparted to the belt by casting the resinous material over and through the reinforcing structure while the reinforcing structure travels over a textured surface.

BACKGROUND OF THE INVENTION

One pervasive feature of daily life in modern industrialized societies is the use of paper products for a variety of purposes. Paper towels, facial tissues, toilet tissue, and the like are in almost constant use. The large demand for such paper products has created a demand for improved versions of the products and of the methods of their manufacture. Despite great strides in paper making, research and development efforts continue to be aimed at improving both the products and their processes of manufacture.

Paper products such as paper towels, facial tissues, toilet tissue, and the like are made from one or more webs of tissue paper. If the products are to perform their intended tasks and to find wide acceptance, they, and the tissue paper webs from which they are made, must exhibit certain physical characteristics. Among the more important of these characteristics are strength, softness, and absorbency.

Strength is the ability of a paper web to retain its physical integrity during use.

Softness is the pleasing tactile sensation one perceives when they crumple the paper in their hands and when they use the paper for its intended purposes.

Absorbency is the characteristic of the paper which allows it to take up and retain fluids, particularly water and aqueous solutions and suspensions. In evaluating the absorbency of paper, not only is the absolute quantity of fluid a given amount of paper will hold significant, but the rate at which the paper will absorb the fluid is also important. In addition, when the paper is formed into a product such as a towel or wipe, the ability of the paper to cause a fluid to be taken up into the paper and thereby leave a dry wiped surface is also important.

Processes for the manufacturing of paper products for use in tissue, toweling and sanitary products generally involve the preparation of an aqueous slurry of paper fibers and then subsequently removing the water from the slurry while contemporaneously rearranging the fibers in the slurry to form a paper web. Various types of machinery can be employed to assist in the dewatering process.

Currently, most manufacturing processes either employ machines which are known as Fourdrinier wire papermaking machines or machines which are known as twin (Fourdrinier) wire papermachines. In Fourdrinier wire papermaking machines, the paper slurry is fed onto the top surface of a traveling endless belt, which serves as the initial papermaking surface of the machine. In twin wire machines, the slurry is deposited between a pair of converging Fourdrinier wires in which the initial dewatering and rearranging in the papermaking process are carried out.

After the initial forming of the paper web on the Fourdrinier wire or wires, both types of machines generally carry the paper web through a drying process or processes on another fabric in the form of an endless belt which is often different from the Fourdrinier wire or wires. This other fabric is sometimes referred to as a drying fabric. Numerous arrangements of the Fourdrinier wire(s) and the drying fabric(s) as well as the drying process(es) have been used successfully and somewhat less than successfully. The drying process(es) can involve mechanical compaction of the paper web, vacuum dewatering, drying by blowing heated air through the paper web, and other types of processes.

As seen above, papermaking belts or fabrics carry various names depending on their intended use. Fourdrinier wires, also known as Fourdrinier belts, forming wires, or forming fabrics are those which are used in the initial forming zone of the papermaking machine. Dryer fabrics as noted above, are those which carry the paper web through the drying operation of the papermaking machine. Various other types of belts or fabrics are possible also. Most papermaking belts employed in the past are commonly formed from a length of woven fabric the ends of which have been joined together in a seam to form an endless belt. Woven papermaking fabrics generally comprise a plurality of spaced longitudinal warp threads and a plurality of spaced transverse weft threads which have been woven together in a specific weaving pattern. Prior belts have included single layer (of warp and weft threads) fabrics, multilayered fabrics, and fabrics with several layers each of which comprises interwoven warp and weft threads. Initially, the threads of papermaking fabrics were made from wires comprised of materials such as phosphor bronze, bronze, stainless steel, brass or combinations thereof. Often various materials were placed on top of and affixed to the fabrics to attempt to make the dewatering process more efficient. Recently, in the papermaking field, it has been found that synthetic materials may be used in whole or part to produce the underlying wire structures, which are superior in quality to the forming wires made of metal threads. Such synthetic materials have included Nylon, polyesters, acrylic fibers and copolymers. While many different processes, fabrics, and arrangements of these fabrics have been used, only certain of these processes, fabrics, and arrangements of these fabrics have resulted in commercially successful paper products.

An example of paper webs which have been widely accepted by the consuming public are those made by the process described in U.S. Pat. No. 3,301,746 issued to Sanford and Sisson on Jan. 31, 1967. Other widely accepted paper products are made by the process described in U.S. Pat. No. 3,994,771 issued to Morgan and Rich on Nov. 30, 1976. Despite the high quality of products made by these two processes, however, the search for still improved products has, as noted above, continued.

Another commercially significant improvement was made upon the above paper webs by the process described in U.S. Pat. No. 4,529,480 issued to Trokhan on Jul. 16, 1985, which is incorporated by reference herein. The improvement included utilizing a papermaking belt (which was termed a "deflection member") comprised of a foraminous woven member which was surrounded by a hardened photosensitive resin framework. The resin framework was provided with a plurality of discrete, isolated, channels known as "deflection conduits." The process in which this deflection member was used involved, among other steps, associating an embryonic web of papermaking fibers with the top surface of the deflection member and applying a vacuum or other fluid pressure differential to the web from the backside (machine-contacting side) of the deflection member. The papermaking belt used in this process was termed a "deflection member" because the papermaking fibers would be deflected into and rearranged into the deflection conduits of the hardened resin framework upon the application of the fluid pressure differential. By utilizing the aforementioned improved papermaking process, as noted below, it was finally possible to create paper having certain desired preselected characteristics.

The deflection member described in the aforementioned patent issued to Trokhan was made by the process described in U.S. Pat. No. 4,514,345, issued in the name of Johnson, et al., which is the incorporated by reference herein. The process described in the Johnson, et al. patent includes the steps of: 1) coating the foraminous woven element with a photosensitive resin; 2) controlling the thickness of the photosensitive resin to a preselected value; 3) exposing the resin to a light having an activating wave length through a mask having opaque and transparent regions; and 4) removing the uncured resin. This process produced a deflection member with a framework which had a paper web-contacting surface and a machine-contacting surface that were each provided with a network pattern surrounding the conduits which was essentially monoplanar or smooth.

The paper produced using the process disclosed in U.S. Pat. No. 4,529,480 is described in U.S. Pat. No. 4,637,859, issued in the name of Trokhan, which is incorporated herein by reference. This paper is characterized by having two physically distinct regions distributed across its surfaces. One of the regions is a continuous network region which has a relatively high density and high intrinsic strength. The other region is one which is comprised of a plurality of domes which are completely encircled by the network region. The domes in the latter region have relatively low densities and relatively low intrinsic strengths compared to the network region.

The paper produced by the process described in U.S. Pat. No. 4,529,480 was actually stronger, softer, and more absorbent than the paper produced by the preceding processes as a result of several factors. The strength of the paper produced was increased as a result of the relatively high intrinsic strength provided by the network region. The softness of the paper produced was increased as a result of the provision of the plurality of low density domes across the surface of the paper. The absolute quantity of fluid the paper would hold (one of the key factors in determining the absorbency of the paper) was increased due to the fact that the overall density of the paper was reduced.

Although the aforementioned improved process worked quite well, it has been found that when the deflection member of the above-described process passed over vacuum dewatering equipment used in the papermaking process, certain undesirable events occurred. Of most concern was the fact that a large number of partially dewatered fibers in the paper web would pass completely through the deflection member. This would lead to the undesirable result of clogging the vacuum dewatering machinery with the more mobile paper fibers. Another undesirable occurrence was the tendency of these mobile paper fibers to accumulate on the dewatering machinery to the extent of producing clumps of fibers on the machinery. This accumulation of fibers would cause the previous papermaking belts which had smooth backsides to wrinkle and develop folds, particularly longitudinal folds, after they repeatedly traveled over the dewatering machinery during the papermaking process, which in turn would not only result in severe problems with the moisture and physical property profiles of the paper produced, but would result in the eventual failure of the papermaking belt.

The significance of the difficulties experienced with these prior belts was increased by the relatively high cost of the belts. In most cases, manufacturing the foraminous woven element which was incorporated into these belts required (and still requires) expensive textile processing operations, including the use of large and costly looms. Also, substantial quantities of relatively expensive filaments are incorporated into these woven elements. The cost of the belts is further increased when high heat resistant filaments properties are employed, which is generally necessary for belts which pass through a drying operation.

In addition to the cost of the belt itself, the failure of a papermaking belt will also have serious implications on the efficiency of the papermaking process. A high frequency of paper machine belt failures can substantially affect the economies of a paper manufacturing business due to the loss of the use of the expensive papermaking machinery (that is, the machine "downtime") during the time a replacement belt is being fitted on the papermaking machine.

At the time the papermaking process described in U.S. Pat. No. 4,529,480 was developed it was believed that the network formed in the lower surface of the resinous framework (the machine-contacting surface) had to be essentially planar in order to achieve the desired suddenness of application of vacuum pressure needed to deflect and rearrange the fibers into the deflection conduits to form the dome regions in the improved paper.

While not wishing to be bound by any theory, it is now believed that the problems which developed when using the prior smooth backsided papermaking belts may have been at least partially the result of the extremely sudden application of vacuum pressure to the paper web when it passed over the vacuum dewatering machinery. It is believed that the prior smooth backsided papermaking belts would actually temporarily create a seal over the vacuum source. Then, when the open channels (the deflection conduits) of the papermaking belt of the prior type were encountered, the vacuum pressure would be applied to the water laden, highly mobile fibers in the fibrous web situated on top of the resin framework in an extremely sudden fashion. This sudden application of vacuum pressure is believed to have caused the sudden deflection of the mobile fibers which was sufficient to allow them to pass completely through the papermaking belt. It is also believed that this sudden application of vacuum pressure and migration of fibers would account for pin-sized holes in the dome regions of the finished paper, which in some, but not all cases, are undesirable.

Another theory for the excessive accumulation of paper fibers on the surfaces of the vacuum dewatering equipment is that the prior smooth backsided papermaking belts did not have adequate surface texture on their backsides. It is believed that a certain amount of surface texture is necessary to enable such resin-coated belts to remove the paper fibers which accumulate on the vacuum dewatering equipment by the abrasive action of such a belt traveling over the vacuum dewatering equipment.

As a result, a need exists for an improved papermaking process which will not be plagued by the undesirable buildup of these mobile papermaking fibers on the vacuum dewatering machinery employed in the process. A need, therefore, also exists for an improved papermaking belt and a method of making the same which will eliminate the foregoing problems caused by utilizing a papermaking belt made by the prior processes.

Therefore, it is an object of the present invention to provide an improved papermaking process in which the migration of the aforementioned mobile paper fibers is substantially reduced, or eliminated.

It is also an object of the present invention to provide a papermaking belt which will substantially reduce the previous problem of the buildup of paper fibers on the vacuum dewatering machinery which was associated with the prior resin coated papermaking belts.

It is another object of the present invention to reduce the folding and subsequent failures of the papermaking belts due to the accumulation of paper fibers on the surface of the vacuum dewatering equipment employed in the papermaking process.

It is also an object of the present invention to develop a papermaking process which will result in the elimination of the pin-sized holes in the dome regions of the finished paper web (unless such holes are a desirable characteristic for the particular paper being produced).

It is also an object of the present invention to provide a papermaking belt which has passageways that provide surface texture irregularities on the backside of the belt and a method of making this belt in which these passageways can be imparted to the belt without sacrificing the strength of the entire papermaking belt.

It is a further object of the present invention to provide a papermaking belt, which when employed in the papermaking process of the present invention will have a longer life than prior papermaking belts, and a method of making this papermaking belt which is cost effective.

These and other objects of the present invention will be more readily apparent when considered in reference to the following description and when taken in conjunction with the accompanying drawings.

SUMMARY OF THE INVENTION

The backside textured papermaking belt of the present invention is generally comprised of two primary elements: a framework and a reinforcing structure. When the papermaking belt of the present invention is in its preferred form, it is an endless belt which has a paper-contacting side and a textured backside, opposite the paper-contacting side, which contacts the machinery employed in the papermaking process. The framework is preferably a hardened polymeric photosensitive resinous framework which has a first surface which defines the paper-contacting side of the belt, a second surface opposite the first surface, and conduits extending between the first and second surfaces. The first surface of the framework has a paper side network formed therein which surrounds and defines the openings of the conduits. The second surface of the framework defines at least a portion of the textured backside of the belt. In addition, the second surface of the framework has a backside network with passageways therein which are distinct from the conduits. The passageways provide surface texture irregularities in the backside network of the second surface. The reinforcing structure is positioned between the first surface of the framework and at least a portion of the second surface of the framework and serves to strengthen the framework. The reinforcing structure has a paper-facing side and a machine-facing side opposite the paper-facing side. The reinforcing structure also has interstices and a reinforcing component, along with a projected open area defined by the projection of the areas defined by the interstices, and a projected reinforcing area defined by the projection of the reinforcing component. In one embodiment of the papermaking belt, all of the passageways in the second surface of the framework are positioned outward from the plane defined by the machine-facing side of the reinforcing structure. In another embodiment, a multiplicity of passageways are disposed inward of the plane defined by the machine-facing side of the reinforcing structure in the interstices so that a portion of the projected area of the passageways corresponds with a portion of the open area of said reinforcing structure, and a multiplicity of the passageways are positioned outward from the plane defined by the machine-facing side of the reinforcing structure. In both embodiments, the backside surface has sufficient fluid passage capacity to permit at least about 1,800 standard cubic centimeters/minute of air to escape across the textured surface.

The method of making the papermaking belt of the present invention comprises the steps of:

(a) providing a forming unit with a textured working surface;

(b) providing a reinforcing structure having a paper-facing side, a machine-facing side opposite the paper-facing side, and interstices;

(c) bringing at least a portion of the machine-facing side of the reinforcing structure into contact with the working surface of the forming unit;

(d) applying a coating of liquid photosensitive resin to at least one side of the reinforcing structure so that the coating forms a first surface and a second surface, the coating being distributed so that at least a portion of the second surface of the coating is positioned adjacent the working surface of the forming unit, the paper-facing side of the reinforcing structure is positioned between the first and second surfaces of the coating, and the portion of the coating which is positioned between the first surface of the coating and the paper-facing side of the reinforcing structure forms a resinous overburden, wherein at least a portion of the coating penetrates into the texture of the working surface of the forming unit so that areas of the second surface of the coating are defined by the textured surface;

(e) controlling the thickness of the overburden to a preselected value;

(f) providing a mask having opaque and transparent regions, the opaque regions together with the transparent regions defining a preselected pattern in the mask;

(g) positioning the mask between the coating of liquid photosensitive resin and an actinic light source so that the mask is in contacting relation with the first surface of the coating, the opaque regions of the mask shielding a portion of the coating from the light rays of the light source and the transparent regions leaving other portions of the coating unshielded;

(h) curing the unshielded portions of the coating of liquid photosensitive resin and leaving the shielded portions uncured by exposing the coating of liquid photosensitive resin to the light source through the mask to form a partially-formed composite belt; and (i) removing substantially all uncured liquid photosensitive resin from the partially-formed composite belt to leave a hardened resin framework around at least a portion of the reinforcing structure, which framework has a plurality of conduits in those regions which were shielded from said light rays by the opaque regions of the mask and passageways that provide surface texture irregularities in the backside network of said framework corresponding to the places where the second surface of the coating penetrated into the texture of the working surface of the forming unit.

The process for making a strong, soft, absorbent paper web of the present invention comprises the steps of:

(a) providing an aqueous dispersion of papermaking fibers;

(b) forming an embryonic web of papermaking fibers from the dispersion on a foraminous surface;

(c) contacting the embryonic web with the paper-contacting side of the papermaking belt of the present invention;

(d) traveling the papermaking belt and embryonic web over a vacuum source and applying a fluid pressure differential to the embryonic web with the vacuum source such that the fluid pressure differential is applied from the backside of the papermaking belt through the conduits of the papermaking belt to deflect at least a portion of the papermaking fibers in the embryonic web into the conduits of the papermaking belt, and to remove water from the embryonic web through the conduits, and rearrange the papermaking fibers in the embryonic web to form an intermediate web from the papermaking fibers under such conditions that the deflecting is initiated no later than the initiation of the water removal from the embryonic web;

(e) impressing the paper side network into the intermediate web of interposing the intermediate web between the papermaking belt and an impression surface to form an imprinted web of papermaking fibers; and, (f) drying the imprinted web.

BRIEF DESCRIPTION OF THE DRAWINGS

FIG. 1 is a schematic representation of one embodiment of a continuous papermaking machine useful in carrying out the process of this invention.

FIGS. 22A, B, and C are simplified schematic representations of different types of the backside surface texturing which can be found on a papermaking belt.

FIG. 22D is a greatly enlarged view of a portion of a reinforcing component, similar to the reinforcing component shown in FIGS. 22A–C, which shows some of the raised portions of the reinforcing component.

FIG. 25 is a schematic representation of the basic apparatus for making the papermaking belt of the present invention.

FIG. 26 is an enlarged schematic representation of the post-cure unit of the apparatus shown in FIG. 25.

DETAILED DESCRIPTION OF THE INVENTION

Figure 1A:
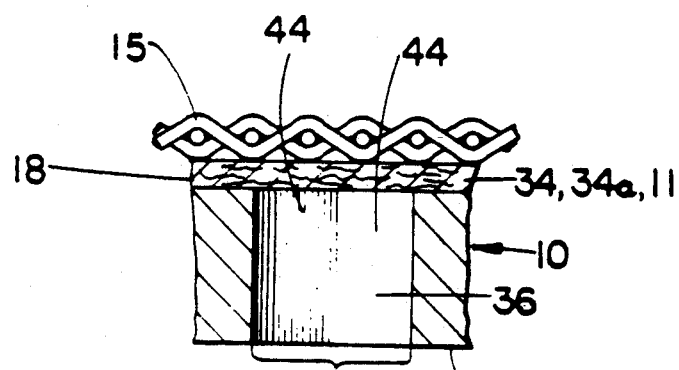
FIG. 1A is a simplified schematic representation of a cross-section which shows the partially-formed embryonic web of papermaking fibers prior to its deflection into a conduit of the papermaking belt of the present invention.

The specification contains the following, in order: a detailed description of the papermaking belt of the present invention; one basic method of making this papermaking belt and several variations of the same; and a detailed description of the process for making paper according to the present invention.

1. The Papermaking Belt

In the representative papermaking machine illustrated in FIG. 1, the papermaking belt of the present invention takes the form of an endless belt, papermaking belt 10. In FIG. 1, the papermaking belt 10 carries a paper web (or "fiber web") in various stages of its formation and travels in the direction indicated by directional arrow B around the papermaking belt return rolls 19a and 19b, impression nip roll 20, papermaking belt return rolls 19c, 19d, 19e and 19f, and emulsion distributing roll 21. The loop the papermaking belt 10 travels around includes a means for applying a fluid pressure differential to the paper web, such as vacuum pickup shoe 24a and multislot vacuum box 24. In FIG. 1, the papermaking belt also travels around a predryer such as blow-through dryer 26, and passes between a nip formed by the impression nip roll 20 and a Yankee dryer drum 28.

Although the preferred embodiment of the present invention is in the form of an endless belt, the present invention can be incorporated into numerous other forms which include, for instance, stationary plates for use in making handsheets or rotating drums for use with other types of continuous processes. Regardless of the physical form which the papermaking belt 10 takes, it generally has certain physical characteristics.

Figure 2:
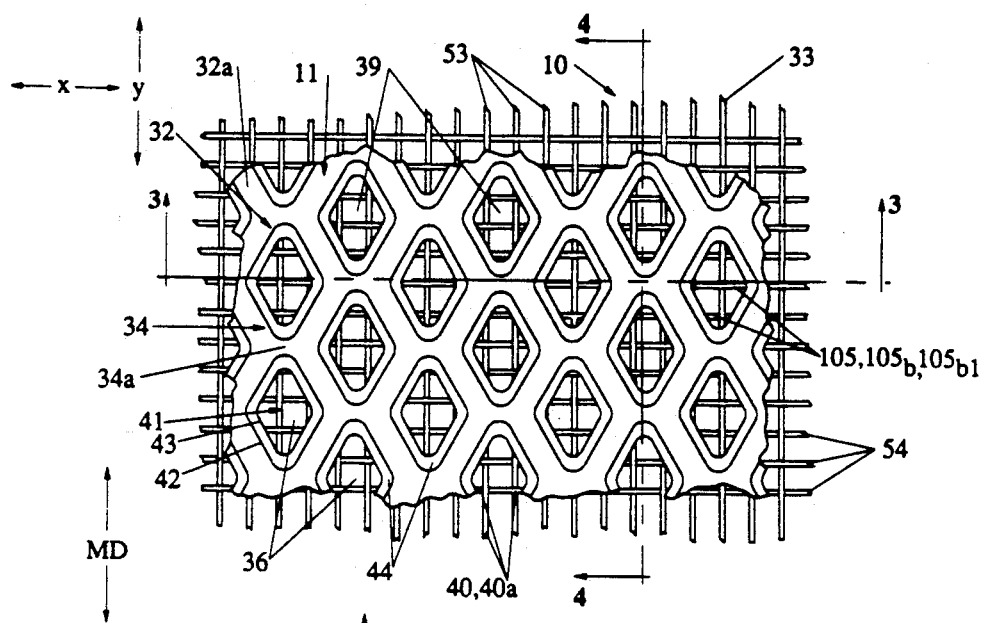
FIG. 2 is a plan view of a portion of the preferred embodiment of the improved papermaking belt of the present invention.
Figure 3:
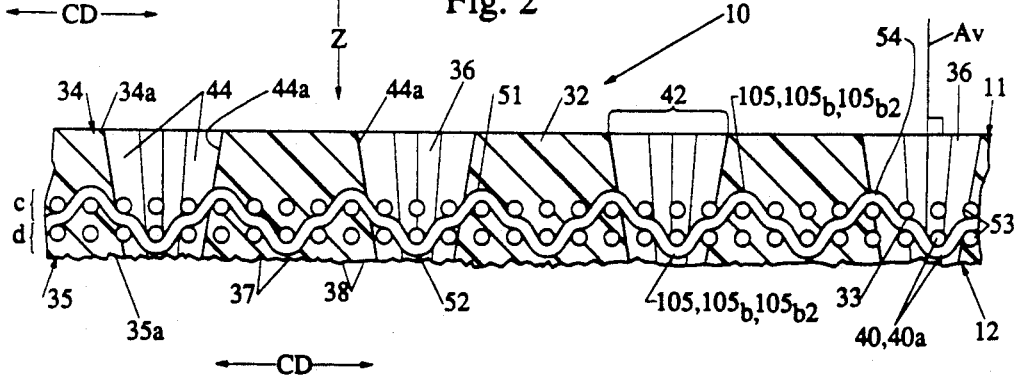
FIG. 3 is an enlarged cross-sectional view of the portion of the papermaking belt shown in FIG. 2 as taken along line 3—3.
Figure 4:
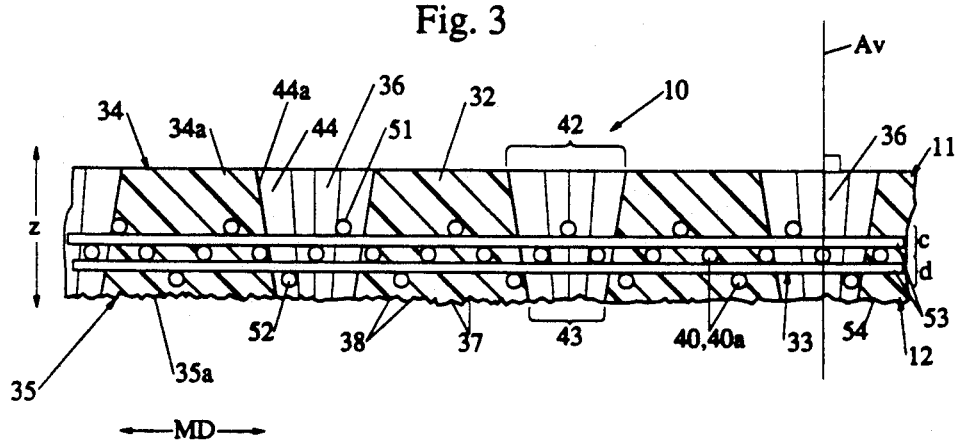
FIG. 4 is an enlarged cross-sectional view of the portion of the papermaking belt shown in FIG. 2 as taken along line 4—4.

The overall characteristics of the papermaking belt 10 of the present invention are shown in FIGS. 2-4. The papermaking belt (or simply the "belt") 10 of the present invention is generally comprised of two primary elements: a framework 32 (preferably, a hardened polymeric photosensitive resin framework) and a reinforcing structure 33. When the papermaking belt 10 is an endless belt, it generally has two opposed surfaces which are referred to herein as the paper-contacting side 11 and the textured backside, or simply, the backside 12. The backside 12 of the belt 10 contacts the machinery employed in the papermaking operation, such as vacuum pickup shoe 24a and multislot vacuum box 24. The framework 32 has a first surface 34, a second surface 35 opposite the first surface 34, and conduits 36 extending between the first surface 34 and the second surface 35. The first surface 34 of the framework 32 contacts the fiber webs to be dewatered, and defines the paper-contacting side 11 of the belt. The second surface 35 defines at least a portion of the textured backside 12 of the belt 10. The conduits 36 extending between the first surface 34 and the second surface 35 channel water from the fiber webs which rest on the first surface 34 to the second surface 35 and provide areas into which the fibers of the fiber web can be deflected and rearranged. FIG. 2 shows that the network 32a comprises the solid portion of the framework 32 which surrounds the conduits 36 defines a net-like pattern. As shown in FIG. 2, the openings 42 of the conduits 36 are arranged in a preselected pattern in the network 32a. FIG. 2 shows that the first surface 34 of the framework 32 has a paper side network 34a formed therein which surrounds and defines the openings 42 of the conduits 36 in the first surface 34 of the framework 32. As will be subsequently shown in FIG. 36B, the second surface 35 of the framework 32 has a backside network 35a which surrounds and defines the openings 43 of the conduits 36 in the second surface 35 of the framework 32. FIGS. 3 and 4 show that the reinforcing structure 33 of the papermaking belt 10 of the present invention, in general, is at least partially surrounded by and enveloped (or embedded, or encased) in the framework 32. More specifically, the reinforcing structure 33 is positioned between the first surface 34 of the framework 32 and at least a portion of the second surface 35 of the framework 32. FIGS. 3 and 4 also show that the reinforcing structure 33 has a paper-facing side 51 and a machine-facing side 52, opposite the paper-facing side 51. As shown in FIG. 2, the reinforcing structure 33 has interstices 39 and a reinforcing component 40. The reinforcing component 40 comprises the portions of the reinforcing structure exclusive of the interstices 39 (that is, the solid portion of the reinforcing structure 33). The reinforcing component 40 is generally comprised of a plurality of structural components 40a. The reinforcing structure 33 has a projected open area defined by the projection of the areas defined by the interstices 39, and a projected reinforcing area defined by the projection of the reinforcing component 40. FIGS. 3 and 4 show that the second surface 35 of the framework 32 has a backside network 35a with a plurality of passageways 37 that provide surface texture irregularities 38 in the backside network 35a of the framework 32. The passageways 37 are distinct from the conduits 36 which extend between the first surface 34 and second surface 35 of the framework 32. The passageways 37 allow air to enter between the backside surface 12 of the papermaking belt 10 and the surfaces of the vacuum dewatering equipment employed in the papermaking process (such as vacuum pickup shoe 24a and vacuum box 24) when a vacuum is applied by the dewatering equipment to the backside 12 of the belt to deflect the fibers into the conduits 36 of the belt 10. The surface texture irregularities 38 provide an uneven surface for contacting the machinery employed in the papermaking operation.

The paper-contacting side 11 of the belt 10 shown in FIGS. 1-4 is the surface of the papermaking belt 10 which contacts the paper web which is to be dewatered and rearranged into the finished product. As shown in FIG. 1, the side of the belt 10 referred to as the paper-contacting side 11 is referred to as such even though it only carries a paper web for a portion of each revolution in the papermaking machine. The side of the belt 10 referred to as the paper-contacting side 11 is also consistently referred to as such even though during a portion of each revolution (such as adjacent papermaking belt return roll 19d), it may briefly come in contact with the machinery employed in the papermaking process. The paper-contacting side 11 of the belt 10 may also be referred to as the "top surface" or the "embryonic web-contacting surface" of the belt 10. It is to be understood that although the paper-contacting side 11 of the belt 10 may be referred to as the top surface, the orientation of the paper-contacting side 11 may be such that it is facing downwardly on the return path in a papermaking machine when the belt 10 is in the configuration of an endless belt. As shown in FIGS. 2-4, the paper-contacting side 11 of the belt 10 is generally formed entirely by the first surface 34 of the framework 32.

As shown in FIG. 1, the opposed surface of the belt 10, the backside 12, is the surface which travels over and is generally in contact with the papermaking machinery employed in the papermaking process, such as the papermaking belt return rolls 19a-19c and 19e and 19f and the vacuum pickup shoe 24a and vacuum box 24, as well as other vacuum dewatering equipment not illustrated in the drawings. FIG. 1 shows that the side of the belt 10 referred to as the backside 12 is referred to as such even though it may occasionally face away from the machinery employed in the papermaking process (such as adjacent papermaking belt return roll 19d). The backside 12, however, can be distinguished from the paper-contacting side 11 because the backside 12 never contacts a paper web during the papermaking process. The backside 12 of the papermaking belt 10 of the present invention may also be referred to herein as the "bottom surface" of the belt. It may also be referred to as the "wear surface" of the belt because it is the surface of the belt which is subjected to the abrasive action of being repeatedly traveled over the papermaking machinery during the papermaking process. It is to be understood that although the backside 12 of the belt 10 may be referred to as the bottom surface, the orientation of the backside 12 may be such that it is facing upward on the return path in a papermaking machine when the belt 10 is in the configuration of an endless belt. As shown in FIGS. 3 and 4, the backside 12 of the belt 10 may be formed entirely by the second surface 35 of the framework 32. Alternatively, the backside 12 may be formed entirely by the machine-facing side 52 of the reinforcing structure 33; or, it may be formed partially by the second surface 35 of the framework 32 and partially by the machine-facing side 52 of the reinforcing structure 33. It is this bottom surface or backside 12 and the methods of creating passageways and surface texture irregularities in the same which are of primary importance in this invention.

The reinforcing structure 33, one of the primary elements of the papermaking belt 10 of the present invention, is shown in FIGS. 2-4. The reinforcing structure 33 strengthens the resin framework 32 and has suitable projected open area to allow the vacuum dewatering machinery employed in the papermaking process to adequately perform its function of removing water from partially-formed webs of paper, and to permit water removed from the paper web to pass through the papermaking belt 10. The reinforcing structure 33 can take any number of different forms. The reinforcing structure 33 can comprise a woven element (also sometimes referred to herein as a woven "fabric"), a nonwoven element, a screen, a net (for instance, thermoplastic netting), a scrim, or a band or plate (made of metal or plastic or other suitable material) with a plurality of holes punched or drilled in it provided the reinforcing structure 33 adequately reinforces the framework 32 and has sufficient projected open area for the purposes specified above. Preferably, the reinforcing structure 33 comprises a woven element (or more particularly, a foraminous woven element) such as that shown in FIGS. 2-4.

Generally, as shown in FIGS. 2-4, the reinforcing structure 33 comprises a reinforcing component 40 and a plurality of interstices (or "fine foramina") 39. The reinforcing component 40 is the portion of the reinforcing structure 33 exclusive of the interstices 39. In other words, the reinforcing component 40 is the solid portion of the reinforcing structure 33. The reinforcing component 40 is comprised of one or more structural components 40a. As used herein, the term "structural components" refers to the individual structural elements that comprise the reinforcing structure 33.

The interstices 39 allow fluids (such as water removed from the paper web) to pass through the belt 10. The interstices 39 form one of the groups of openings in the papermaking belt 10. FIG. 2 shows that the interstices 39 may form a pattern in the reinforcing structure 33. The pattern formed by the interstices 39, however, is to be contrasted with the preselected pattern formed by the conduit openings, such as first conduit openings 42. FIG. 2 shows that typically, each interstice 39 is only a fraction of the size of a conduit opening 42, but the alternate relationship is possible.

As shown in FIGS. 3 and 4, the reinforcing structure 33 has two sides. These are the paper-facing side (or the "paper support side"), generally designated 51, which faces the fiber webs to be dewatered, and the machine-facing side (or "roller contact side") generally designated 52, opposite the paper-facing side, which faces the machinery employed in the papermaking operation. The sides of the reinforcing structure 33 referred to as the paper-facing side 51 and the machine-facing side 52 are referred to as such even though there may be brief portions of each revolution of the papermaking belt 10 when they face in the opposite direction. In addition, the respective sides of the reinforcing structure 33 are consistently referred to by these names even prior to the incorporation of the reinforcing structure 33 into the papermaking belt 10 of the present invention and the installation of the belt 10 in a papermaking machine. Thus, the side of the reinforcing structure 33 referred to as the machine-facing side 52 in the method of making the papermaking belt 10 of the present invention will be that side which generally faces the papermaking machinery when the finished belt is installed in a papermaking machine. The paper-facing side 51 will always be opposite the machine-facing side 52. As shown in FIGS. 3 and 4, the reinforcing structure 33 is positioned between the first surface 34 of the framework 32 and at least a portion of the second surface 35 of the framework 32.

FIGS. 2-4 show that when the reinforcing structure 33 comprises a woven element, the individual yarns which are woven together to form the woven element comprise the structural components 40a of the reinforcing structure 33. If the reinforcing structure 33 comprised a nonwoven element, the individual fibers forming the nonwoven element would comprise the structural components 40a. In both cases, there will be a plurality of structural components such that all of these structural components 40a will together comprise the reinforcing component 40. If, on the other hand, the reinforcing structure 33 is a plate with a plurality of holes punched in it, there will be only one structural component 40a (the plate), and this will comprise the reinforcing component 40.

The structural components 40a of a woven reinforcing structure comprise yarns, strands, filaments, or threads. It is to be understood that the terms yarns, strands, filaments, and threads are synonymous when used to describe the structural components 40a of a woven reinforcing structure. It is also to be understood that the above terms (yarns, strands, etc.) could comprise not only monofilament elements, but also multifilament elements.

When the reinforcing structure 33 comprises a woven element, as shown in FIGS. 2-4, some of the individual structural components 40a comprise machine-direction warp yarns, generally designated 53, and some comprise cross-machine direction weft yarns, generally designated 54. As used herein, the terms "machine-direction warp", "warp", and "load-bearing warp" are synonymous and refer to yarns which are generally oriented in the machine direction when the papermaking belt 10 of the present invention is installed in a papermaking machine. As used herein, the terms "cross-machine direction weft", "weft", "shute", and "warp balancing weft" are synonymous and refer to yarns which are generally oriented in the cross-machine direction when the papermaking belt 10 of the present invention is installed in a papermaking machine.

In papermaking, the term "machine direction" (MD) refers to that direction which is parallel to the flow of the paper web through the equipment. The "cross-machine direction" (CD) is perpendicular to the machine direction. These directions are indicated by arrows in FIG. 2 and in several of the figures which follow.

The definitions of warp yarns and weft yarns used herein may sometimes differ from the definitions of those terms when describing the orientation of the yarns of a woven fabric when it is being woven in a loom. In the weaving art, whether a yarn is referred to as a warp or a weft depends in part upon whether the fabric is an endless woven fabric that does not have to be seamed into a loop to form an endless belt, or whether it is a flat woven fabric which must be seamed into a loop to form an endless belt. For an endless woven fabric that need not be seamed into a loop, the threads which are referred to as warps in the loom will extend crosswise in a papermaking machine. On the other hand, if a fabric is woven flat, and then seamed into a loop, the threads which are referred to as warp threads in the loom will extend in the machine direction in a papermaking machine. As used herein, the terms "warp yarns" and "weft yarns" refer to the orientation of the yarns when the fabric is in place on a papermaking machine, rather than while it is being woven in a loom. Thus, "warp yarns" means machine-direction warp yarns, and "weft yarns" means cross-machine direction weft yarns when the papermaking belt of the present invention is installed on a papermaking machine.

FIGS. 2-4 also show that in a woven reinforcing structure 33, some of the yarns will cross to form knuckles 105 in the fabric. As used herein a "knuckle" is either a portion of a weft yarn that passes over a warp yarn or a portion of a warp yarn that passes over a weft yarn which lies in the plane of one of the surfaces (that is, either the paper-facing side 51, or the machine-facing side 52) of the reinforcing structure 33. Knuckles which lie in the paper-facing side 51 of the reinforcing structure 33 (or "paper side knuckles") are designated $105_1$. Knuckles which lie in the machine-facing side 52 (or "backside knuckles") are designated $105_2$. These knuckles 105 may be further classified herein and referred to as either "warp knuckles", or "weft knuckles".

Figure 5:
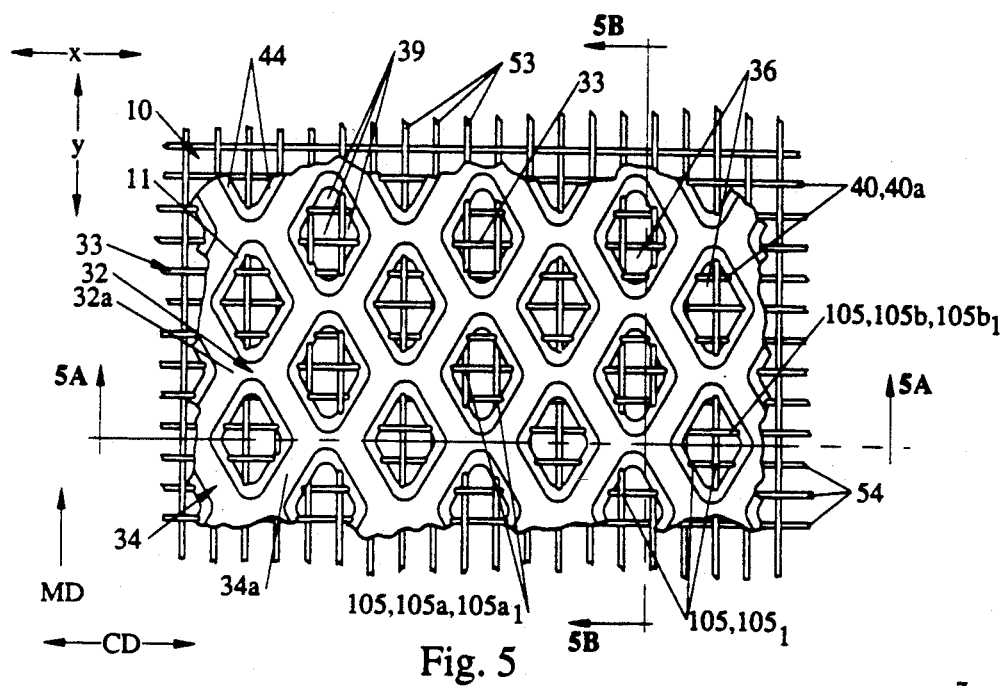
FIG. 5 is a plan view of a portion of an alternative embodiment of the papermaking belt of the present invention which has a monolayer reinforcing structure.
Figure 5A:
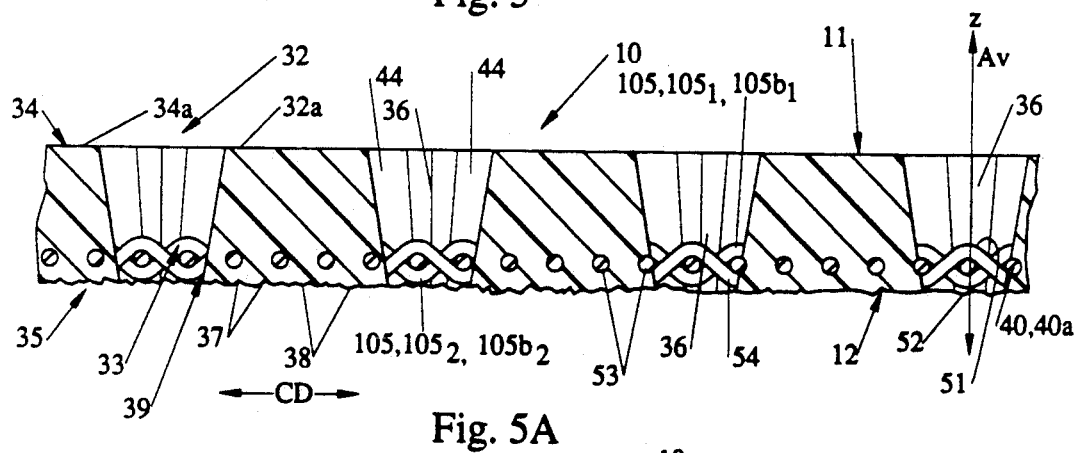
FIG. 5A is a cross-sectional view of the portion of the papermaking belt shown in FIG. 5 as taken along line 5A—5A.
Figure 5B:
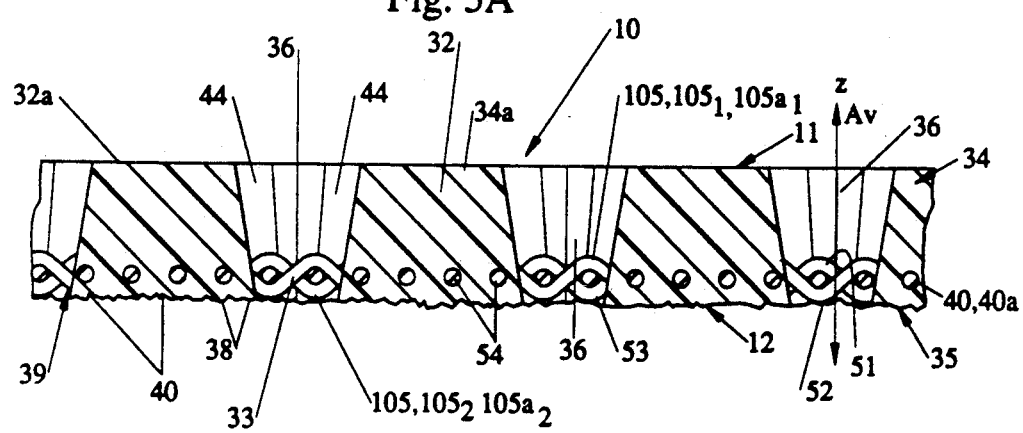
FIG. 5B is a cross-sectional view of the portion of the papermaking belt shown in FIG. 5 as taken along line 5B—5B.

As used herein, the term "warp knuckles" will refer to the knuckles formed by a portion of a warp yarn that passes over a weft yarn. Several such warp knuckles are designated 105a in the alternative embodiment of the papermaking belt 10 of the present invention shown in FIG. 5 (which includes a monolayer reinforcing structure 33). As shown in cross-section in FIG. 5B, the warp knuckles 105a can lie either in the paper-facing side 51 or in the machine-facing side 52 of the reinforcing structure 33. Warp knuckles which lie in the paper-facing side 51 of the reinforcing structure 33 are designated $105a_1$, and warp knuckles which lie in the machine-facing side 52 are designated $105a_2$.

The knuckles formed by a portion of a weft yarn that passes over a warp yarn are referred to herein as "weft knuckles". Several such weft knuckles are shown as 105b in FIGS. 2 and 3. FIG. 3 shows that the weft knuckles, like the warp knuckles, can either lie in the paper-facing side 51 of the reinforcing structure 33, such as weft knuckle $105b_1$, or they can lie in the machine-facing side 52 of the reinforcing structure 33, such as weft knuckle $105b_2$.

Many types of woven elements are suitable for use as a reinforcing structure 33 in the papermaking belt 10 of the present invention. Suitable woven elements include foraminous monolayer woven elements (having a single set of strands running in each direction and a plurality of openings therebetween) such as the reinforcing structure 33 shown in FIGS. 5, 5A, and 5B, multilayer woven elements (woven fabrics having more than one set of strands running in at least one direction), and fabrics with several layers each of which comprises interwoven strands.

Multilayer woven fabrics are preferred as reinforcing structures because they can extend the useful life of the composite papermaking belt. As used herein, the term "composite papermaking belt" refers to a belt which is comprised of a framework and a reinforcing structure. The papermaking belt 10 comes under considerable stress in the machine direction due to the repeated travel of the belt 10 over the papermaking machinery in the machine direction and also due to the heat transferred to the belt by the drying mechanisms employed in the papermaking process. Such heat and stress give the papermaking belt a tendency to stretch. If the papermaking belt 10 should stretch out of shape, its ability to serve its intended function of carrying a paper web through the papermaking process becomes diminished to the point of uselessness.

To be suitable for use as a reinforcing structure in the papermaking belt of the present invention, a multilayer woven element preferably has some type of structure which provides for reinforcement of its machine direction yarns 53 in order to reduce the aforementioned stretching problem. In other words, the multilayer fabric must have increased fabric stability in the machine-direction. The arrangement of the warp yarns 53 should be such that any additional reinforcement of the warp yarns does not reduce the projected open area of the reinforcing structure 33.

As used herein, the term "projected area" means the area formed by projecting the points which define the element in issue into a plane. More particularly, it is to be understood that these points will be projected in a direction which will be referred to as the "z-direction". The projected open area of the reinforcing structure is shown as $A_o$ in FIG. 12 of the accompanying drawings. As used herein, the term "projected open area" refers to the projected area defined by the projection in the z-direction of all the areas defined by the interstices 39 of the reinforcing structure 33. In other words, the projected open area $A_O$ of the reinforcing structure 33 is that area seen when the reinforcing structure 33 is viewed from a direction perpendicular to either side of the reinforcing structure 33 through the interstices 39 which provide direct lines of sight through the fabric.

Throughout this description, references will be made to the x, y, and z directions. As used herein, the x, y, and z directions are orientations relating to the papermaking belt of the present invention (or portions thereof) in a Cartesian coordinate system. In the Cartesian coordinate system described herein, the backside 12 of the belt lies in the plane formed by the x and y axes. The x axis is the cross-machine direction, the y axis is the machine direction, and the z axis is perpendicular to the plane defined by the x and y axes. As used herein, the "z-direction" refers to those orientations which run parallel to the z axis and perpendicular to the x and y axes. These directions are best shown in FIGS. 2-4.

The projected open area of the reinforcing structure 33 should preferably be such that the reinforcing structure 33 is highly permeable (to fluids such as air and water). By "highly permeable" it is meant that the reinforcing structure 33 should have an air permeability in the range of about 800 cfm to about 1,400 cfm per ft.$^2$ of its surface at a pressure differential of 100 pascals. The air permeability of the reinforcing structure 33 is of primary importance because it contributes with the framework to establish an air permeability for the composite belt. The composite belt should have an air permeability in the range of about 300 cfm to about 600 cfm. The preferred air permeability for the composite belt is about 500 cfm. In order for both the reinforcing structure 33 and composite belt to be sufficiently permeable, it is preferable that the projected open area $A_o$ of the reinforcing structure 33 not be reduced below about 30%, and most preferably that the projected open area not be reduced below about 40% to about 50%.

As shown in FIGS. 2-4, a preferred reinforcing structure 33 is a multilayer woven element that has a single layer yarn system with yarns which extend in a first direction and a multiple layer yarn system with yarns which extend in a second direction which is normal to the first direction. In the preferred reinforcing structure 33 shown in FIGS. 2-4, the first direction is the cross-machine direction. The single layer of yarns which extend in the first direction comprise the weft yarns 54. In the reinforcing structure 33 shown in FIGS. 2-4, the multiple layer yarn system extends in the machine direction (that is, the direction the fabric travels on a papermaking machine). The multiple layer yarn system comprises a first warp layer C, and a second warp layer D. Each of the warp layers C and D comprises a plurality of warp yarns 53. Although the most preferred fabrics for use as a reinforcing structure have multiple machine direction warp yarns, the present invention can also be practiced using a fabric which has multiple strands in the cross-machine direction. Fabrics having multiple machine direction warp yarns are preferred, however, because the additional strands run in the direction which is generally subject to the greatest stresses.

As shown in FIG. 3, the preferred multilayer reinforcing structure 33 has warp yarns 53 which are vertically stacked directly on top of one another. The vertically-stacked warp yarns 53 provide increased stability for the composite belt 10 in the machine or process direction. The stacked arrangement of the warp yarns also provides suitable projected open area so the belt 10 can be used in a variety of types of papermaking processes, including blow-through drying papermaking processes. The weft yarns 54 are preferably arranged in such a manner that they maintain and stabilize the warp yarns 53 in a vertically-stacked arrangement. The weft yarns 54 may also be vertically stacked, or they may be in some other relationship. Numerous variations of such arrangements are possible.

FIGS. 6 through 11 show the details of the weave pattern of the particular preferred multilayer reinforcing structure 33 shown in FIGS. 2-4. As used herein, the term "weave pattern" means the technical design of a weave. The multilayer fabric is shown in FIGS. 6 through 11 without the surrounding framework for clarity of illustration. Although the same fabric is shown in FIGS. 2-4 as a composite element in a papermaking belt (that is, as a reinforcing structure for reinforcing the framework 32 of the papermaking belt 10 of the present invention), the fabric shown is also suitable for use by itself as a papermaking belt without such a framework. However, the multilayer fabric described herein is preferably used in conjunction with a framework of some type.

Figure 6:
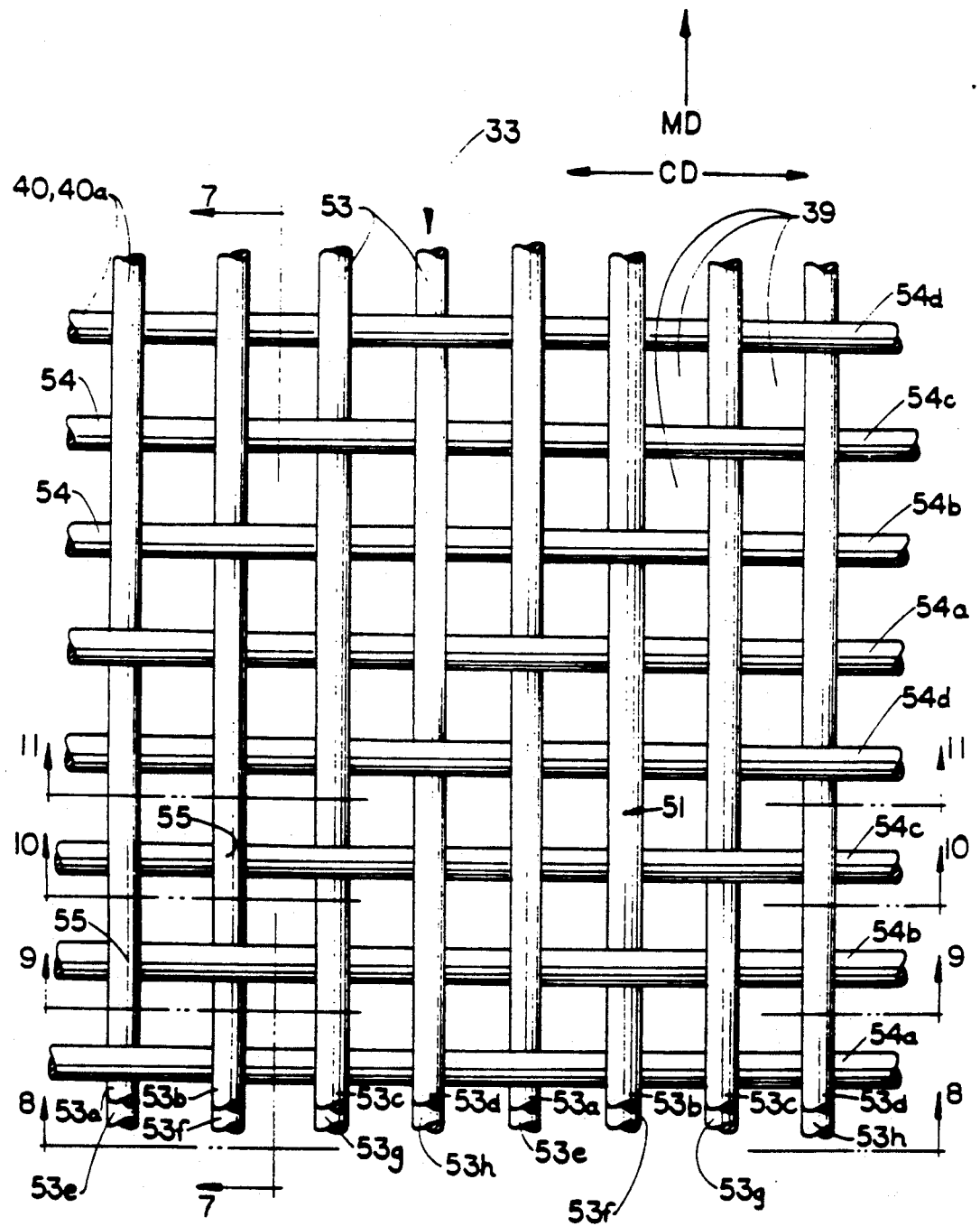
FIG. 6 is an enlarged plan view of a preferred woven multiplayer reinforcing structure which can be used in the papermaking belt of the present invention.

Generally, as shown in FIGS. 6 through 11, the first warp layer C of warp yarns 53 extend in the machine direction on the paper-facing side 51 of the fabric. The individual warp yarns in the first warp layer C are numbered repeatedly across the fabric as 53a, 53b, 53c, and 53d. The second layer D of warp yarns 53 extend in the machine direction on the machine-facing side 52 of the fabric. The individual warp yarns in the second warp layer D are numbered repeatedly across the fabric as 53e, 53f, 53g, and 53h. As best shown in FIGS. 8-11, the individual warp yarns in the first warp layer C and the second warp layer D define stacked warp yarn pairs E, F, G, and H. The individual yarns which define the stacked warp yarn pairs E, F, G, and H are arranged in a generally vertically-stacked superposed position one over the other. These stacked warp yarn pairs, E, F, G, and H, are also repeatedly numbered across the fabric. FIGS. 8-11 show that the individual warp yarns 53a and 53e define stacked warp yarn pair E; warp yarns 53b and 53f define stacked warp yarn pair F; warp yarns 53c and 53g define stacked warp yarn pair G; and, warp yarns 53d and 53h define stacked warp pair H. As shown in FIG. 6 and in FIGS. 8-11, the adjacent stacked warp yarn pairs are spaced apart in the cross-machine direction to provide the desired fabric open area.

As shown in FIG. 6, since the warp yarns 53 are stacked on top of one another, the effective density of the warps yarns 53 (or "thread density" of the warp yarns) is doubled without decreasing the open area of the reinforcing structure 33. As used herein, the term "thread density" refers to a measurement which equals the product of the number of threads per unit width of the fabric (which unit of width generally used is an inch) and the thread diameter (which is also generally measured in inches). The term "thread density" can more particularly be expressed for the warp yarns of a fabric (i.e., the warp thread density) or the weft yarns of a fabric (i.e., the weft thread density).

Figure 8:
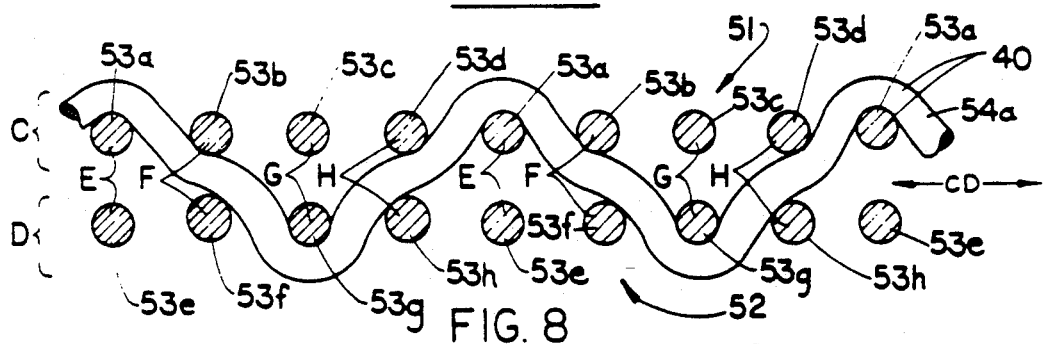
FIG. 8 is an extended sectional view of the reinforcing structure of FIG. 6 taken along line 8—8 of FIG. 6.
Figure 9:
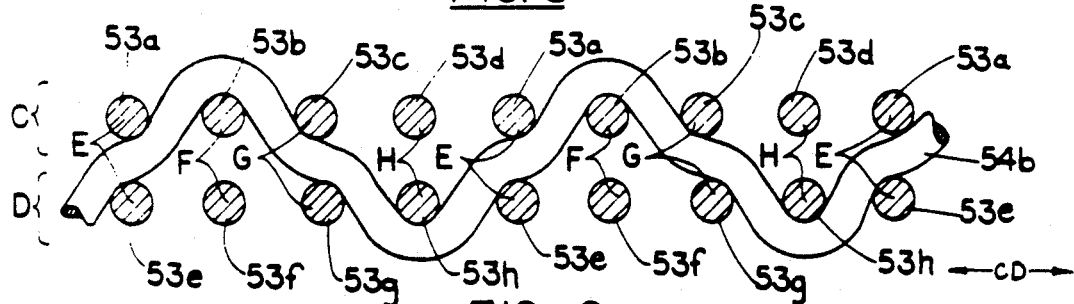
FIG. 9 is an extended sectional view of the reinforcing structure of FIG. 6 taken along line 9—9 of FIG. 6.
Figure 10:
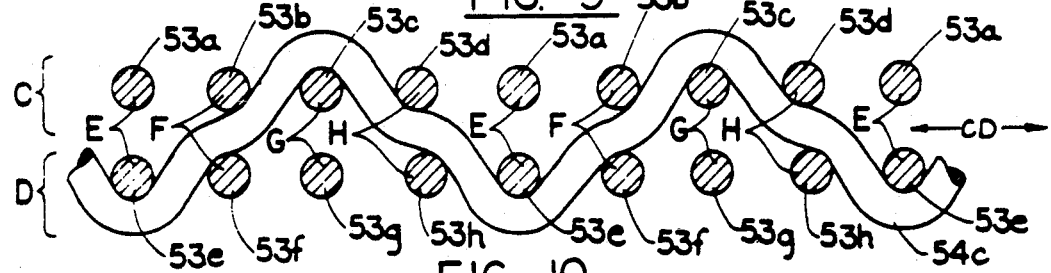
FIG. 10 is an extended sectional view of the reinforcing structure of FIG. 6 taken along line 10—10 of FIG. 6.
Figure 11:
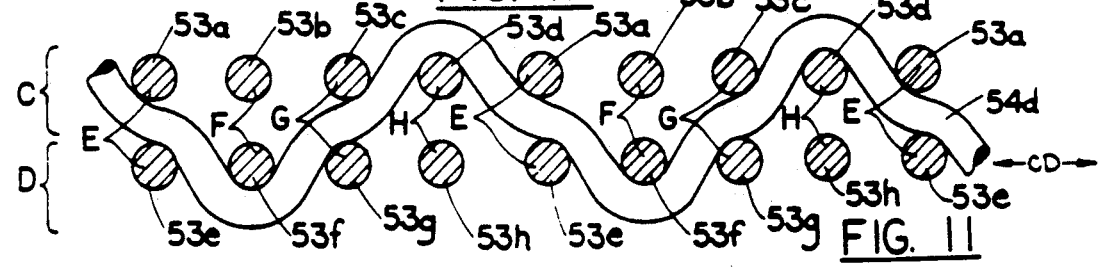
FIG. 11 is an extended sectional view of the reinforcing structure of FIG. 6 taken along line 11—11 of FIG. 6.

A weft yarn, such as weft yarn 54a in FIG. 8, 54b in FIG. 9, 54c in FIG. 10, and 54d in FIG. 11 is interwoven with the warp yarns 53a–h in the first and second warp layers. The weft yarns bind the individual warp yarns in the first and second warp yarn layers in stacked pairs and prevent the warp yarns 53a–h from shifting laterally so as to reduce the open area of the fabric. These weft yarns 54a, 54b, 54c, and 54d are also numbered repeatedly across the fabric. The weft yarns 54 are interwoven in a specific weave pattern (or more particularly, a "warp balancing weave pattern") with the stacked pairs of the warp yarns. The weft yarns 54 maintain the warp yarns stacked upon one another and in general vertical alignment.

The particular weave pattern of the warp yarns 53 and the weft yarns 54 in the fabric shown in FIGS. 6 through 11, is known as a four-shed repeat pattern. As used herein, the term "shed" refers to the number of unique configurations either a warp yarn or a weft yarn forms with the threads with which it is interwoven before a repeat occurs (i.e., a four-shed pattern would be a pattern which repeats after every group of four threads).

Figure 7:
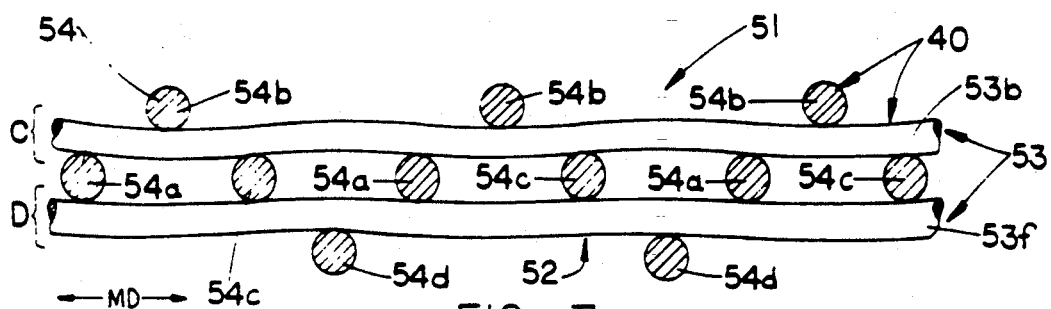
FIG. 7 is an extended sectional view of the reinforcing structure shown in FIG. 6, taken along line 7—7 of FIG. 6.

The specific pattern of weaving the warp yarns 53 is shown best in FIGS. 6 and 7. As shown in FIGS. 6 and 7, the first warp yarns of the first warp layer C (such as warp yarn 53b shown in FIG. 7) repeatedly pass over three and under one of the picks of the weft yarns in the weave pattern. As used herein, the term "pick" refers to inserting a weft yarn between divided warp yarns. The second warp yarns of the second warp layer D (such as warp yarn 53f shown in FIG. 7) repeatedly pass over one and under three of the picks of the weft yarns in the weave pattern.

The specific pattern of weaving the weft yarns 54 is shown best in FIGS. 6 and 8-11. As shown in FIGS. 8-11, the warp yarns 53 are maintained in vertically-stacked relationship by a weft system which consists of a single network of weft yarns 54 woven between the stacked warp yarns. The weft yarns 54 are woven around the stacked warps in a repeating pattern in which a weft yarn (such as weft yarn 54a in FIG. 8) first passes over the first stacked pair of warp yarns E, between the warp yarns of the second stacked pair F, under the third stacked pair G, and between the warp yarns of the fourth stacked pair H. In other words, each weft yarn 54 passes over and under every other pair of stacked warp yarns and between the warp yarns of the intermediate stacked pairs disposed between every other stacked pair.

As shown in FIG. 6 and in FIGS. 8-11, the neighboring weft yarns are woven around the warp yarns 53 in the same manner. However, as shown in FIG. 9, the adjacent weft yarns, such as weft yarn 54b, is displaced a pair of warps from that of the first weft yarn. Thus, the adjacent or second weft yarn passes: between the warp yarns of the first stacked pair, over the second stacked pair of warp yarns, between the warp yarns of the third stacked pair, and under the fourth stacked pair of warp yarns. As shown in FIGS. 10 and 11 respectively, the third weft yarn 54c is similarly displaced one pair of warp yarns from the second, and the fourth weft yarns 54d is displaced one pair of warp yarns from the third 54c. This pattern repeats every fourth weft yarn. As shown in FIG. 6, this produces a weave pattern in which the cross-over points 55 formed by the weft yarns 54 are staggered in the weft direction across the warp yarns.

A variation of the preceding weave pattern can be achieved by interchanging weft yarn 54c shown in FIG. 10 with weft yarn 54d shown in FIG. 11. This results in a broken, staggered pattern of cross-over points 55 of the weave in the weft direction. In this broken pattern, the first two cross-over points 55 are in a straight diagonal line. The third cross-over point 55, however, is shifted over a third warp yarn to a fourth warp yarn and the fourth cross-over point 55 shifted over a third warp yarn to a fourth warp yarn and then the cross-over point 55 is shifted back in a diagonal to the third warp yarn. This weave pattern also maintains the warp yarns in stacked pairs in a suitable configuration. However, in this variation of the weave pattern, the two warp yarns pass together between two adjacent picks. In the first described weave pattern, there are no two picks between which the warp yarns simultaneously pass, which provides a slightly better balance in the weave pattern.

Various combinations of materials, cross-sectional dimensions, and cross-sectional shapes of yarns may be utilized in this preferred fabric. The yarn material, cross-sectional dimensions, and the cross-sectional shapes of the yarns will be determined by the particular application being made of the fabric.

While the specific materials of construction of the warp yarns and weft yarns can vary, the material comprising the yarns should be such that the yarns will be capable of reinforcing the resinous framework and sustaining stresses as well as repeated heating and cooling without excessive stretching. Suitable materials from which the yarns can be constructed include, polyester, polyamid, high heat resistant materials such as KEL-VAR or NOMEX brands, and any other materials which are known for use in papermaking fabrics. The preferred material for the yarns, however, is polyester. The material of construction of the yarns in the different layers and yarn systems can vary with the yarns in one layer or yarn system being constructed of one material and the yarns of the other layers or yarn systems being constructed of a different material. Preferably, however, all of the yarns in the different layers and yarn systems are constructed of essentially the same material.

Any convenient cross-sectional dimensions (or size) of the yarns can be used as long as the flow of air and water through the conduits 36 is not significantly hampered during the paper web processing and as long as the integrity of the papermaking belt 10 as a whole is maintained. Yarns having the same cross-sectional dimensions can be used in all of the layers or yarn systems, or the size of the yarns in the different layers and yarn systems can vary. For example, if yarns having a round cross-sectional are used, the yarns of warp systems C and D may be of one diameter, and the yarns of weft system may be of a larger or smaller diameter. If larger diameter weft yarns are used, the weft yarns will be stiffer and place more crimp in the warp yarns. Other variations include those in which the yarns of the warp system C and the weft system 54 are identical, and the yarns of the warp system D are different. Likewise, the yarns of the warp system D and the yarns of the weft system may be identical, and the yarns of the warp system C different. Alternatively, the yarns in each of the warp system C, warp system D, and the weft system can be different. For yarns having round cross-sections, a preferred range of yarn diameters is from about 0.10 mm to about 0.30 mm. The most preferred diameters are about 0.22 mm for the warp yarns 53 and about 0.28 mm for the weft yarns 54. Depending on the application, larger diameter yarns may also be used.

Yarns of any suitable cross-sectional shape can be used as long as the yarns do not interfere with the flow of fluids through the conduits 36 during web processing and as long as the integrity of the papermaking belt 10 as a whole is maintained. Suitable cross-sections include round, oval, square, and rectangular shapes. The cross-sectional shapes of the yarns in the different layers and yarn systems can also vary between the layers and yarn systems. Preferably, however, both the warp yarns 53 and the weft yarns 54 have round cross-sections.

The reinforcing structure 33 of the present invention defines several projected areas which are useful in describing the location of the passageways 37 and surface texture irregularities 38 in the backside network 35a of the second surface 35 of the framework 32. As shown in FIGS. 12-18, the reinforcing structure 33 defines at least the following projected areas: projected interstitial areas; the previously-defined projected open area (which is the total of all the projected interstitial areas for the reinforcing structure); projected structural component areas; a projected reinforcing area (which is the total of all the projected structural component areas for the reinforcing structure); projected warp areas (and an overall projected warp area); projected weft areas (and an overall projected weft area); projected knuckle areas; and, projected machine side knuckle areas. In addition, when there is more than one layer of warps or wefts, or the like, there may also be projected areas for the warp yarns in the first warp layer and the second warp layer, and so forth.

Figure 12:
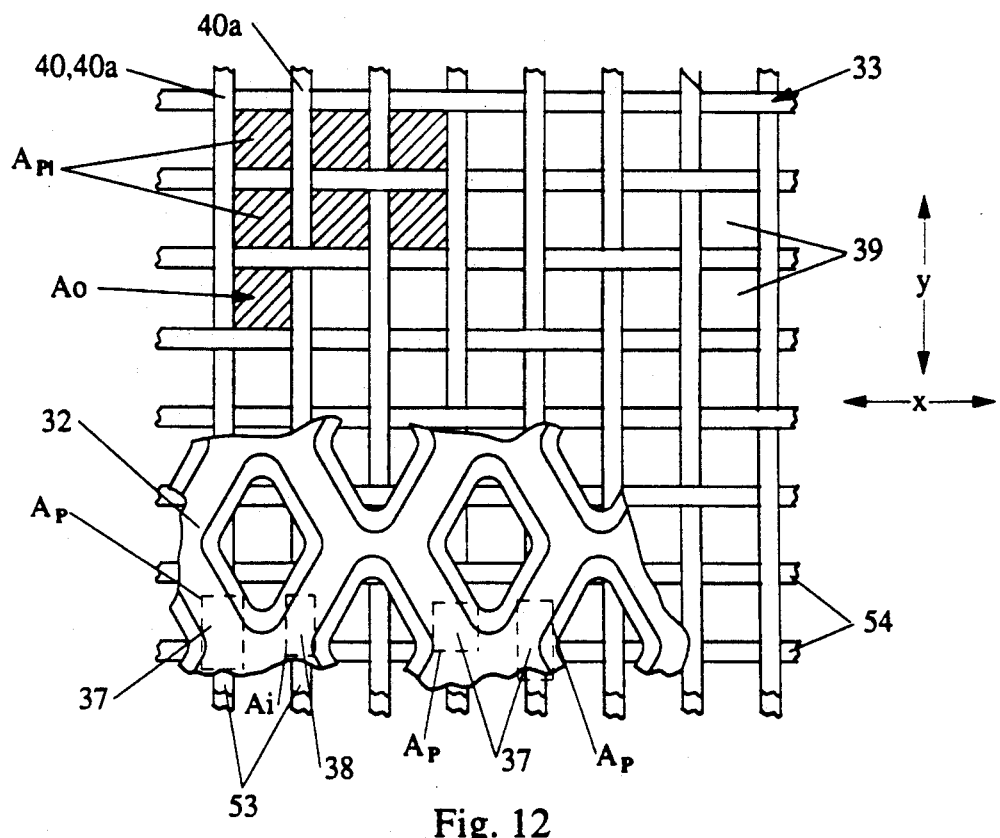
FIG. 12 is a plan view of a portion of the reinforcing structure shown with part of the surrounding framework in place around the reinforcing structure.

The projected interstitial areas are shown in FIG. 12 as $A_{Pi}$. As used herein, the term "projected interstitial areas" refers to the individual projected areas defined by the projection of the interstices 39 of the reinforcing structure 33. In other words, when the reinforcing structure 33 is viewed from a direction perpendicular to either side of the reinforcing structure 33, each interstice 39 will provide direct lines of sight through the reinforcing structure which constitute the projected interstitial areas $A_{Pi}$.

Figure 13:
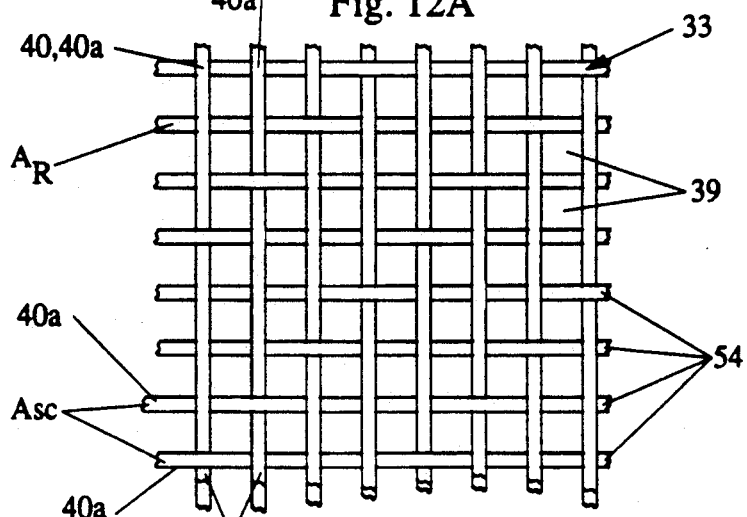
FIG. 13 is a plan view of the reinforcing structure, similar to FIG. 6, which illustrates the projected reinforcing area of a portion of the reinforcing structure.

The projected structural component area $A_{SC}$ is shown in FIG. 13. As used herein, the term "projected structural component area" refers to the area defined by the projection of an individual structural component 40a of the reinforcing structure 33. As used herein, the term "projected structural component areas" shall mean the area defined by the projection of more than one, but not all of the structural components 40a of the reinforcing structure 33.

A portion of the projected reinforcing area $A_R$ is shown in FIG. 13. As used herein, the term "projected reinforcing area" shall mean the area defined by the projection of the reinforcing component 40. As shown in FIGS. 12 and 13, the projected reinforcing area $A_R$ is essentially the opposite of the projected open area $A_O$ of the reinforcing component 33, it is the portion of the reinforcing structure 33 which blocks out lines of sight. The projected reinforcing area $A_R$ is complementary with the projected open area $A_O$ in that together both comprise the entire projected area of the reinforcing structure 33.

Figure 14:
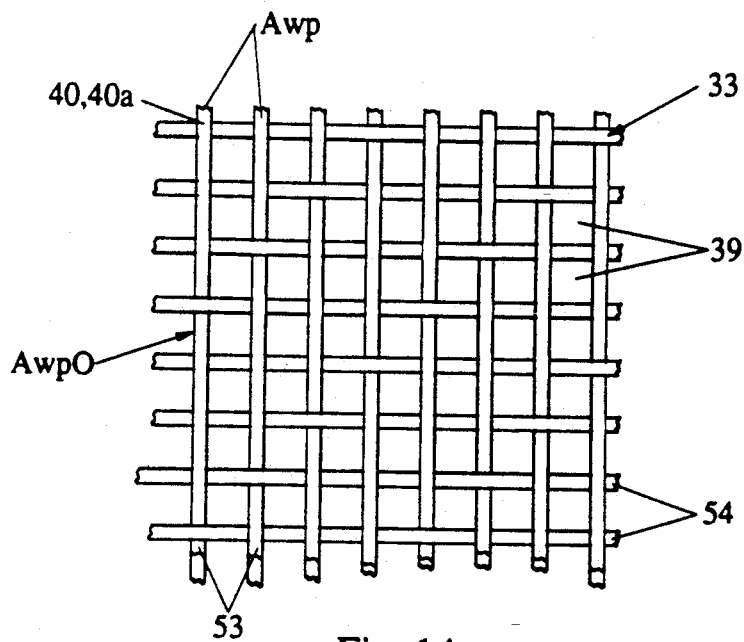
FIG. 14 is another plan view of the reinforcing structure, similar to FIG. 13, which illustrates some of the projected warp areas of the reinforcing structure.
Figure 15:
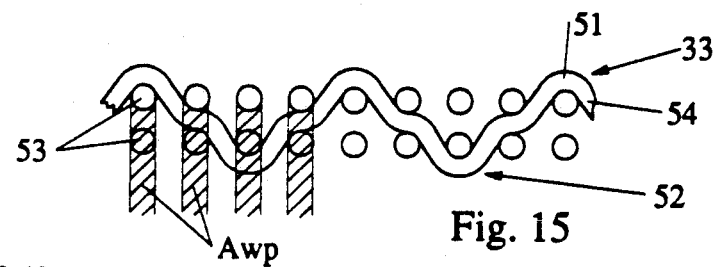
FIG. 15 is an end view of the reinforcing structure, similar to FIG. 8, which illustrates the projected warp areas depicted in FIG. 14 from another angle.

The projected warp areas $A_{wp}$ are shown in FIGS. 14 and 15. As used herein, the term "projected warp area" $A_{wp}$ refers to the area defined by the projection of the individual warp yarns 53 of the reinforcing structure 33. In FIG. 15, the projected warp areas $A_{wp}$ are shown as the cross-hatched areas which lie between the dotted lines. These dotted lines could also extend above the paper-facing side 51 of the reinforcing structure 33. However, the present invention is generally not concerned with passageways and surface texture irregularities which lie above the plane of the paper-facing side 51 of the reinforcing structure 33. Therefore, when the position of a passageway or surface texture irregularity is being described herein with reference to a projected area, the passageway or irregularity will generally lie between the paper-facing side 51 of the reinforcing structure 33 and a plane defined by the backside 12 of the belt 10. When it is said that a passageway or a surface texture irregularity "lies within" the projected warp areas shown in FIGS. 14 and 15, it can be any place within the areas that are shaded in FIG. 14, or cross-hatched in FIG. 15. In addition to the projected warp area defined by each individual warp, there is an "overall projected warp area" $A_{wp0}$ which comprises the total for the entire fabric of the individual projected warp areas.

Figure 16:
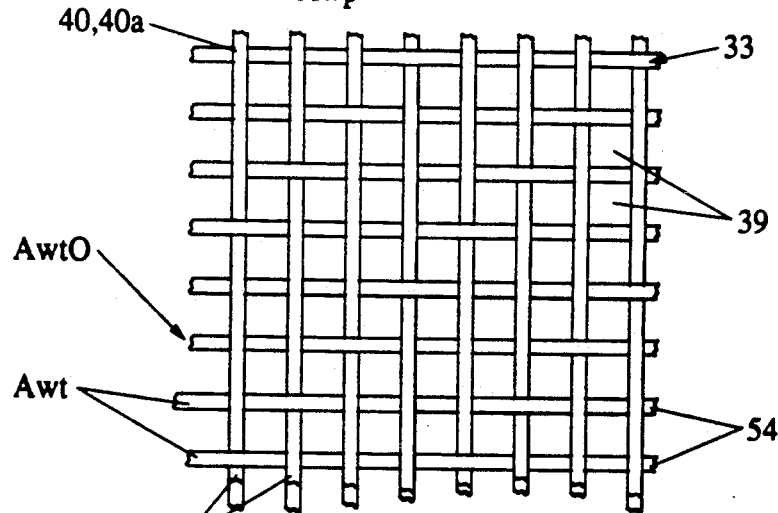
FIG. 16 is another plan view of the reinforcing structure, similar to FIGS. 13 and 14 which illustrates some of the projected weft areas of the reinforcing structure.
Figure 17:
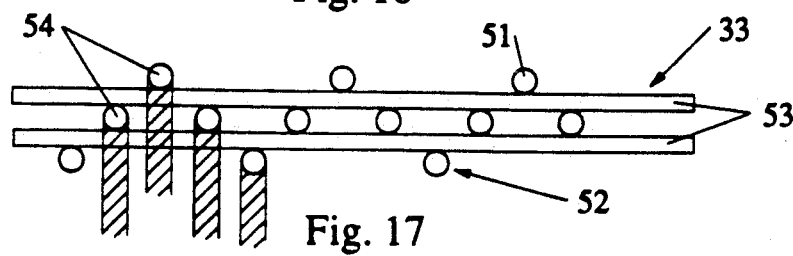
FIG. 17 is an extended sectional view, similar to FIG. 7, which illustrates the projected weft areas of the depicted in FIG. 16 from another angle.

The projected weft areas $A_{wt}$ are shown in FIGS. 16 and 17. As used herein, the term "projected weft area" $A_{wt}$ refers to the area defined by the projection of the individual wefts 54 of the reinforcing structure 33. In addition to the projected weft area $A_{wt}$, there is an "overall projected weft area" $A_{wt0}$ (a portion of which is shown in FIGS. 16 and 17) which comprises the total of the individual projected weft areas $A_{wt}$ for the entire reinforcing structure.

Figure 18A:
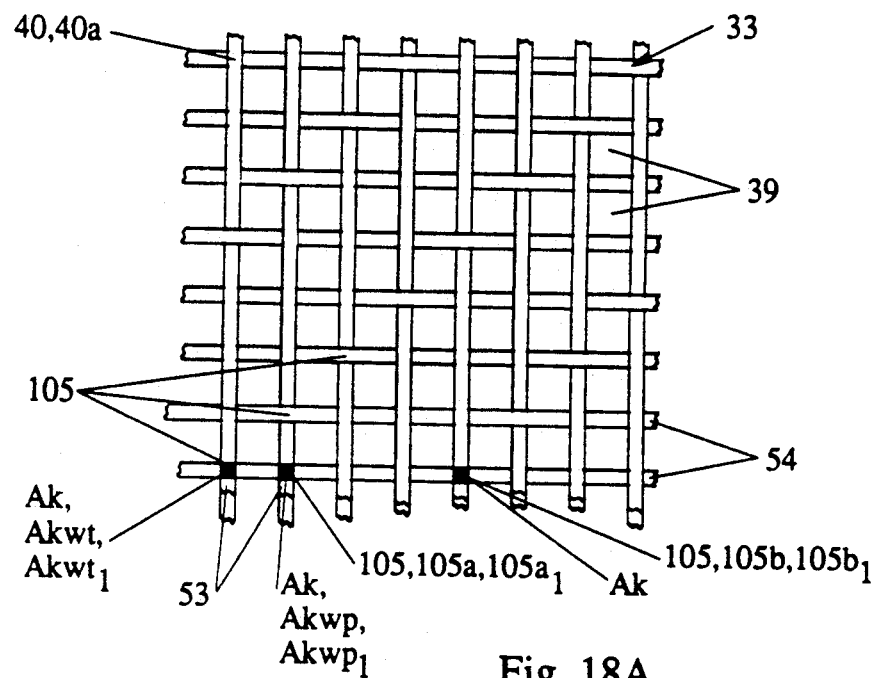
FIG. 18A is a plan view of the reinforcing structure, similar to the preceding plan views of the same, which illustrates some of the projected knuckle areas of the reinforcing structure.
Figure 18B:
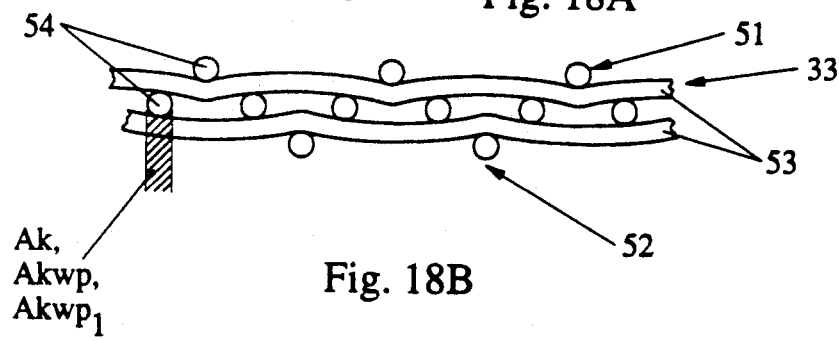
FIG. 18B is an extended sectional view of the reinforcing structure, similar to FIG. 7, which illustrates some of the projected knuckle areas of the reinforcing structure from another angle.
Figure 18C:
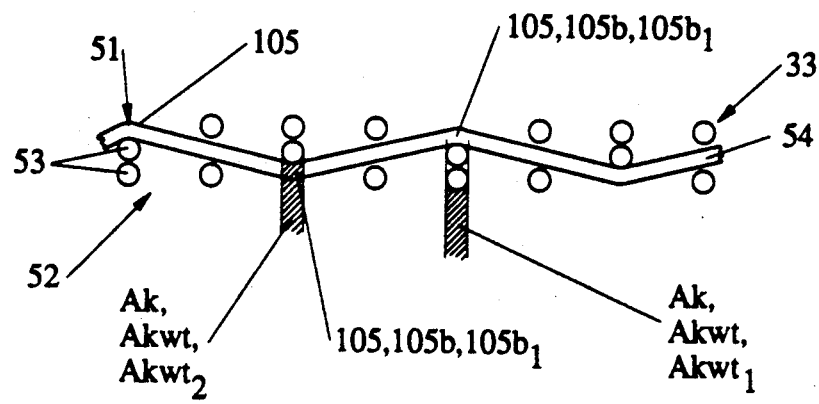
FIG. 18C is an end view of the reinforcing structure, similar to FIG. 8, which illustrates some of the other projected knuckle areas of the reinforcing structure from another angle.

As used herein, the term "projected knuckle area" of the reinforcing structure 33 refers to the area defined by the projection of one of the knuckles 105 of a woven reinforcing structure. As shown in FIGS. 18A-18C, a projected knuckle area $A_K$ is the portion of the reinforcing structure 33 where a warp yarn and a weft yarn overlap which blocks out lines of sight through the reinforcing structure 33. The projected knuckle areas can be further classified as projected warp knuckle areas $A_{Kwp}$ (the projected area formed by a warp yarn passing over a weft yarn) or projected weft knuckle areas $A_{Kwt}$ (the projected area formed by a weft yarn which passes over a warp yarn). The projected warp knuckle areas $A_{Kwp}$ and the projected weft knuckle areas $A_{Kwt}$ can be further classified as projected paper (or paper-facing) side warp knuckle areas $A_{Kwp1}$ or weft knuckle areas $A_{Kwt1}$, and projected machine-facing (or machine side) warp knuckle areas $A_{Kwp2}$ or weft knuckle areas $A_{Kwt2}$ (depending on which side of the fabric the knuckles are formed).

The other primary element of the papermaking belt 10 of the present invention is the framework 32. The overall characteristics of the framework 32 are shown in FIGS. 2-4. In the preferred embodiment of the present invention, the framework 32 is formed by manipulating a mass of material, which is generally in liquid form, so that the material, when in solid form, at least partially surrounds the reinforcing structure 33 in such a manner that the reinforcing structure 33 is positioned between the top or the first surface 34 of the framework 32 and at least a portion of the bottom or second surface 35 of the framework 32. In addition, the material must be manipulated so that the framework 32 has a plurality of conduits 36 or channels which extend between the first surface 34 and the second surface 35 of the framework 32. The material must also be manipulated so that the first surface has a paper side network 34a formed therein which surrounds and defines the openings of the conduits 36 in the first surface 34 of the framework 32. In addition, the material must be manipulated so that the second surface 35 of the framework 32 has a backside network 35a with passageways 37, distinct from the conduits 36, that provide surface texture irregularities 38 in the backside network 35a.

The mass of material which is manipulated to form the framework 32 can be any suitable material, including thermoplastic resins and photosensitive resins, but the preferred material for use in forming the framework 32 of the present invention is a liquid photosensitive polymeric resin. Likewise, the material chosen can be manipulated in a wide variety of ways to form the desired framework 32, including mechanical punching or drilling, curing the material by exposing it to various temperatures or energy sources, or by using a laser to cut conduits in the same. The method of manipulating the material which will form the framework 32, of course, will depend on the material chosen and the characteristics of the framework 32 desired to be formed from the mass of material. The preferred method used for manipulating photosensitive resin, is controlling the exposure of the liquid photosensitive resin to light of an activating wavelength.

The relationship between the sides of the papermaking belt 10 of the present invention (that is, paper-contacting side 11 and backside 12 described above) and the surfaces of the framework 32 are best shown in FIGS. 3 and 4. The first surface 34 of the framework 32 preferably forms the paper-contacting side 11 of the papermaking belt 10. This relationship will usually exist in most embodiments of the present invention since the reinforcing structure 33 is positioned between the first surface 34 of the framework 32 and at least a portion of the second surface 35 of the framework 32. That is, the first surface 34 of the framework 32 generally covers the paper-facing side 51 of the reinforcing structure 33.

The second surface 35 of the framework 32 of the papermaking belt 10 of the present invention, however, does not necessarily always form the backside 12 of the papermaking belt 10. Since the reinforcing structure 33 is positioned between the first surface 34 and at least a portion of the second surface 35 of the framework 32, the second surface 35 of the framework 32 can either, completely cover the reinforcing structure 33; cover only a portion of the reinforcing structure 33; or, cover no portions of the reinforcing structure 33 and lie entirely within the interstices 39 of the reinforcing structure 33. In the first case, the second surface 35 of the framework 32 and the backside 12 of the papermaking belt 10 will be the same. In the second case, the backside 12 of the papermaking belt 10 will be comprised partially of the second surface 35 of the framework 32 and partially of the exposed portion of the reinforcing structure 33. In the third case, the backside 12 of the papermaking belt 10 will also be comprised partially of the second surface 35 of the framework 32 and partially of the reinforcing structure 33, but the machine-facing side 52 of the reinforcing structure 33 will be completely exposed on the backside 12 of the papermaking belt 10.

FIG. 2 shows that the first surface 34 of the framework 32 (and the paper-contacting side 11 of the papermaking belt 10) is comprised of a portion of a network which is designated 32a. As used herein, the term "network" refers to the portions of the framework 32 which surround the conduits 36 and define a net-like pattern. In other words, the network 32a is the solid portion of the framework 32. As shown in the enlarged photographs of the papermaking belt 10 of the present invention, FIGS. 36A and 36B, the network 32a has two network surfaces 34a and 35a. As used herein, the term "network surface" refers to one of the surfaces of the network 32a which surrounds the conduits 36. These network surfaces are also referred to herein as the "knuckles" of the framework 32. The knuckles of the framework 32 are, however, to be distinguished from the previously described knuckles formed by the yarns of the reinforcing structure 33. The term "network surface" was also used in the patents issued to Trokhan and Johnson, which are incorporated by reference herein. As used herein, however, the term "network surface" will be modified by specifying whether the network surface referenced is the "paper side network surface" or the "backside network surface".

The term "paper side network surface", (or "paper side network" for short) refers to the solid portion of the framework on the top, or the first surface 34 of the framework 32. Thus, the surface of the framework which is referred to as the "network surface" in the patents which are incorporated by reference herein generally corresponds to the paper side network surface in the present specification. The paper side network surface is represented by reference numeral 34a in the drawings.

The term "backside network surface", (or "backside network" for short) refers to the solid portion of the framework 32 on the bottom, or the second surface 35 of the framework 32. The backside network surface is represented in the drawings by reference number 35a.

As shown in FIGS. 2-4, the first surface 34 of the framework 32 comprises both the paper side network surface 34a, and first conduit openings 42. The first conduit openings 42 are the openings of the conduits 36 along the first surface 34 of the framework 32. The second surface 35 of the framework 32 comprises both the backside network surface 35a and second conduit openings 43. The second conduit openings 43 are the openings of the conduits 36 along the second surface 35 of the framework 32. The paper side network surface 34a and the first conduit openings 42 in the first surface 34 of the framework 32 will often be described herein as being "complementary" because together they respectively comprise one entire surface of the framework 32. For the same reason, the backside network surface 35a and the second conduit openings 43 will likewise be described herein as complementary.

As shown in FIG. 2, the paper side network 34a is macroscopically monoplanar, patterned, and continuous. This allows a uniform pattern to be imparted to the paper web during processing. By "macroscopically monoplanar," it is meant that when a portion of the paper-contacting side 11 of the papermaking belt 10 is placed into a planar configuration, the paper side network 34a is essentially in one plane. It is said to be "essentially" monoplanar to recognize the fact that deviations from absolute planarity are tolerable, but not preferred, so long as the deviations are not substantial enough to adversely affect the performance of the product formed on the papermaking belt 10. The paper side network 34a is said to be "continuous" because the lines formed by the network on the paper side network surface 34a must form at least one essentially unbroken net-like pattern. The pattern is said to be "essentially" continuous to recognize the fact that interruptions in the pattern are tolerable, but not preferred, so long as the interruptions are not substantial enough to adversely affect the performance of the product made on the papermaking belt 10.

The conduits (or "deflection conduits") 36 which pass from the first surface 34 of the framework 32 to the second surface 35 of the framework 32 are shown in FIGS. 2-4. Each conduit 36 defines certain features, which include: a channel portion or a hole, generally designated 41; a mouth, or conduit opening (also known as a "gross foramina"), such as first conduit opening 42 formed along the first surface 34 of the framework 32; a mouth, or conduit opening, such as second conduit opening 43 formed generally along the second surface 35 of the framework 32; and, conduit walls, generally designated 44, which define the dimensions of the conduits 36 in the interior portion of the framework 32. (The "interior portion" of the framework is the portion of the framework 32 which lies between the first and second surfaces 34 and 35). As shown in FIGS. 2-4, the walls 44 of the conduits 36 form the interior walls 44a of the framework 32. The interior walls 44a of the framework 32 are the surfaces of the framework 32 which are coterminous with the walls 44 of the conduits 36. In other words, the walls 44 of the conduits 36 have the same or coincident boundaries with the interior walls 44a of the framework 32. The second conduit openings 43 are described as being formed "generally along" the second surface 35 of the framework 32 because if one or more passageways 37 intersects with a second conduit opening 43, at least a portion of the second conduit opening 43 may be displaced so that it actually lies between the first surface 34 of the framework 32 and the surrounding portions of the second surface 35 of the framework 32. In other words, portions of second conduit openings 43 may lie inward (toward the center of the belt) from the plane defined by the adjacent portions of the second surface 35 of the framework 32.

FIG. 2 shows that the first conduit openings 42 in the first surface 34 of the framework 32 are uniform and of a particular geometry. The second conduit openings 43 in the second surface 35 of the framework 32 are also of basically the same geometry as the first conduit openings 42. However, as shown in FIG. 37B, the passageways and surface texture irregularities present in the backside network 35a of the framework 32 can cause the second conduit openings 43 to be distorted and very irregular in shape. This distortion is not particularly problematic in the present invention, however, because the backside network 35a which surrounds the second conduit openings 43 does not contact and impress a pattern into the paper web during formation.

Although there are an infinite variety of possible geometries for the openings 42 and 43 of the conduits 36, certain broad guidelines for selecting a particular conduit opening geometry can be stated. These guidelines are set forth in Col. 5, line 34 through Col. 10, line 35 of U.S. Pat. No. 4,528,239, entitled "Deflection Member", which issued to Paul D. Trokhan on Jul. 9, 1985, which is incorporated by reference herein.

The shape and arrangement of the conduits 36 shown in FIG. 2 are in an especially preferred form. The shape of the conduit openings, 42 and 43, depicted in these figures is referred to herein as being in a "linear Idaho" pattern. As shown in FIG. 2, the linear Idaho conduits are roughly in the shape of modified parallelograms in cross-section. The shape of the conduits 36 is described as resembling modified parallelograms because in this plan view, each conduit 36 has four sides in which each pair of opposite sides are parallel, the angle between adjacent sides are not right angles, and the corners formed between adjacent sides are rounded. Thus, the linear Idaho conduit openings may also be described as parallelograms having rounded corners.

Figure 19:
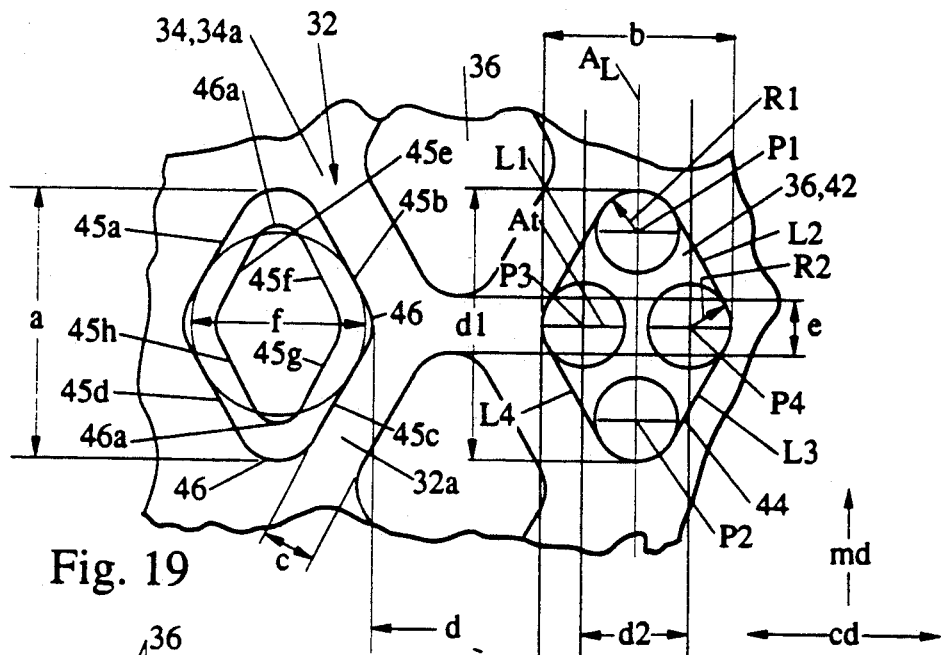
FIG. 19 is an enlarged schematic representation of one preferred conduit opening geometry for the papermaking belt of the present invention.

The details of the construction of these linear Idaho conduits 36 are shown in FIG. 19. Only a portion of the framework 32 of the papermaking belt 10 showing the repeating pattern of conduits 36 is shown in FIG. 19. In addition, only the paper side network surface 34a on all but one of the conduits is shown for clarity of illustration. The particular shape of the conduits 36 is arrived at in the manner described below. As will be apparent, however, it is possible to vary the sequence of the steps and arrive at the same result. It is also apparent that the points, lines, and circles used to arrive at the shape of the conduits (except to the extent that they form the walls 44 of the conduits 36) will not be actually visible in the conduits 36 constructed by the procedure described below.

To form a geometrical shape in a linear Idaho pattern, initially, two points, $P_1$ and $P_2$, are selected which lie a certain distance, $d_1$, apart from one another. The line connecting the two points, $P_1$ and $P_2$, will be referred to as the machine direction axis, or longitudinal axis $A_L$, of the conduit. The distance, $d_1$, between the two points, $P_1$ and $P_2$, (which is equal to the length of the longitudinal axis $A_L$), is preselected. At each of these points, a circle of a given radius, $R_1$, is drawn. Next, a line $A_T$ is drawn perpendicular to the longitudinal axis $A_L$ of the conduit. This next line $A_T$ is drawn through the longitudinal axis $A_L$, so that it bisects the longitudinal axis $A_L$.

Two points, $P_3$ and $P_4$, are then placed equidistant from the longitudinal axis $A_L$ on the second line $A_T$. The distance, $d_2$, between points $P_3$ and $P_4$ is also preselected. The line connecting points $P_3$ and $P_4$, $A_T$, will be referred to as the cross-machine direction axis or transverse axis of the conduit. At both points $P_3$ and $P_4$, a circle of a given radius $R_2$ is drawn. Although the latter radius, $R_2$, does not have to be equal to the radius $R_1$ of the circle drawn earlier, in the preferred pattern shown in FIG. 19, $R_1$ equals $R_2$. As a final step, tangent lines, $L_1$, $L_2$, $L_3$, and $L_4$, are drawn between portions of the four circles previously drawn. The tangent lines are drawn so that they are tangent to the portions of the circles which are farthest away from the intersection of the longitudinal axis $A_L$ and the transverse axis $A_T$. The line which passes around the perimeter of the shape thus described forms the walls 44 of the linear Idaho conduit 36. As shown in FIG. 19, the sides of the first conduit openings are designated 45a, 45b, 45c, and 45d, and the rounded corners between adjacent sides are designated 46. The corresponding sides of the second conduit openings 43 are designated 45e, 45f, 45g, and 45h. The corresponding corners of the second conduit openings 43 are designated 46a.

Figure 20:
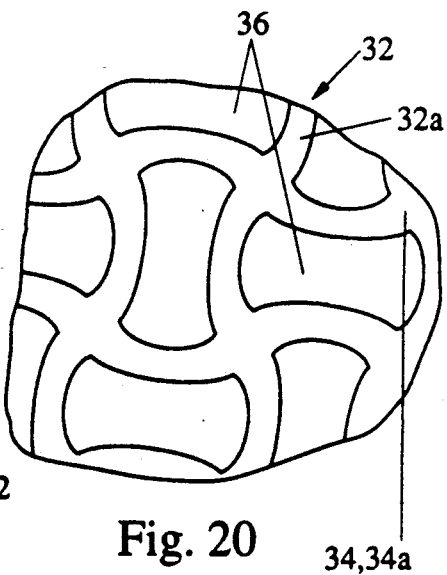
FIG. 20 is an enlarged schematic representation of another preferred conduit opening geometry.

Other suitable shapes for the conduits 36 in the framework 32 of the papermaking belt 10 of the present invention include, but are not limited to, the modified hexagon described in the patents issued to Trokhan and Johnson, incorporated herein by reference, and the "Bow tie", or "Sine-Curve" pattern shown in FIG. 20.

Regardless of the shape of the conduit openings, whether they be in the shape of the preferred linear Idaho pattern, or in some other shape, the number of conduits 36 per a given area of the belt and the proportionate amount of space occupied by the conduit openings in the framework 32 of the papermaking belt 10 of the present invention should be within certain ranges.

The number of conduits 36 present in the framework 32 is generally expressed in terms of the number of conduits per square inch of the total surface area of the framework 32. As used herein, the term "total surface area of the framework" refers to the sum of the surface area of either the paper side network surface 34a and the complementary surface area occupied by the first conduit openings 42, or the sum of the surface area of the backside network surface 35a and the complementary surface area occupied by the second openings 43. The number of conduits 36 present in the framework 32 should preferably be between about 10 and about 1,000 per square inch.

Figure 19A:
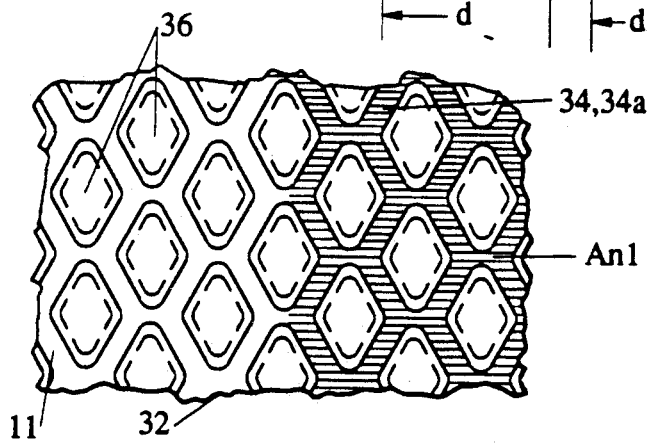
FIGS. 19A and 19B are plan views which show, respectively, the projected first surface knuckle area and the projected second surface knuckle area of the framework of the papermaking belt shown in FIGS. 2 through 4.
Figure 19B:
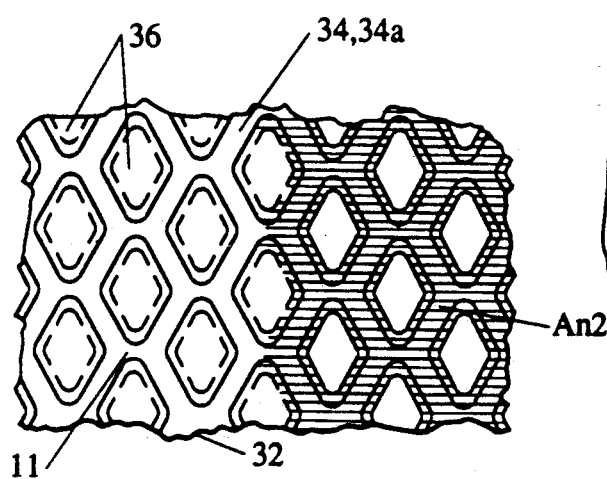

The proportionate amount of space occupied by the conduit openings is generally expressed herein as a percentage of the total surface area of the framework 32. It is also common in this specification to express the proportionate amount of space occupied by the complementary network surfaces of the framework, 34a and 35a, as percentages of the total surface area of the framework 32. The space occupied by the paper side network surface 34a and the backside network surface 35a are generally referred to herein as the "knuckle areas" of the respective surfaces of the framework 32. These knuckle areas are shown as $A_{N1}$ and $A_{N2}$, respectively, in FIGS. 19A and 19B. The paper side knuckle area (or first surface knuckle area) $A_{N1}$ (shaded in FIG. 19A), is the projection of the paper side network surface 34a in the z-direction into a plane. The backside knuckle area (or second surface knuckle area) $A_{N2}$ (shaded in FIG. 19B), is the projection of the backside network surface 35a in the z-direction into a plane. The proportionate amount of space occupied by the conduit openings can be derived from the amount of space occupied by the knuckle areas of the framework 32. Since the area occupied by the openings of the conduits and the area occupied by the respective network surfaces are complementary, the total of the two percentages is equal to 100%. If either the knuckle areas are known, or if the proportionate amount of space occupied by the conduit openings is known, the complementary area can be calculated by subtracting the known percentage from 100%.

The proportionate amount of space occupied by the first conduit openings 42 in the first surface 34 of the framework 32, is preferably between about 30% and about 80% of the total surface area of the framework 32. In other words, the first surface 34 of the framework 32 has about 20%-70% knuckle area. The proportionate amount of space occupied by the second conduit openings 43 in the second surface 35 of the framework 32 is preferably between about 30% and about 80% of the total surface area of the framework 32. In other words, the second surface 35 of the framework 32 has about 20%-about 70% knuckle area.

The particular arrangement of the individual conduits 36 and spacings between the conduits 36 shown in FIG. 2 is but one possible arrangement of the conduits 36. There are a number of preferred arrangements of the individual conduits 36 and spacings between the conduits 36. Several of these preferred arrangements and spacings are set forth in the discussion in Col. 8, lines 35-58 of U.S. Pat. No. 4,528,239, entitled "Deflection Member", which issued to Paul D. Trokhan on Jul. 9, 1985, which discussion is incorporated by reference herein. A particularly preferred arrangement of conduits 36 and spacings between conduits 36, however, is the bilaterally staggered array of openings shown in FIG. 2. In FIG. 2, it is shown that in this particularly preferred arrangement and spacing, the openings 42 of the conduits 36, such as first conduit openings 42, are of sufficient size and spacing that, in any direction, the edges of the conduits 36 extend past one another.

In an especially preferred embodiment of the papermaking belt 10 of the present invention having linear Idaho shaped conduits, the parameters of the conduits 36 (that is, the number, size, and arrangement of conduit openings) are designated herein as a "300 linear Idaho with 35% knuckle area" pattern. The first number of the above designation represents the number of conduits 36 present in the framework 32 per square inch. Thus, the framework 32 has 300 conduits per square inch. The second number (i.e., 35% knuckle area) refers to the approximate surface area, or knuckle area, of the paper side network surface 34a. In this preferred embodiment, the papermaking belt is constructed so the surface area, or knuckle area, of the backside network surface 35a is approximately 65%.

The dimensions used in the construction of the conduits 36, as well as the overall dimensions of the conduits, and the spacing between conduits 36 in the preferred 300 linear Idaho 35% knuckle area pattern are shown in FIG. 19. To construct conduits in the 300 linear Idaho 35% knuckle area pattern, the following lengths and radiuses are used: $d_1$ is 0.0425 inches (1.0795) mm, $d_2$ is 0.024712 inches (0.62785 mm), and $R_1$ and $R_2$ are both 0.012008 inches (0.3050 mm). The overall dimensions of the openings of the conduits and the spacing between conduits in the first surface 34 of the framework 32 are represented by a series of reference letters in FIG. 19. In FIG. 19, reference letter "a" represents the machine direction (or "MD") length, or simply the "length" of an opening as illustrated, "b" the length of the opening as measured in the cross-machine direction (or "CD"), or the "width" of the opening, "c" the spacing between two adjacent openings in a direction intermediate MD and CD, "d" the CD spacing between adjacent openings, and "e" the MD spacing between adjacent openings. In this preferred embodiment, "a" is 1.6892 millimeters (0.066506 inch), b 1.2379 mm (0.048737 inch), c 0.28153 mm (0.011084 inch), d 0.92055 mm (0.036242 inch), and e 0.30500 mm (0.012008 inch).

The conduits 36 have a channel portion 41 which lies between the conduit openings 42 and 43. These channel portions 41 are defined by the walls 44 of the conduits 36. The overall characteristics of these channel portions 41 and the walls 44 are shown in FIGS. 2-4. FIGS. 2-4 show that the holes or channels 41 formed by the conduits 36 extend through the entire thickness of the papermaking belt 10. In addition, as shown in FIG. 2, the conduits 36 are generally discrete. By "discrete", it is meant that the conduits 36 form separate channels, which are separated from each other by the framework 32. The separation of the conduits 36 is particularly evident in the plan view of FIG. 2. The conduits 36 are described as being "generally" discrete, however, because as shown in FIG. 37B, for example, the conduits 36 may not be completely separated from each other along the second surface 35 of the framework 32 when passageways 37 are present in the backside network 35a. The conduits 36 are also shown to be isolated in that there is no connection within the body of the papermaking belt 10 between one conduit 36 and another. This isolation of one conduit 36 from another is particularly evident in the cross-sectional views of FIGS. 3 and 4. Thus, transfer of material (for example, fluids, such as the water removed from the paper web) from one conduit 36 to another is generally not possible unless the transfer is effected outside the body of the papermaking belt 10, or unless as in the belt shown in FIG. 37B, for instance, the transfer is effected in the passageways 37 along certain portions of the backside 12 of the papermaking belt 10.

FIGS. 3 and 4 show the orientation of the conduits 36 in the framework 32. As shown in FIGS. 3-4, the conduits 36 have a vertical axis which is designated $A_V$. The vertical axis $A_V$ is an imaginary line which passes through the center of each of the conduits 36 between the first conduit openings 42 and the second conduit openings 43. The orientation of the vertical axis $A_v$ determines the orientation of the conduits 36 in the framework 32 relative to the surfaces 34 and 35 of the framework 32. Thus, it should be understood that in the present invention, the vertical axis $A_V$ does not always have a truly vertical orientation; it is merely relatively vertical with respect to the longitudinal and transverse axes $A_L$ and $A_T$ of the conduits 36. The orientation of the vertical axis $A_v$ of the conduits 36 can range widely from an orientation in which the vertical axis $A_V$ is oriented generally perpendicular to the first and second surfaces 34 and 35 of the framework 32 to an orientation in which the vertical axis $A_V$ is oriented such that the conduits 36 are formed at an angle in the framework 32. Preferably, however, as shown in FIGS. 3 and 4, the vertical axis $A_v$ of the conduits 36 is generally approximately perpendicular to the first and second surfaces 34 and 35 of the framework 32.

Figure 21:
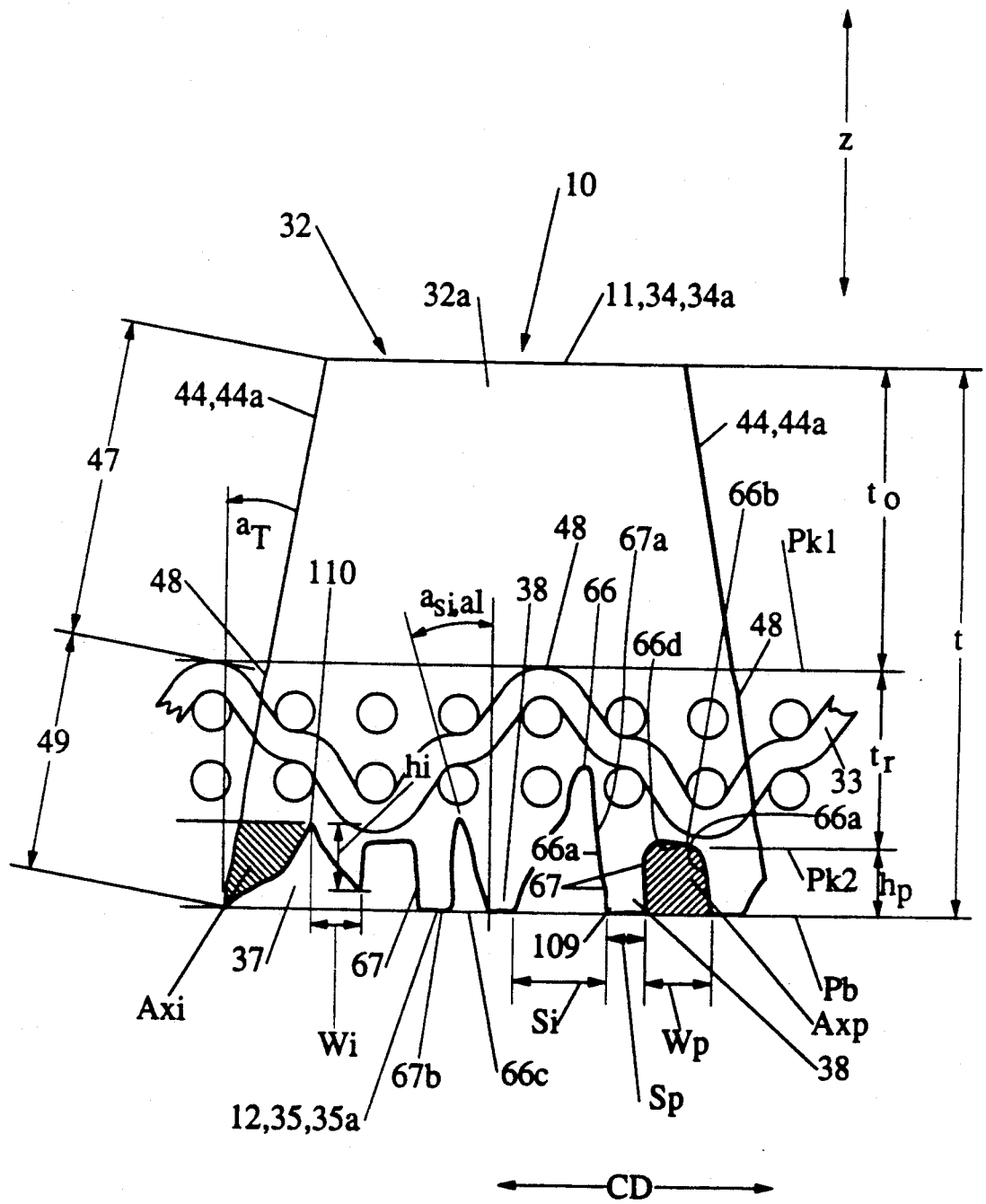
FIG. 21 is a greatly enlarged and exaggerated schematic sectional view of a portion of the framework and reinforcing structure of a papermaking belt which shows the details of the passageways and surface texture irregularities on the backside of the same.

The profile of the cross-section of the walls 44 of the conduits 36 is shown on enlarged scale in FIG. 21. The profile of the walls 44 of the conduits 36 can be relatively straight, curved, partially curved and partially straight, or irregular when viewed in cross-section. It should be noted that in the drawing figures other than FIG. 21 which show the walls 44 of the conduits 36, the walls 44 of the conduits 36 are shown schematically as straight lines for ease of illustration. However, as shown in FIG. 21, it is believed that the profile of the walls 44 of the conduits 36 may be nonlinear from the top surface 34 of the framework 32 to the bottom surface 35 of the framework 32.

As shown in FIG. 21, the profile of the walls 44 of the conduits 36 is essentially a straight line (in the region represented by reference numeral 47) from the first surface 34 of the framework 32 to a region along the walls 44, which begins approximately at the points which have been marked with reference numeral 48. The points marked with reference numeral 48 are the approximate places where the paper-facing side 51 of the reinforcing structure 33 is encountered. At the points 48 at which the paper-facing side 51 of the reinforcing structure 33 is encountered, the profile of the walls 44 of the conduits 36 is less well-defined. At this point, the profile of the walls 44 of the conduits 36 generally becomes somewhat irregular. The portion of the walls 44 of the conduits 36 which displays an irregular profile is designated by reference numeral 49 in FIG. 21. The irregular portion 49 of the profile of the walls 44 of the conduits 36 is formed during the curing of the liquid photosensitive resin into the framework 32. The ultraviolet light used to cure the resin is supplied by light sources which are positioned above the paper-facing side 51 of the reinforcing structure and the liquid photosensitive resin coating on top of the paper facing side 51. The light rays diffuse or scatter to a certain extent when they encounter the strands of the reinforcing structure 33 causing the photosensitive resin to cure in an irregular manner. Thus, the exact location of the beginning of the irregular portion of the walls 44 will vary depending on the place at which the reinforcing structure 33 is encountered.

The relationship of the walls 44 of the conduits 36 relative to each other (i.e., the taper of the walls) can vary from cases in which the walls 44 are parallel to each other to cases in which the walls 44 are tapered either outwardly or tapered inwardly from the top surface 34 of the framework 32 to the bottom surface 35 of the framework 32. In addition, because the walls 44 of the conduits 36 form the interior walls 44a of the framework 32, as shown in FIGS. 2-4, the interior walls 44a of the framework 32 can also be tapered. As used in reference to the tapering of the walls 44 of the conduits 36 or the interior walls 44a of the framework 32, the term "outwardly" refers to the relationship in which the distance between the opposed walls 44, or interior walls 44a changes from a lesser value to a greater value. The term "inwardly" refers to the opposite relationship (that is, a relationship in which the distance between the walls 44, or interior walls 44a changes from a greater to a lesser value).

FIGS. 1A and B show one embodiment of the conduits 36 in which the walls 44 of the conduits 36 are parallel to each other. FIGS. 2-4 show a preferred embodiment of the present invention in which the walls 44 forming the inside of the conduits 36 are tapered inwardly from the top surface 34 of the framework 32 to the bottom surface 35 of the framework 32. When the walls 44 of the conduits 36 are tapered either inwardly or outwardly, the interior walls 44a of the framework 32 will bear the opposite relationship to each other. Thus, as shown in FIGS. 2-4, when the walls 44 of the conduits 36 are tapered inwardly from the top surface 34 of the framework 32 to the bottom surface, the interior walls 44a will be tapered outwardly from the top surface 34 of the framework 32 to the bottom surface 35. The tapering of the walls 44 and interior walls 44a is controlled by collimating the light used to cure the photosensitive resin.

Preferably, the interior walls 44a of the framework 32 are tapered outwardly from the top surface 34 of the framework 32 to the bottom surface 35 of the framework 32 in an amount such that the surface area of the paper side network 34a is less than about 70% of the total surface area of the framework 32, and the surface area of the backside network 35a in the second surface 35 of the framework 32 is at least about 45% of the total surface area of the framework 32. In an especially preferred embodiment, the interior walls 44a are tapered such that the surface area of the paper side network 34a (first surface knuckle area $A_{N1}$) is approximately 35% of the total surface area of the framework, and the surface area of the backside network 35a (second surface knuckle area $A_{N2}$) is approximately 65% of the total surface area of the backside 12 of the papermaking belt 10 of the present invention prior to the formation of the passageways 37 in the backside network 35a. In this especially preferred embodiment of the present invention, the angle of the taper, $a_T$ shown in FIG. 21, of the walls 44 of the conduits 36 is approximately 15 degrees from vertical.

The relationship between the framework 32 and the reinforcing structure 33 is shown in FIGS. 3 and 4. As shown in FIGS. 3 and 4, the reinforcing structure 33 is generally located more near the backside 12 of the papermaking belt 10 than the paper-contacting side 11 of the belt. While it is possible to create a belt in which the reinforcing structure 33 is located more near the paper side 11, such a construction is not preferred.

There are three primary reasons the reinforcing structure 33 is located more near the backside 12 of the papermaking belt 10. One reason is that the reinforcing structure 33 is generally placed adjacent to a casting surface during formation, and as a result, only a limited amount of resin is generally present between the reinforcing structure 33 and the casting surface. This can, however, be altered without departing from the scope of this invention. Another reason is that it is frequently preferable for the reinforcing structure 33 to serve as the wear surface or machine-contacting surface when the portions of the resin framework 32 along the backside 12 of the papermaking belt 10 wear thin because the reinforcing structure 33 provides more a durable surface for contacting the papermaking equipment over which the papermaking belt 10 passes than does the hardened polymeric resin which comprises the framework 32. A final reason is that a portion of the resin framework 32 must cover the reinforcing structure 33 to form conduits 36 of the desired pattern and depth on top of the paper-facing side 51 of the reinforcing structure 33. The portion of the resin framework 32 covering the reinforcing structure 33 is referred to as "the overburden" and is designated as $t_o$ in FIG. 21. The overburden enables the conduits 36 to adequately serve their purpose of providing an area into which the fibers in the paper web can be deflected so that these fibers can be rearranged without the interference of the strands of the reinforcing structure 33.

When it is said that the reinforcing structure 33 is located more near to the backside 12 of the papermaking belt 10, the particular dimensions involved can vary. In the preferred embodiment of the papermaking belt 10 of the present invention, the typical preferred woven element with stacked warp strands has a thickness of between about 10 mils and about 37 mils (0.254 mm and 0.94 mm). The thickness of the resin overburden $t_o$ is between about 4 mils and about 30 mils (0.102 mm and 0.762 mm). When the overburden $t_o$ is within this preferred range, the composite papermaking belt 10 is generally between approximately 14 and 67 mils thick (0.356 mm and 1.70 mm). Other applications could require that the overburden $t_o$ be between about 2 mils and about 250 mils (0.051 mm and 6.35 mm) thick. This would, of course, change the overall thickness of the composite papermaking belt 10 accordingly.

FIGS. 3 and 4 show the characteristics of the backside 12 of the papermaking belt 10 and the second surface 35 of the framework. As shown in FIGS. 3 and 4, the papermaking belt 10 has a textured backside 12. It is this textured backside 12 which is also referred to herein as "backside texturing", or "backside texture") which is of primary importance in the present invention. As used herein with relation to the backside 12 of the papermaking belt 10, the term "texture" refers to the characteristic of the backside 12 created by discontinuities or nonplanar interruptions in what would ordinarily be a smooth or planar surface. These discontinuities or nonplanar interruptions can comprise projections from the plane of such a surface or depressions in such a planar surface.

FIGS. 22A through 22C show that a backside texture can be provided by different portions of the papermaking belt when the belt comprises a framework and a reinforcing structure. It should be understood, however, that the particular types of backside texture shown in FIGS. 22A through 22C will not necessarily be found in the papermaking belt 10 of the present invention. It is possible that a texture similar to that shown in FIG. 22B could be created in the papermaking belt of the present invention, but it is more likely that the texture will be similar to that shown in FIGS. 22A and 22C. FIGS. 22A through 22C show that the backside texture in general can be provided by: the passageways 37 that provide surface texture irregularities 38 in the backside network 35a of the second surface 35 of the framework 32; by the characteristics of the machine-facing side 52 of the reinforcing structure 33; or, by both the passageways 37 that provide surface texture irregularities 38 and the characteristics of the machine-facing side 52 of the reinforcing structure 33. The definitions of these terms and a description of the characteristics of the machine-facing side 52 of the reinforcing structure 33 are provided below. Each of the alternative ways the backside texture can be provided are then examined with reference to FIGS. 22A-22C.

As used herein, the term "passageways" means spaces through which air may pass. The term "passageways" shall not be construed to include spaces which are of any particular shape and size. Thus, the passageways 37 described herein are not limited to spaces which resemble tunnels and the like in shape.

As used herein, the term "surface texture irregularities" (or simply "irregularities") refers to any discontinuity or nonplanar interruptions in an ordinarily smooth or planar surface, such as projections from the plane of a smooth surface and/or depressions in such a surface. The irregularities 38 comprise those portions which constitute nonregular or uneven portions in the backside network 35a of the second surface 35 of the framework 32. The surface texture irregularities 38 can be any discontinuities, or breaks in the resinous material which forms the backside network surface 35a, or any portions of the backside network surface 35a where resin has been removed or added to the backside network surface 35a.

The characteristics of the machine-facing side 52 of the reinforcing structure 33 which may form or contribute to form the backside texture are shown in FIGS. 22A through 22C. As shown in FIGS. 22A through 22C, the structural components 40a such as the knuckles and yarns of the woven reinforcing structure define several planes which are references for describing the backside texture of the belt 10. The backside 12 of the papermaking belt 10 of the present invention defines a plane which is designated $P_b$. The plane $P_b$ defined by the backside of the belt is a plane which, if the backside 12 of the papermaking belt 10 of the present invention were placed on a flat surface, would lie in the same plane as the flat surface. The knuckles of the paper-facing side 51 of the reinforcing structure 33 (such as paper side knuckles such as $105_{b1}$) define a plane which is designated $P_{k1}$. The plane $P_{k1}$ is referred to herein as "the plane defined by the paper-facing side of the reinforcing structure." The knuckles of the machine-facing side 52 of the reinforcing structure 33 (such as backside knuckles $105_{b2}$) define a plane which is designated $P_{k2}$. The plane $P_{k2}$ is referred to herein as "the plane defined by the machine-facing side of the reinforcing structure."

As shown in FIGS. 22A, B, and C, the profile of the machine-facing side 52 of the reinforcing structure 33 cross-section has a specific contour or shape. As shown in these figures, the contour of the machine-facing side 52 of a woven reinforcing structure 33 is defined by some of the warp yarns 53 and some of the weft yarns 54 (which comprise the structural components 40a of the reinforcing structure 33). In addition, FIGS. 22A, B, and C show that portions of some of the warp yarns 53 and some of the weft yarns 54 on the machine-facing side 52 of the reinforcing structure 33 form raised portions 120. As used herein, the term "raised portions" refers to those portions of the warp yarns or weft yarns, or other structural components 40a that lie in the machine-facing side 52 of the reinforcing structure 33 and are disposed inward of the plane defined by the machine-facing side of the reinforcing structure $P_{k2}$.

As used with reference to the planes and the raised portions 120 described above, the term "inward" means from either the paper side 11 of the papermaking belt 10 or the backside 12 of the papermaking belt 10 toward the center of the papermaking belt 10 (i.e., toward an imaginary line which lies midway between the paper side 11 and the backside 12). With relation to the above-described planes, the term "outward" means from the center of the papermaking belt toward either the paper side 11 of the papermaking belt 10 or the backside 12 of the papermaking belt 10. The raised portions 120 in FIGS. 22A-22C are more specifically shown to be formed by those portions of the warp yarns 53 and the weft yarns 54 which lie in the machine-facing side 52 of the reinforcing structure 33 between the machine side knuckles, such as knuckles 105b$_2$.

In the preferred multilayer woven reinforcing structure 33 shown in FIGS. 22A, B, and C, the raised portions 120 are generally formed by portions of the warp yarns 53 of the second warp layer D, together with portions of the interwoven weft yarns 54. More specifically, in the preferred reinforcing structure 33, the raised portions 120 will be formed by those portions of the warp yarns 53 in the second warp layer D and by those portions of the weft yarns 54 which lie both in the machine-facing side 52 of the reinforcing structure 33 and between those portions of the same yarns which form the machine-side knuckles 105$_2$. In addition, as shown in FIG. 22D, when the reinforcing structure 33 is comprised of yarns having round cross-sections, and the bottoms of the yarns lie in the plane P$_{k2}$, some of the raised portions 120 will be formed by portions on the sides of the yarns which due to the curvature of the cross-section of the yarns, are spaced away from the plane defined by the machine-facing side of the reinforcing structure P$_{k2}$. These are referred to as "raised perimeter portions", and are designated by reference numeral 120a in FIG. 22D. FIG. 22D shows that in the particular cross-section shown, these raised perimeter portions 120a are positioned within the projected warp areas A$_{wp}$ of the warp yarns 53 in the second warp layer D.

FIGS. 22A–22C also show that certain of the raised portions, the inwardly-spaced raised portions numbered 120', are spaced inward a greater distance from the plane defined by the machine-facing side of the reinforcing structure P$_{k2}$ than other raised portions 120. FIGS. 22A–C show that in the preferred multilayer reinforcing structure 33, along the cross-section shown, it is believed that some of the inwardly-spaced raised portions 120' are formed by the warp yarns 53 in the second warp layer D. FIGS. 22A–C show that the points which form the bottom 53' of these warp yarns 53 form a surface, the "raised surface", which defines a plane P$_r$. The plane P$_r$ may also be referred to as the plane defined by the raised portions which form the raised surface.

It should be noted in reference to the drawing figures, that the distance the warp yarns 53 in the second warp layer D are spaced inward from the plane defined by the machine-facing side of the reinforcing structure P$_{k2}$ has been somewhat exaggerated in FIGS. 22A–C and in some of the other figures as well for purposes of illustration. It should be understood that in some variations of the reinforcing structure 33, these warp yarns 53 may be spaced inward in different amounts. As shown in the variation of the reinforcing structure 33 depicted in FIG. 22D, the warp yarns 53 in the second warp layer D may even lie in the same plane as the plane defined by the machine-facing side of the reinforcing structure P$_{k2}$. In that case, they will not be inwardly-spaced at all.

The alternative ways in which the passageways 37, the surface texture irregularities 38 and the characteristics of the machine-facing side 52 of the reinforcing structure contribute to form the backside texture are shown in FIGS. 22A–22C. One of the ways that the texture on the backside 12 of the papermaking belt 10 of the present invention can be provided is shown in FIG. 22A. In FIG. 22A, the texture is provided entirely by the passageways 37 that provide surface texture irregularities 38 in the backside network 35a of the framework 32. As shown in FIG. 22A, the second surface 35 of the framework 32 completely covers the reinforcing structure 33 when the backside texture 12 is provided entirely by the passageways 37 and the irregularities 38.

As used herein, in reference to the surfaces of the framework 32, the term "covers" means that the side of the reinforcing structure 33 in issue is positioned completely between the first and second surfaces 34 and 35 of the framework 32. The surfaces of the framework 32 are considered herein to "cover" the side of the reinforcing structure 33 in issue when they are so positioned even though there are portions of the reinforcing structure 33 which lie within the conduits 36, and as a result will not have a resinous material on either side.

As shown in FIGS. 22B and 22C, the backside texture can be provided partially by the passageways 37 and irregularities 38 and partially by the contour of the machine-facing side 52 of the reinforcing structure 33. FIG. 22B shows one alternative situation in which the second surface 35 of the framework 32 generally does not cover any portions of the reinforcing structure 33 so that the machine-facing side 52 of the reinforcing structure 33 is exposed. FIG. 22C shows another alternative situation in which the second surface 35 of the framework 32 covers portions of the machine-facing side 52 of the reinforcing structure 33, and leaves other portions of the reinforcing structure 33 exposed.

The types of backside texturing shown in FIGS. 22A through 22C are the three basic types of backside texturing. These types of backside texturing are referred to for convenience as "positive backside texture"; "negative backside texture"; and a combination of both "positive and negative backside texture".

By "positive backside texture", as shown in FIG. 22A, it is meant that the passageways 37 extend from the plane P$_b$ defined by the backside 12 of the belt 10 toward the plane defined by the machine-facing side of the reinforcing structure P$_{k2}$. As shown in FIG. 22A, in the case of positive texturing, the plane defined by the machine-facing side of the reinforcing structure P$_{k2}$ lies inward of the plane defined by the backside of the papermaking belt P$_b$. Thus, the reinforcing structure 33 is positioned completely between the first surface 34 of the framework 32 and the second surface 35 of the framework 32.

Another, and perhaps an easier way of looking at positive backside texture is to look at the relationship between the passageways 37 and irregularities 38 and the plane defined by the machine-facing side of the reinforcing structure P$_{k2}$, rather than at relationship the passageways 37 and the surface texture irregularities 38 form with the plane defined by the backside of the papermaking belt, P$_b$. In the case of positive backside texture, as shown in FIG. 22A, the passageways 37 are positioned outward of the plane defined by the machine-facing side of the reinforcing structure P$_{k2}$. The surface texture irregularities 38 extend outward from the plane defined by the machine-facing side of the reinforcing structure P$_{k2}$.

By "negative backside texture", as shown in FIG. 22B, it is meant that the passageways 37 extend inward from the plane defined by the machine-facing side of the reinforcing structure P$_{k2}$ toward the plane defined by the paper-facing side of the reinforcing structure P$_{k1}$. In papermaking belts which are exclusively negatively textured, the plane defined by the backside of the papermaking belt P$_b$, and the plane defined by the machine-facing side of the reinforcing structure $P_{k2}$ will be the same.

By "positive and negative backside texture", as shown in FIG. 22C, it is meant that both types of passageways described above are present. Thus, some of the passageways 37 are disposed inward of the plane defined by the machine-facing side of the reinforcing structure $P_{k2}$, and some of the passageways 37 are positioned outward from the plane defined by the machine-facing side of the reinforcing structure. In the case of positive and negative backside texture, the plane defined by the machine-facing side of the reinforcing structure $P_{k2}$ lies inward of the plane defined by the backside of the papermaking belt $P_b$.

It is apparent from an examination of the three figures discussed above that the wear surface of a papermaking belt having the different types of backside texture will differ.

As shown in FIG. 22A, the wear surface of belts which have a positive backside texture will (at least at first) be comprised entirely of a resinous material. When the jagged projections comprising the surface texture irregularities 38 travel over the machinery employed in the papermaking operation, after many revolutions of the belt 10, these projections will tend to wear off so that at some point the wear surface will become virtually the same as the plane defined by the machine-facing side of the reinforcing structure $P_{k2}$. The new wear surface will comprise a combination of the machine-facing side 52 of the reinforcing structure 33 and the resin from the framework 32 which has been worn to a level even with the plane $P_{k2}$. At this point, there will be a very limited number of passageways 37 for air to pass through along the second surface 35 of the framework 32.

As shown in FIG. 22B, the initial wear surface of the belts which have a negative backside texture will generally be solely comprised of portions of the machine-facing side 52 of the reinforcing structure 33. In the case of negative texturing, the initial wear surface will thus be comprised of polyester (or one of the other materials specified above) which is generally more durable than the resinous material which comprises the framework 32. In addition, as shown in FIG. 22B, negatively textured belts may have passageways such as 37', which extend inwardly from the machine-facing side 52 of the reinforcing structure 33. When the belt is worn so that the wear surface coincides with the machine-facing side 52 of the reinforcing structure 33, these passageways 37' will still provide openings along the backside 12 of the belt. Thus, belts having a negative backside texture will generally continue to allow air to escape across their backside 12 to a certain extent after having become worn.

As shown in FIG. 22C, the wear surface of the belts which have a combination of both negative and positive texture will, at least at first be comprised entirely of the resinous material which comprises the framework 32. When the jagged projections which comprise this resinous material wear off, the wear surface, as in the case of the belt shown in FIG. 22A, will, become virtually the same as the plane defined by the machine-facing side of the reinforcing structure $P_{k2}$. One difference between the belts shown in FIGS. 22A and 22C, however, is that because of the negative texturing there will still be passageways 37 in the latter belt after the positive texture has worn off. For this reason, it is believed that it is generally be preferable to have at least some negative texturing in the preferred embodiment of the present invention to preserve a textured wear surface on the backside after the initial texture has been worn down.

In the present invention, the texture is formed on the backside 12 of the papermaking belt 10 by manipulating the liquid photosensitive resin which when cured comprises the framework 32. The liquid photosensitive resin is manipulated around the reinforcing structure 33 to form passageways 37 and surface texture irregularities 38 in the backside network 35a of the second surface 35 of the framework 32. The location, characteristics, and distribution of the passageways 37 and the irregularities 38 in the papermaking belt are, therefore, generally described with respect to the reinforcing structure 33. The definitions of several terms will be provided which will serve as references when describing the location, characteristics, and distribution of the passageways 37 and the surface texture irregularities 38 with respect to the reinforcing structure 33.

Figure 12A:
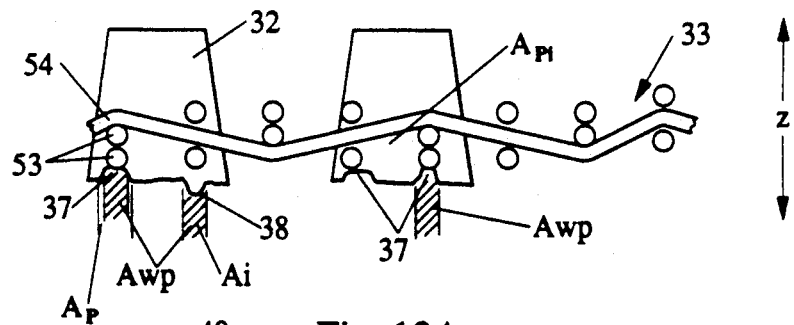
FIG. 12A is an end view of the portion of the reinforcing structure of FIG. 12 which illustrates the position of some passageways and surface texture irregularities relative to several of the projected areas of the reinforcing structure.

As shown in FIGS. 12 and 12A, the passageways 37 and the surface texture irregularities 38 each define projected areas. It is to be understood that the passageways 37 and surface texture irregularities 38 are shown in a certain manner in FIGS. 12 and 12A for purposes of the following discussion and that the types of passageways 37 and irregularities 38 shown will not necessarily be found in all embodiments of the papermaking belt of the present invention. The projected area of the passageways 37 shown in FIGS. 12 and 12A is represented by reference letter $A_p$. As used herein, the projected area of a passageway 37 refers to the area defined by the projection of the passageway 37 in the z-direction. The projected area of the irregularity 38 shown in FIGS. 12 and 12A is represented by reference letter $A_i$. As used herein, the projected area of a surface texture irregularity 38 refers to the area defined by the projection of the irregularity 38 in the z-direction.

As used in this specification, when a passageway 37 or a surface texture irregularity 38 (or the projected area of a passageway 37 or a surface texture irregularity 38) is described as being "aligned with", "lying within", or "positioned within", or other similar terms with respect to one of the projected areas of the elements of the reinforcing structure 33 (or the framework 32), it is meant that the passageway or irregularity lies within the boundaries of the projected area in all planes into which the element in issue could be projected in the z-direction. In other words, a passageway or an irregularity which "lies within" a projected area could be positioned above the element which defines the projected area, or below the element which defines the projected area, or, even partially above, and partially below the element. In addition, portions of the passageway or irregularity could lie within one or more planes into which the element has been projected in the z-direction.

FIGS. 12 and 12A show several of the possible locations for the passageways 37 and the surface texture irregularities 38 described above. Examining FIGS. 12 and 12A from left to right, the first passageway 37 shown lies partially within a projected warp area $A_{wp}$. Part of this passageway 37 also lies outside of the projected warp area $A_{wp}$. To the right of the first passageway 37 is an irregularity 38. The irregularity 38 shown in FIGS. 12 and 12A lies within a projected warp area $A_{wp}$. To the right of the irregularity 38 is a third passageway 37. The third passageway lies entirely within a projected interstitial area $A_{pi}$. A fourth passageway 37 is shown to the right of the third passageway 37. The fourth passageway 37 lies entirely within a projected warp area $A_{wp}$.

It should be understood that when a passageway 37 or a surface texture irregularity 38 is described with reference to a projected area, this means that the position of the element of in issue is generally located as specified relative to the projected area. There may, however, be small portions of the passageway 37 or irregularity 38 which will not correspond exactly with the area in issue. These slight variances in the actual position of the element from the projected areas can be attributed to at least two factors. One factor is the fact that the elements involved (such as the passageways and the irregularities) are extremely small and minor variations in the position of an element will be exaggerated with respect to the projected areas. This may cause the element to be slightly outside of the boundaries of the projected area. The second factor results from the fact that the position of the passageways 37 and the surface texture irregularities 38 are sometimes established by the manner in which the light rays which cure the liquid photosensitive resin comprising the framework 32 pass through the reinforcing structure 33. The direction these light rays travel is not always solely in the z-direction, and as a result, the projection of the above-described areas from the direction of the light source may be slightly different from the projection of the same areas in the z-direction.

The characteristics of the passageways 37 and the surface texture irregularities 38 are best discussed with relation to FIG. 21. As shown in FIG. 21, there is a relationship between the passageways 37 and the surface texture irregularities 38. The passageways 37 are openings for fluid, or more specifically, air, or air and water, to pass along the second surface 35 of the framework 32. When the passageways 37 are formed in the backside network 35a, they provide the surface texture irregularities 38. The irregularities 38, therefore, are the portions of the backside network 35a of the framework 32 which surround the passageways 37. In the general sense, however, the passageways 37 themselves comprise surface texture irregularities because they are also discontinuities or irregularities in the backside network 35a of the framework 32.

As shown in the FIG. 21, both the passageways 37 and the irregularities 38 are distinct from the conduits 36 which pass through the framework 32. By "distinct" from the conduits, it is meant that the passageways 37 and the irregularities 38 which comprise departures from the otherwise smooth and continuous backside network 35a of the framework 32 are to be distinguished from the holes 41 formed by the conduits 36. In other words, the holes 41 formed by the conduits 36 are not intended to be classified as passageways or surface texture irregularities.

The physical characteristics of the individual passageways 37 are shown in FIG. 21. It is to be understood that FIG. 21 is an exaggerated schematic view of a portion of a papermaking belt which shows passageways 37 and surface texture irregularities 38 of a variety of different shapes. Thus, while the variety of the backside texturing shown in FIG. 21 is useful in describing the general characteristics of the passageways 37 and irregularities 38, the particular backside texturing shown in FIG. 21 may not actually be found in the papermaking belt 10 of the present invention. The particular backside texturing of a given papermaking belt will depend upon the method used to make the belt. These particular textures will be discussed in conjunction with the enlarged photographs of the belts constructed in accordance with the method of making the papermaking belt of the present invention described herein.

As shown in FIG. 21, the passageways 37 can have sides, which are designated generally by reference numeral 66. These sides can have an infinite number of different shapes. They can be curved or relatively straight when viewed in cross-section, or partially curved and partially straight. Oftentimes, however, the sides 66 of the passageways 37 will be so irregular that they are not capable of precise definition.

As shown in FIG. 21, the sides 66 of the passageways 37 can range from relatively vertical (i.e., oriented in the z-direction) to relatively horizontal (oriented in the x and y directions). The angle that a side 66 forms relative to the z-direction has been designated as $a_s$ in FIG. 21. It is to be understood, however, in the case of a passageway 37 which has curved or irregular sides, the size of angle $a_s$ will vary depending on the reference points used to measure the angle $a_s$ formed by the side 66.

Further, each passageway 37 can have various numbers of different sides 66. The number of sides 66 can vary from essentially one continuous curved wall to virtually an infinite number of sides of various cross-sections. In the simplified cross-section shown in FIG. 21, some of the passageways 37 appear to have sides 66 which resemble interior walls, or walls 66a. In addition, some of the passageways 37 which have relatively vertical walls 66a will have a side which resembles a roof, 66b. One side of the passageways 37, however, will always be open. The open sides are designated 66c in FIG. 21.

In addition, although the passageways 37 are generally extremely minute, they have a finite height $h_p$, width $w_p$, spacing $s_p$, and cross-sectional area $A_{xp}$.

As shown in FIG. 21, the height $h_p$ of a passageway 37 is the distance, measured in the z-direction, from the plane defined by the backside of the belt $P_b$ to a point, such as 66d, on the interior of the passageway 37. As shown in FIG. 21, the height $h_p$ of different portions of an individual passageway 37 may vary across the width of the passageway 37. In addition, the height $h_p$ of the various passageways 37 in the backside network 35a of the second surface 35 can vary from passageway to passageway.

The width $w_p$ of a passageway 37 is the distance, measured in some direction in the X-Y plane, depending upon the cross-section taken, between two points lying on the opposite side walls 66a of the passageway 37. If the side walls are formed by a single curved surface, the width $w_p$ of the passageway is the distance measured in the X-Y plane between two points on opposite sides of the curved surface. As shown in FIG. 21, the width of a different portions of an individual passageway 37 may vary depending on the portion of the passageway 37 at which the width is measured. In addition, the width of the various passageways 37 in the backside network 35a of the second surface 35 can vary from passageway to passageway.

The cross-sectional area of a passageway $A_{xp}$ is represented by a cross-hatched area in FIG. 21. The cross-sectional area of a passageway $A_p$ is the area measured on a given cross-section, of the interior portion of the passageway 37 which is bounded by an imaginary line which runs along the plane defined by the backside of the belt $P_b$. The combined cross-sectional areas $A_{pT}$ of the individual passageways 37 is important in that it is these areas through which air escapes when the papermaking belt of the present invention travels over a vacuum box during the papermaking process.

The spacing between adjacent passageways 37 is represented by reference letter $s_p$ in FIG. 21. The spacing $s_p$ between adjacent passageways 37 is defined herein with relation to two points of reference which lie on the sides of the irregularities 38 which border the passageway 37 in issue. These two points, shown as 109 in FIG. 21, lie on the sides of the irregularities 38 which are referred to herein as the coterminous sides of the irregularities 38. The coterminous sides of the irregularities 38, designated 67a, are referred to as such because they also form the sides 66 of the neighboring passageways 37. The two reference points 109 chosen are those points on the coterminous sides 67a which are the shortest distance measured in the z-direction from the plane defined by the backside of the belt $P_b$. In FIG. 21, the two reference points 109 actually lie in the plane $P_b$, but this will not always be the case. The spacing $s_p$ between adjacent passageways 37, shown by the arrow in FIG. 21, is the distance measured in the X-Y plane between the reference point 109 on the coterminous side 67a of the irregularity 38 which lies between the passageways in issue to the next adjacent reference point 109 which lies on the opposite coterminous side 67a of the same irregularity 38.

The overall pattern of spacing between the passageways 37 determines the distribution of the passageways 37. The passageways 37 can be distributed in an unlimited number of ways across the backside network 35a of the framework 32. The distribution of the passageways 37 can, for instance, be random, uniform, regular, or in some particular pattern.

Figure 31:
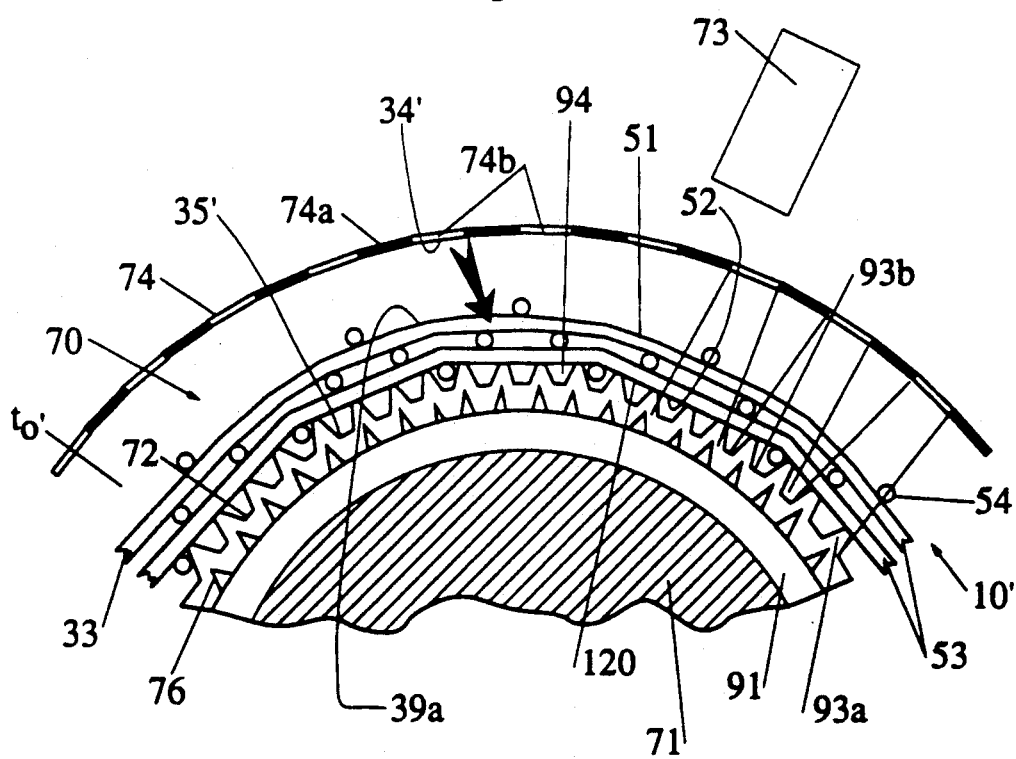
FIG. 31 is a schematic representation of the forming unit in FIG. 30 which has been further enlarged to show in detail the manner in which the backside texturing is formed during the casting process.

An example of randomly-spaced passageways 37 are the passageways 37 of the belt 10 with a combination of positive and negative texturing shown in FIG. 22C. As used herein, the term "uniform" means that the density (or number) of passageways 37 is approximately the same over the entire surface, even though the passageways 37 do not form any particular pattern. As used herein, the term "regular" means that the spacing between adjacent passageways $s_p$ is approximately the same across the entire backside network 35a. An example of regularly-spaced passageways 37 are the passageways 37 of the belt 10 with positive backside texturing shown in FIG. 22A. The belt 10 shown in FIG. 22A also serves as an example of uniformly-spaced passageways in that the density of passageways is approximately the same over the entire surface of the backside network 35a. The spacing between adjacent passageways 37 in the belt 10 shown in FIG. 22A is sufficiently similar that the spacing of the passageways 37 shown therein could also be considered to be in a pattern. Another example of passageways which are distributed in a pattern are the passageways 37 of the belt with negative backside texturing shown in FIG. 22B. The passageways distributed in a pattern in FIG. 22B do not, however, include passageways 37'. A virtually unlimited number of combinations of the basic types of backside texture shown in FIGS. 22A–C and the spacings between passageways described herein are possible. As shown in FIG. 31, for instance, the partially-formed composite belt 10' being made by the process of the present invention provides an example of both regularly-spaced passageways 37, and passageways 37 distributed in a pattern in a belt which has a combination of positive and negative backside texture.

The passageways 37 may also be distributed across "generally all" portions of the second surface 35 of the framework 32. By this it is meant that the passageways 37 can be found on any portion of the backside network surface 35a; and that there is no particular area, or areas, of the backside network surface 35a from which the passageways 37 are excluded. Thus, in the case where the reinforcing structure comprises a woven element, the passageways 37 can be located in the projected reinforcing area $A_R$ or in the projected open area $A_o$ of the reinforcing structure. By specifying that the distribution is across "generally all" of the backside network 35a, rather than across "all" of the backside network 35a, it is meant that while the passageways 37 can be found at virtually any particular place on the backside network 35a, the passageways 37 do not necessarily cover the entire backside network 35a.

The physical characteristics of the individual surface texture irregularities 38 are shown in FIG. 21. In addition, a general description of surface texture irregularities is found in Broadston, *Marks' Standard Handbook for Mechanical Engineers*, "Surface-Texture Designation, Production, and Control," (McGraw-Hill 1967) pp. 13–106 to 13–112, which is incorporated herein by reference. As shown in FIG. 21, the sides of the surface texture irregularities 38 are generally designated 67. The surface texture irregularities 38 of the present invention (like the passageways) can have sides 67 with an infinite number of different shapes. As in the case of the passageways, the sides 67 of the irregularities 38 can be curved or relatively straight when viewed in cross-section, or partially curved and partially straight. Oftentimes, however, the sides 67 of the irregularities 38 are so irregular that they are not capable of precise definition.

As shown in FIG. 21, the sides 67 of the irregularities 38 can range from relatively vertical (i.e., sloped in the z-direction) to relatively horizontal (sloped in the x and y directions). The angle that a side 67 of an irregularity 38 forms relative to the z-direction has been designated as $a_i$ in FIG. 21. It is to be understood, however, in the case of an irregularity 38 which has curved or irregular sides, the angle $a_i$ will depend on the reference points used to measure the angle $a_i$ formed by the side 67 of the irregularity 38.

Further, each irregularity 38 can have various numbers of different sides 67. The number of sides 67 can vary depending on the shape of the irregularity 38. For dome-shaped or knob-shaped irregularities, the side(s) 67 of the irregularity 38 will appear as one continuous curved line when viewed in cross-section. In cases where the irregularity 38 has a more complex geometry, there can be a virtually an infinite number of sides 67 of various cross-sections.

FIG. 21 shows the previously-described coterminous sides 67a of the irregularities 38 which are formed by the interior walls 66a of the passageways 37. As shown in FIG. 21, these coterminous sides 67a will often be relatively unequal in length because the coterminous sides 67a for a given irregularity 38 may be formed by the side walls 66a of two or more radically differently-shaped passageways 37.

FIG. 21 also shows that one or more of the sides 67 of the irregularities 38 may not be formed by the same structure that forms the walls of neighboring passageways 37. These sides will be referred to as the independently-formed sides of the irregularities 38, and are designated 67b in the drawings. Oftentimes, these independently-formed sides 67b of the irregularities 38 will comprise a portion of the wear surface on the backside 12 of the belt 10.

In addition, as in the case of the passageways 37, although the irregularities 38 are generally extremely minute, they also have a finite height $h_i$, width $w_i$, spacing $s_i$, and cross-sectional area $A_{xi}$. As shown in FIG. 21, the boundaries of the irregularities 38 are frequently established by the coterminous sides 67 of the irregularities 38. Since the coterminous sides 67a of an irregularity 38 can be quite unequal, the precise height, and also the width, and cross-sectional area $A_{xi}$ of an irregularity 38 may be difficult to express.

For the purposes of definition of these characteristics of the irregularities 38, an arbitrary, but uniform reference point will be chosen for taking these measurements. This reference point has been designated 110 in FIG. 21. The reference point 110 is a point which lies on the shortest of the coterminous sides 67a of the irregularity 38. More specifically, it is the point on the shortest of the coterminous sides 67a which is the greatest distance inward from the plane defined by the backside of the belt $P_b$. FIG. 21 shows that the point 110 may be in two different places for neighboring irregularities 38.

As shown in FIG. 21, the height $h_i$ of any point on an irregularity 38 is the distance, measured in the z-direction, from a plane which passes through the reference point 110 for the irregularity 38 in issue to the particular point of interest on the irregularity 38. As shown in FIG. 21, the height $h_i$ of different portions of an individual irregularity 38 may vary across the width of the irregularity 38. In addition, the height $h_i$ of the various irregularities 38 in the backside network 35a can vary from irregularity to irregularity.

The width $w_i$ of an irregularity 38 is the distance, measured in the either the x-direction or the y-direction or in some direction in between which lies in the X-Y plane, depending upon the cross-section taken, between two points lying on the opposite sides 67 of the irregularity 38. If the sides 67 are formed by a single curved surface, the width $w_i$ of the irregularity is the distance measured in the X-Y plane between two points on opposite sides of the curved surface. As shown in FIG. 21, the width of a different portions of an individual irregularity 38 may vary depending on the portion of the irregularity 38 at which the width is measured. In addition, the width of the various irregularities 38 in the backside network 35a can vary from irregularity to irregularity.

The cross-sectional area of an irregularity $A_{xi}$ is also represented by a cross-hatched area in FIG. 21. The cross-sectional area of an irregularity $A_{xi}$ is the area measured on a given cross-section, of the portion of the irregularity 38 which lies between an imaginary line which passes through the reference point 110 and the plane defined by the backside of the belt $P_b$.

The irregularities 38 also have a spacing $s_i$ between adjacent irregularities 38. As shown in FIG. 21, the spacing between irregularities 38 in a given direction $s_i$ is the distance measured in the X-Y plane between the reference point 109 which lies on the coterminous side 67 of one irregularity 38 to the reference point 109 which lies on the nearest coterminous side 67a of the next irregularity 38.

The overall pattern of spacing between the irregularities 38 determines the distribution of the irregularities 38. Like the passageways, the irregularities 38 can be distributed in an unlimited number of ways across the backside network 35a of the framework 32. The distribution of the irregularities 38 can be random, uniform, regular, or in some particular pattern. As used herein, the term "uniform" means that the density (or number) of irregularities 38 is approximately the same over an entire surface, even though the irregularities 38 do not form any particular pattern. As used herein, the term "regular" means that the spacing between adjacent irregularities $s_i$ is approximately the same across the entire backside network 35a. In addition, as in the case of the passageways 37, the irregularities 38 may be distributed across "generally all" portions of the backside network 35a. When the irregularities 38 are distributed across "generally all" of the backside network 35a, it is meant that while the irregularities 38 can be found at virtually any particular place on the backside network 35a, the irregularities 38 do not necessarily cover the entire backside network 35a. Examples of the various different distributions of the irregularities 38 are shown in the same figures of the accompanying drawings which show the corresponding types of distributions of the passageways 37.

In addition to having the characteristics described above, the irregularities 38 may also be described as either projections or depressions in the backside network 35a of the framework 32. As used herein, if an irregularity 38 is referred to as either a projection or as a depression, the frame of reference being used to describe the irregularity 38 is the plane defined by the machine-facing side of the reinforcing structure $P_{k2}$. Any irregularity 38 which projects outward from this plane in the z-direction is a projection. Any irregularity 38 which lies inward in the z-direction from the plane $P_{k2}$, is a depression.

The particular characteristics of the textured backside 12 of the preferred embodiment of the papermaking belt 10 of the present invention depend upon the method used to make the belt 10. These particular characteristics are generally shown in the enlarged photographs of FIGS. 36A–C, and FIGS. 37A–C, and will be discussed in conjunction with the description of the various alternative versions of the method used to make the belts shown in the photographs. There are certain general characteristics, however, which are common to the belts which are made by the various alternatives of the basic method. These characteristics are best described with reference to the schematic drawing FIGS. 22A–C.

FIG. 22A shows schematically one alternative embodiment of the papermaking belt 10 of the present invention. In the alternative embodiment shown in FIG. 22A, all of the passageways 37 are positioned outward from the plane defined by the machine-facing side of the reinforcing structure $P_{k2}$. FIG. 22C shows another embodiment of the papermaking belt 10 in which a multiplicity of the passageways 37 are disposed inward of the plane defined by the machine-facing side of the reinforcing structure $P_{k2}$ and a multiplicity of the passageways 37 are positioned outward from the plane defined by the machine-facing side of the reinforcing structure $P_{k2}$. In the latter alternative embodiment, at least a portion of the passageways 37 are disposed inward of the plane defined by the machine-facing side of the reinforcing structure $P_{k2}$ are positioned in the interstices 39 of the reinforcing structure 33 so that a portion of the projected area of the passageways 37 corresponds with a portion of the projected open area of the reinforcing structure 33. In both alternative embodiments, the backside surface 12 of the papermaking belt 10 has sufficient fluid passage capacity to permit about 1,800 standard cubic centimeters/minute of air to escape across the textured surface.

It is believed that the problems which developed when using the prior smooth backsided papermaking belts was at least partially the result of the extremely sudden application of vacuum pressure which was imparted to the paper web when the paper web was carried by the prior belt over the vacuum dewatering machinery employed in the papermaking process. It is believed that the prior smooth backsided papermaking belts would actually temporarily create a seal over these vacuum sources. Then, when the deflection conduits of the papermaking belt of the prior type were encountered, the vacuum pressure would be applied in an extremely sudden fashion to the fibrous web situated on top of the resin framework. This sudden application of vacuum pressure is believed to have caused a sudden deflection of the very mobile fibers in the fibrous belt which was sufficient to allow these mobile fibers to pass completely through the papermaking belt. The difference between the deflection of fibers in the fibrous web when carried by a prior belt $10a$ and by the papermaking belt 10 of the present invention is illustrated schematically in FIGS. 23A and 23B and graphically in FIG. 24.

Figure 23A:
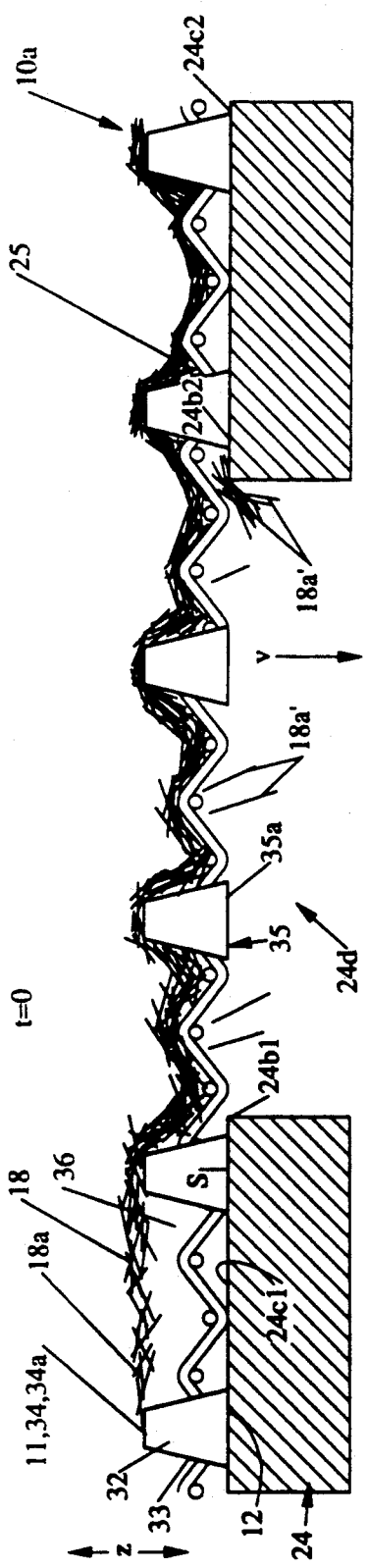
FIG. 23A is an enlarged schematic representation of the problems which occurred when a papermaking belt without the improvements disclosed herein encountered the vacuum dewatering equipment during the papermaking process.
Figure 23B:
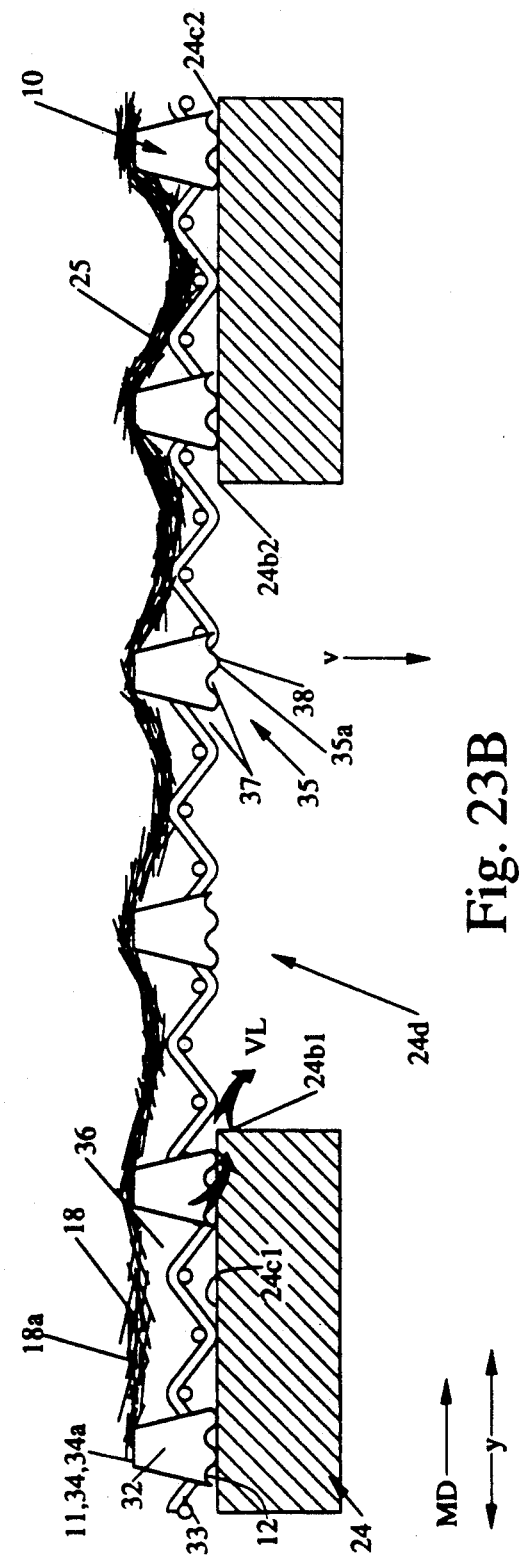
FIG. 23B is an enlarged schematic representation of the manner in which the papermaking belt of the present invention alleviates the problems encountered previously.
Figure 24:
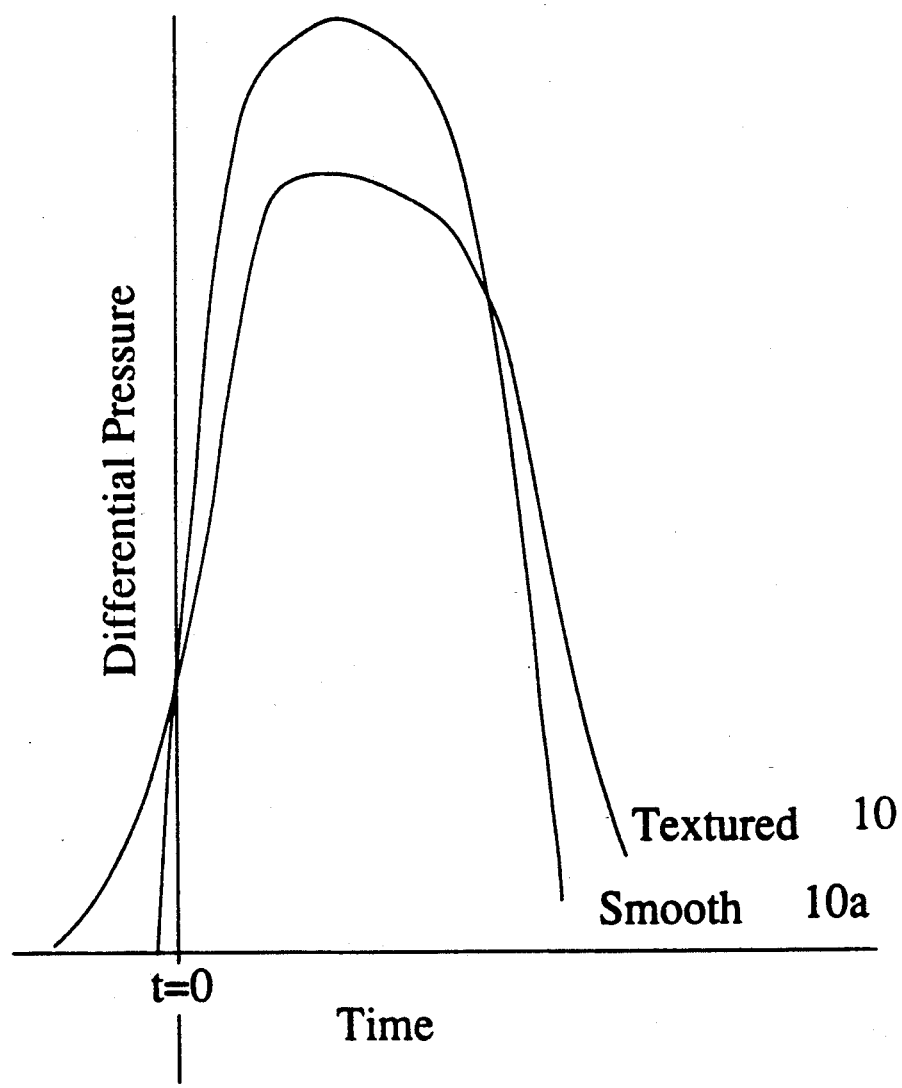
FIG. 24 is a graphical representation which depicts the application of vacuum pressure to a papermaking belt both with and without the backside texture disclosed herein.

FIG. 23A is a representation of what was believed to occur when the prior papermaking belts $10a$ encountered the vacuum dewatering equipment employed in the papermaking process, such as vacuum box 24. FIG. 23B is a representation of what is believed to occur when the improved papermaking belt 10 of the present invention encounters such a vacuum box 24. FIG. 24 is a graphical representation of the vacuum pressure (differential pressure) which is applied to the fibers in the embryonic web 18 as the papermaking belts shown in FIGS. 23A and 23B move across the vacuum slot of the vacuum box.

While each of the papermaking belts $10a$ and 10, respectively shown in FIGS. 23A and 23B comprises a framework 32, having a first surface 34, a second surface 35, and a reinforcing structure 33, the belts differ in that the backside network $35a$ in the second surface 35 of the framework 32 of belt 10 is textured whereas the backside network $35a$ of the framework 32 of belt $10a$ is smooth. It should be understood, however, that there are numerous other differences between the papermaking belt 10 of the present invention and the prior belts (including, but not limited to the shape of the conduits and the particular type of reinforcing structure used) which are not shown in FIGS. 23A and 23B. The purpose of FIGS. 23A and 23B is to show the differences in operation of the belts which results from the differences in their backsides. For simplicity and clarity, the other differences have, therefore, been omitted from FIGS. 23A and 23B.

As shown in FIGS. 23A and 23B, both belts $10a$ and 10 carry an embryonic web 18 (having individual fibers designated $18a$) on the first surface 34 of their respective frameworks 32. In the figures shown, a portion of each belt $10a$ and 10 passes over a single slot $24d$ of a vacuum box 24. The portion of the vacuum boxes shown also include a leading surface, vacuum box surface $24c_1$, which is first encountered when the papermaking belts travel in the machine direction (from left to right in the figures) in the papermaking process, and a trailing surface, vacuum box surface $24c_2$, which is the surface of the vacuum box 24 which is encountered after the papermaking belts pass over the vacuum slot $24d$. In addition, at each of the surfaces $24c_1$ and $24c_2$, adjacent the top of the vacuum slot $24d$, is a lip, such as leading vacuum box surface lip $24b_1$ and trailing vacuum box surface lip $24b_2$. A vacuum V is applied from a vacuum source (not shown), which exerts pressure on the belts and the embryonic webs 18 in the direction of the arrows shown. The vacuum V removes some of the water from the embryonic web 18 and deflects and rearranges the fibers $18a$ of the embryonic web into the conduits 36 of the framework 32.

In FIG. 23A, because of the smooth nature of the backside network $35a$ of the framework 32, it is believed that a vacuum seal is created between the second surface 35 of the framework 32 and the leading surface $24c_1$ of the vacuum box 24 at the place designated with reference letter S. When the belt $10a$ travels to the right, the vacuum slot $24d$ is encountered, the seal is suddenly broken, and the vacuum pressure V is suddenly applied to the embryonic web 18. This causes a sudden deflection of the fibers $18a$ in the embryonic web 18 into the conduits 36, and some of the more mobile fibers, designated $18a'$, to pass entirely through the belt $10a$ and accumulate on the trailing lip $24b_1$ of the vacuum box 24. It has been found that these fibers $18a'$ will eventually accumulate until they build up into clumps of fibers on the trailing surface $24c_2$ of the vacuum box, creating ridges for papermaking belt $10a$ to travel over.

In FIG. 23B, on the other hand, since the backside 12 (particularly the backside network $35a$ of the framework 32) of the belt 10 is textured, there are passageways 37 through which air can enter between the backside surface 12 of the papermaking belt 10 and the leading surface $24c_1$ of the vacuum box to eliminate the seal between backside network $35a$ of the framework 32 and the leading surface $24c_1$ of the vacuum box 24. This entry of air is shown schematically by the large arrows $V_L$. As shown in FIG. 23B, the entry of air $V_L$ permits a more incremental deflection of the fiber $18a$ in the embryonic web 18. Few if any fibers pass through the papermaking belt 10 to accumulate on the trailing vacuum box lip $24b_2$. In addition, it is believed that the textured backside network $35a$ of the papermaking belt 10 shown in FIG. 23B may also serve a scrubbing or cleaning function to remove any such fibers which accumulate on the trailing vacuum box lip $24b_2$.

2. Process for Making the Papermaking Belt

As indicated above, the papermaking belt 10 can take a variety of forms. While the method of construction of the papermaking belt 10 is immaterial so long as it has the characteristics mentioned above, certain methods have been discovered to be useful. By way of background, a detailed description of the process of making the "deflection member" (or "foraminous member") which does not have the improvements disclosed herein is set forth in U.S. Pat. No. 4,514,345, entitled "Method of Making a Foraminous Member" which issued to Johnson, et al. on Apr. 30, 1985. The Johnson, et al. patent is incorporated by reference herein to the extent it is consistent with the present description. One process for making the improved papermaking belt 10 of the present invention and several variations of the same, is described below.

A preferred embodiment of an apparatus which can be used to construct a papermaking belt 10 of the present invention in the form of an endless belt is shown in schematic outline in FIG. 25. In order to show an overall view of the entire apparatus for constructing a papermaking belt in accordance with the present invention, FIG. 25 was simplified to a certain extent with respect to some of the details of the process. The details of this apparatus, and particularly the manner in which the passageways 37 and the surface texture irregularities 38 are imparted to the backside network 35a of the second surface 35 of the framework 32 are shown in the figures which follow. It should be noted at this point that the scale of certain elements shown may be somewhat exaggerated in the following drawing figures.

The overall process shown in FIG. 25 generally involves coating a reinforcing structure 33 with a liquid photosensitive polymeric resin 70 when the reinforcing structure 33 is traveling over a forming unit or table 71 which is provided with a textured working surface (or "casting surface") 72. As shown in FIG. 25 and in the figures which follow, the resin, or "the coating" 70 is applied to at least one (and preferably both) sides(s) of the reinforcing structure 33 so the coating 70 forms a first surface 34' and a second surface 35'. The coating 70 is distributed so that at least a portion of the second surface 35' of the coating is positioned adjacent the working surface 72 of the forming unit 71. The coating 70 is also distributed so that the paper-facing side 51 of the reinforcing structure 33 is positioned between the first and second surfaces 34' and 35' of the coating 70. The portion of the coating which is positioned between the first surface 34' of the coating and the paper-facing side 51 of the reinforcing structure 33 forms a resinous overburden $t_o'$. The thickness of the overburden $t_o'$ is controlled to a preselected value. When the reinforcing structure 33 is coated with photosensitive resin, the liquid resin which has been applied to the machine-facing side 52 of the reinforcing structure 33, along with any resin which flows through the interstices 39 of the reinforcing structure 33 is caused to flow into the pattern of the textured working surface 72. This creates areas in the second surface 35' of the coating which are defined by the textured surface. The liquid photosensitive resin 70 is then exposed to a light having an activating wavelength (light which will cure the photosensitive liquid resin) from a light source 73 through a mask 74 which has opaque regions 74a and transparent regions 74b. The portions of the resin which have been shielded or protected from light by the opaque regions 74a are not cured by the exposure to the light. This uncured resin is then removed to leave conduits which pass through the cured resin framework. The exposure of the resin to light of the activating wavelength creates passageways 37 which provide surface texture irregularities 38 in the backside network 35a of the framework 32 in those areas where the coating penetrated into the texture of the working surface 72 of the forming unit 71. Varying the texture of the casting surface allows the creation of practically any type of passageways and irregularities desired in the backside network 35a of the papermaking belt 10.

For convenience, the stages in the overall process are broken down into a series of steps and examined in greater detail in the discussion which follows. It is to be understood, however, that the steps described below are intended to assist the reader in understanding the method of making the papermaking belt of the present invention, and that the method described below is not limited to only a certain number or arrangement of steps. In this regard, it is noted that it is possible to combine some of the following steps so that they are performed concurrently. Likewise, it is possible to separate some of the following steps into two or more steps without departing from the scope of the present invention.

First Step

The first step of the process of the present invention is providing a forming unit 71 with a textured working surface 72.

As described more fully below, there are various ways to provide a forming unit with a textured working surface. These include, but are not limited to: (1) providing a forming table, drum, or cylinder on which there is a texture (shown generally in FIG. 25); or, (2) (i) providing a forming unit, (ii) providing an element with a textured surface and a forming unit-contacting surface, and (iii) placing the forming unit-contacting surface of the element on the forming unit (shown generally in FIGS. 27-31).

Figure 30:
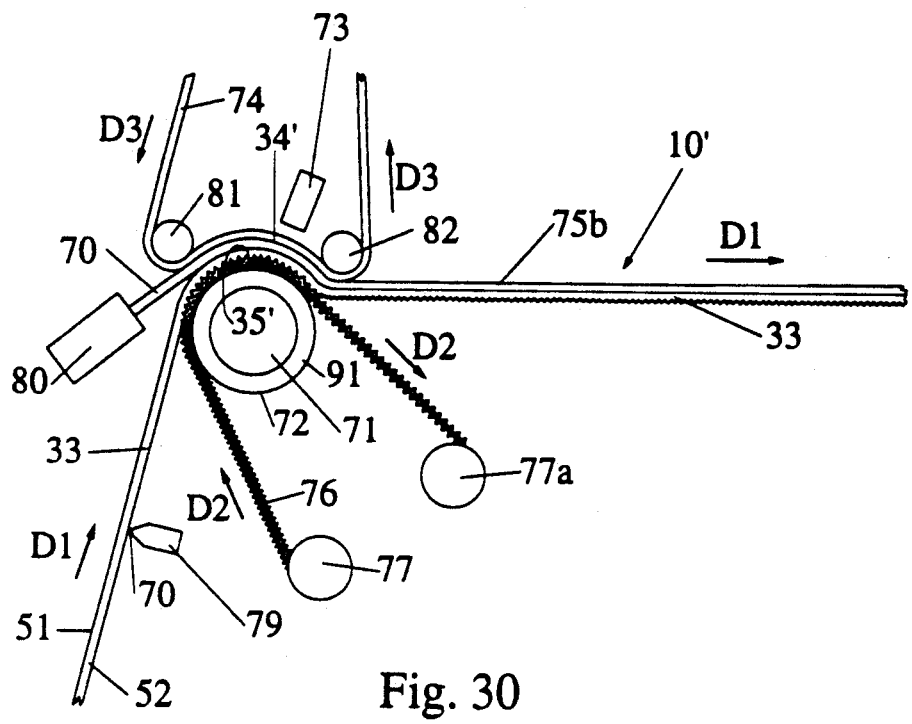
FIG. 30 is a schematic representation of another alternative of the belt casting process of the present invention which employs a smooth casting drum and a textured barrier film as the casting surface.

Optionally, and preferably, the basic ways of providing the forming unit 71 with a textured working surface 72 set forth above additionally include a step of interposing a barrier film (or backing film) 76 between the reinforcing structure 33 and the working surface 72 of the forming unit during the casting process so that the barrier film 76 protects the forming unit 71 (or the element, as the case may be) from becoming contaminated with resin. In a most preferred embodiment of the process of the present invention, the textured working surface is provided by an element as described in alternative (2) above, and the same element also serves as a barrier film which protects the forming unit from becoming contaminated with resin (FIGS. 30 and 31). The characteristics of the forming unit 71 and the components associated with the forming unit 71 are examined in greater detail below.

The forming unit 71 shown in FIG. 25 has working surface which is designated 72. In FIG. 25, the forming unit 71 appears as a circular element which is preferably a drum. The diameter of the drum and its length are selected for convenience. Its diameter should be great enough so that the barrier film 76 and the reinforcing structure 33 are not unduly curved during the process. It must also be large enough in diameter so there is sufficient distance of travel about its surface so that the necessary steps can be accomplished as the drum is rotating. The length of the drum is selected according to the width of the papermaking belt 10 being constructed. The forming unit 71 is rotated by a conventional drive means which is not illustrated.

Figure 27:
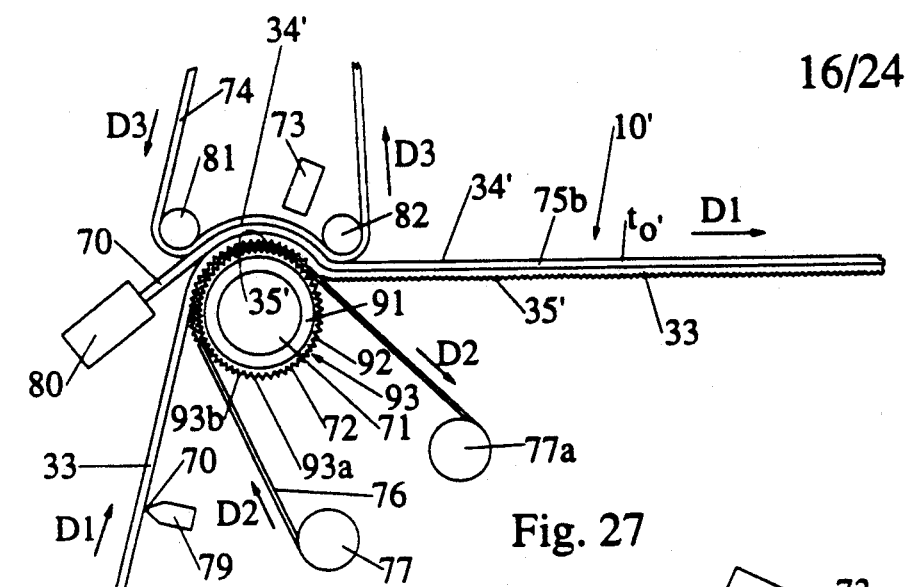
FIG. 27 is an enlarged schematic representation of an alternative forming unit used in the process of making the papermaking belt of the present invention which comprises a textured casting surface and a conformable barrier film.

FIG. 27 is an enlarged schematic view of one alternative version of the casting process shown in FIG. 25. As shown in FIG. 27, the drum is provided with a textured working surface 72 by a textured element, such as textured cover 92. FIG. 27 also first illustrates that in the preferred embodiment of the present process, a hard rubber cover 91, preferably approximately one inch (2.54 cm) thick, is placed over the forming unit 71. The textured cover 92 has been slipped over the hard rubber cover 91. The textured cover 92 has a textured surface 92a and a forming unit-contacting surface 92b. The texture on the surface of the textured cover 92 has been generally designated by reference numeral 93 in the drawings.

It is to be understood that utilizing a hard rubber cover and placing a textured cover over the rubber cover 91 to provide the forming unit 71 with a textured working surface 72 is merely one preferred embodiment of the process of the present invention. It is also possible to carry out the process of the present invention by eliminating the hard rubber cover 91, the separate textured cover 92, or both. That is, provided that the outermost surface of the remaining element (or of the combination of elements) is textured. It should be understood that all of the various combinations of these elements, and the equivalents thereof, are within the scope of the present invention. However, in order to avoid presenting an undue multiplicity of relatively similar drawing figures, only the preferred embodiments of the present invention are shown. Nevertheless, several of the possible combinations can be described with reference to the figures shown. For example, if the hard rubber cover is eliminated, the hard rubber cover numbered 91 and the textured cover 92 would appear as one and the same element in the drawings. If the textured cover 92 is eliminated, the textured surface could be provided on the hard rubber cover 91. If this is the case, the above two elements, 91 and 92 will also appear as one and the same element in the drawings. In another alternative, the surface of the forming unit 71 could be provided with a texture, and both the hard rubber cover 91 and the separate textured cover could be 92 eliminated. In this case, all three elements shown in the drawings, 71, 91, and 92, will appear as the same element. Similarly, the barrier film 76 could be eliminated in which case it would not appear in the drawings.

The individual peaks and valleys which comprise the texture 93 on the textured cover 92 are represented as 93a and 93b, respectively. As used herein, the term "peaks" refers to those portions of the textured working surface 72 which, either alone or in conjunction with portions of the barrier film 76, are disposed inward of the plane defined by the machine-facing side of the reinforcing structure $P_{k2}$ when the reinforcing structure 33 is in place on the working surface 72 of the forming unit 71. As used herein, the term "valleys" refers to those portions of the textured working surface 72 which, either alone, or in conjunction with portions of the barrier film 76, are disposed outward of the plane defined by the machine-facing side of the reinforcing structure $P_{k2}$ when the reinforcing structure 33 is in place on the working surface 72 of the forming unit 71.

The texture on the working surface 72 can be of any type, dimensions, pattern, and can be created by an element or surface made from any suitable material. The only requirement is that the texture impart the desired amount of backside texture to the papermaking belt 10 of the present invention after the steps outlined below are performed. Suitable textured surfaces can have a texture created therein in intaglio or relief. The texture on the surface can be random, uniform, regular, or in same particular pattern.

Suitable textured surfaces can be formed in practically any material, including metals, rubber, or plastic surfaces. In addition, to materials which have a texture which has been formed in them, a textured surface can be provided by a material which has an inherent texture, such as a woven element (a portion of which is shown as 92' in FIG. 29), a net or screen, and the like. Alternatively, or additionally, strips of material, such as 92" in FIG. 29, (or pieces of material in other shapes) which have some finite thickness, and are spaced apart to provide a surface with areas of differing height could be used to create a textured surface. In this alternative case, the surfaces of the strips 92b themselves do not have to be textured. The textured surface will be provided by the relative differences in height between those surfaces covered with strips, and those without strips. Basically, any material which provides a texture will be suitable, provided that it imparts the correct amount of backside texturing to the papermaking belt of the present invention when employed as a casting surface. It has been found to be preferable to use surfaces which have a relatively minute texture so a certain amount of texturing will be imparted to generally all of the parts of the backside network 35a of the finished belt.

Preferably, the forming unit 71 is covered by a barrier film 76 which prevents the working surface 72 from being contaminated with resin. The barrier film 76 also facilitates the removal of the partially completed papermaking belt 10' from the forming unit 71. Generally, when the textured surface is provided by one of the components other than the barrier film, the barrier film 76 can be any flexible, smooth, planar material which will conform to the texture on the working surface 72 of the forming unit 71. That is, the barrier film 76 should be flexible enough that it is capable of conforming to the character of the surface of the forming unit 71 so that the exposed surface of the barrier film 76 will have texture in roughly the same places as the texture on the working surface 72 of the forming unit 71. The barrier film 76 can be made from polypropylene, polyethylene, or polyester sheeting. Preferably, the barrier film is made from polypropylene and is from about 0.01 to about 0.1 millimeter (mm) thick. Preferably, the barrier film 76 also either absorbs light of the activating wavelength, or is sufficiently transparent to transmit such light to the working surface 72 of the forming unit 71, and the working surface 72 absorbs the light. The barrier film 76 is also typically chemically treated to prevent the resin from adhering to its surface and also to ensure that the resin spreads evenly across its surface. Preferably, this chemical treatment is a corona treatment. The corona treatment used in the preparation of the barrier film 76 involves apply an electrical discharge to the barrier film 76 prior to its installation in the apparatus shown in FIG. 25.

As shown in FIG. 25, the barrier film 76 is introduced into the system from the barrier film supply roll 77 by unwinding it and causing it to travel in the direction indicated by directional arrow D2. After unwinding, the barrier film 76 contacts the working surface 72 of forming unit 71 and is temporarily constrained against the working surface 72 by the means discussed below. The barrier film 76 travels with the forming unit 71 as the forming unit 71 rotates. The barrier film 76 is eventually separated from the working surface 72 of the forming unit 71 and travels to the barrier film take-up roll 78 to where it is rewound. In the embodiment of the process illustrated in FIG. 25, the barrier film 76 is designed for a single use after which it is discarded. In an alternative arrangement, the barrier film 76 can take the form of an endless belt which travels about a series of return rolls where it is cleaned and reused. In still other alternative arrangements, there could be two or more barrier films arranged as described above, and a textured element such as a textured cover could be placed between the barrier films.

Preferably, the forming unit 71 is also provided with a means for insuring that barrier film 76 is maintained in close contact with its working surface 72. The barrier film 76 can be, for example, adhesively secured to working surface 72. Alternatively, the barrier film 76 can be secured to the working surface 72 by a vacuum applied through a plurality of closely-spaced, small orifices distributed across the working surface 72 of the forming unit 71. Preferably, the barrier film 76 is held against the working surface 72 by a conventional tensioning means which is not shown in FIG. 25.

FIGS. 30 and 31 show an especially preferred means for providing the forming unit 71 with a textured working surface 72. In FIGS. 30 and 31, the element which provides the forming unit 71 with a textured working surface 72 also serves as a barrier film 76 which protects the forming unit 71 from becoming contaminated with resin. FIG. 30 is, therefore, an enlarged schematic view of another variation of the casting process shown in FIG. 25. FIG. 31 is a further enlarged view of the casting surface shown in FIG. 30. The alternative shown in FIGS. 30 and 31 is preferred because with such an arrangement, it is not necessary for there to be a textured surface on the drum which serves as the forming unit, nor is it necessary for there to be a textured surface on any of the other elements affixed to the forming unit (such as on a separate cover, or on the hard rubber cover). In this especially preferred alternative, it is also not necessary that the barrier film 76 be conformable since the barrier film 76 is the element which provides the textured surface. Preferably, the barrier film 76 will not be planar either in this alternative since it should be provided with a relatively permanent textured surface (that is, one that will maintain its texture under the conditions of the casting process). The other general characteristics of the textured barrier film, however, are the same as those for the textured surfaces described above.

Second Step

The second step of the process of the present invention is providing a reinforcing structure 33 having a paper-facing side 51, a machine-facing side 52 opposite the paper-facing side 51, and interstices 39, for incorporation into the papermaking belt.

As noted above, the reinforcing structure 33 is the element about which the papermaking belt 10 is constructed. Any reinforcing structure disclosed in the preceding section of this specification can be used. Preferably, the reinforcing structure 33 is the woven, multilayer fabric shown in FIGS. 6–11 which is characterized by warp yarns which are vertically stacked directly on top of one another.

Since the preferred papermaking belt 10 is in the form of an endless belt, the reinforcing structure 33 should also be an endless belt since the papermaking belt 10 is constructed around the reinforcing structure 33. As illustrated in FIG. 25, the reinforcing structure 33 which has been provided is arranged so that it travels in the direction indicated by directional arrow D1 about return roll 78a up, over, and around the forming unit 71 and around return rolls 78b and 78c. It is to be understood that in the apparatus used to make the papermaking belt of the present invention, there are conventional guide rolls, return rolls, drive means, support rolls and the like which are not shown in FIG. 25.

Third Step

The third step in the process of the present invention is bringing at least a portion of the machine-facing side 52 of the reinforcing structure 33 into contact with the working surface 72 of the forming unit 71 (or more particularly in the case of the embodiment illustrated, traveling the reinforcing structure 33 over the working surface 72 of the forming unit 71).

As noted above, preferably a barrier film 76 is used to keep the working surface 72 of the forming unit 71 free of resin 70. In this case, the third step will involve bringing at least a portion of the machine-facing side 52 of the reinforcing structure 33 into contact with the barrier film 76 in such a way that the barrier film 76 is interposed between the reinforcing structure 33 and the forming unit 72.

The exact manner in which the reinforcing structure 33 is positioned relative to either the working surface 72 of the forming unit 71 or the barrier film 76 depends upon the specific design desired for the papermaking belt 10. The reinforcing structure 33 can be placed in direct contacting relation with barrier film 76. Alternatively, the reinforcing structure 33 can be spaced some finite distance from barrier film 76. Any convenient means can be used to space the reinforcing structure 33 away from the barrier film 76. For instance the liquid photosensitive resin 70 could be applied to the machine-facing side 52 of the reinforcing structure 33 so that a portion of the coating lies between the reinforcing structure 33 and the working surface 72 of the forming unit 71. Preferably, however, at least a portion of the machine-facing side 52 of the reinforcing structure 33 (e.g., the machine side knuckles) is placed directly in contact with the working surface 72 of the forming unit 71 (or the barrier film 76 if one is used). The other portions of the reinforcing structure 33, such as raised portions 120, will be spaced away from the working surface 72 of the forming unit 71.

Fourth Step

The fourth step in the process is applying a coating of liquid photosensitive resin 70 to at least one side of the reinforcing structure 33.

Generally, the coating 70 is applied so that the coating 70 substantially fills the void areas 39a of the reinforcing structure 33 (the void areas are defined below). The coating 70 is also applied so that it forms a first surface 34' and a second surface 35'. The coating 70 is distributed so that at least a portion of the second surface 35' of the coating 70 is positioned adjacent the working surface 72 of the forming unit 71. The coating 70 is distributed so that the paper-facing side 51 of the reinforcing structure 33 is positioned between the first and second surfaces 34' and 35' of the coating 70. The portion of the coating which is positioned between the first surface 34' of the coating and the paper-facing side 51 of the reinforcing structure 33 forms a resinous overburden $t_o'$. At least a portion of the coating 70 penetrates into the texture of the working surface 72 of the forming unit 71 (in the direction indicated by the arrows in FIGS. 28 and 31) so that areas of the second surface 35' of the coating 70 are defined by the textured surface.

For coating the reinforcing structure 33, suitable photosensitive resins can be readily selected from the many available commercially. Resins which can be used are materials, usually polymers, which cure or crosslink under the influence of radiation, usually ultraviolet (UV) light. References containing more information about liquid photosensitive resins include Green et al., "Photocross-linkable Resin Systems", J. Macro-Sci. Revs. Macro Chem. C21 (2), 187–273 (1981–82); Bayer, "A Review of Ultraviolet Curing Technology", Tappi Paper Synthetics Conf. Proc., Sep. 25–27, 1978, pp. 167–172; and Schmidle, "Ultraviolet Curable Flexible Coatings", J. of Coated Fabrics, 8, 10–20 (Jul., 1978). All the preceding three references are incorporated herein by reference. Especially preferred liquid photosensitive resins are included in the Merigraph series of resins made by Hercules Incorporated, Wilmington, Del. A most preferred resin is Merigraph resin EPD 1616.

In the preferred process of carrying out the present invention, antioxidants are added to the resin to protect the finished papermaking belt 10 from oxidation and increase the life of the papermaking belt. Any suitable antioxidants can be added to the resin. The preferred antioxidants are Cyanox 1790, which is available from American Cyanamid of Wayne, N.J. 07470, and Iraganox 1010, which is made by Ciba Geigy of Ardsley, N.Y. 10502. In the preferred process for making the papermaking belt 10 of the invention, both antioxidants are added to the resin. The antioxidants are added in the following respective amounts, Cyanox 1790 1/10 of 1%, and Iraganox 1010 8/10 of 1%. Both antioxidants are added so the papermaking belt 10 of the present invention is protected from several different species of oxidizing agents.

Any technique by which the liquid material can be applied to the reinforcing structure 33 is suitable for applying the coating 70. As shown in FIG. 25, in the preferred method of carrying out the present invention, the liquid photosensitive resin 70 is applied to the reinforcing structure 33 at two stages. The first stage occurs at the place indicated by extrusion header 79. The first stage is referred to as the "pre-fill" stage because it takes place before the portion of the reinforcing structure 33 being coated is brought into contact with the working surface 72 of the forming unit 71. At the first stage, a first coating of liquid photosensitive resin is applied to at least the machine-facing side 52 of the reinforcing structure 33 by the extrusion header 79 to at least partially fill the void areas 39a of the reinforcing structure 33. Preferably, the first coating substantially fills the void areas 39a of the reinforcing structure 33. The void areas are shown best in FIG. 22D. As used herein, the term "void areas" (or "void volume") refers to all of the open spaces of the reinforcing structure 33 which lie between the plane defined by the paper-facing side of the reinforcing structure $P_{k1}$ and the plane defined by the machine-facing side of the reinforcing structure $P_{k2}$ (that is, those spaces between the two planes not occupied by the reinforcing component 40). The void areas 39a thus comprise the interstices 39 and any other open spaces which lie between the planes $P_{k1}$ and $P_{k2}$.

The application of resin 70 by the extrusion header 79 is employed in conjunction with the application of a second coating of liquid photosensitive resin 70 at a second stage by a nozzle 80 located adjacent to the place where the mask 74 is introduced into the system. The nozzle 80 applies the second coating of liquid photosensitive resin 70 to the paper-facing side 51 of the reinforcing structure 33. It is necessary that liquid photosensitive resin 70 be evenly applied across the width of reinforcing structure 33 and that the requisite quantity of material be worked through interstices 39 to substantially fill the void areas 39a of the reinforcing structure 33. The second coating is applied so that the first coating together with the second coating forms a single coating, coating 70, which has the first surface 34' and the second surface 35' described above and is distributed as described above. Thus, the single coating 70 is distributed so that: at least a portion of the second surface 35' of the coating is positioned adjacent the working surface 72 of the forming unit 71; the paper-facing side 51 of the reinforcing structure 33 is positioned between the first and second surfaces 34' and 35' of the coating 70; the portion of the coating which is positioned between the first surface 34' and the paper-facing side 51 of the reinforcing structure 33 forms a resinous overburden $t_o'$; and at least a portion of the coating penetrates into the texture of the working surface 72 of the forming unit 71 so that areas of the second surface 35' of the coating are defined by the textured surface.

In the drawings, it is thus seen that the stages at which the liquid photosensitive resin 70 is applied to the reinforcing structure 33 do not necessarily always occur in time sequence immediately after the third step set forth above. That is, the (first stage of the) coating step occurs before, not after, the machine-facing side 52 of the reinforcing structure 33 is brought into contact with the working surface 72 of the forming unit 71 if one is looking at a particular portion of the reinforcing structure 33 which is traveling around the reinforcing structure return roll 78a toward the forming unit 71. On the other hand, if one is looking at the overall process of assembling the apparatus shown in FIG. 25, it is apparent that at least a portion of the endless belt which comprises the reinforcing structure 33 would generally be placed in contact with the working surface 72 of the forming unit 71 before any coating of the reinforcing structure 33 takes place. As described herein, however, the process is generally examined from the former perspective.

In the embodiment shown in the drawings, the second stage of applying the photosensitive resin (or "post-fill stage") occurs after the place where the reinforcing structure 33 first comes in contact with the forming unit 71 when it is traveling around the reinforcing structure return rollers. It is to be understood that these two events (that is, applying the coating and bringing the reinforcing structure 33 into contact with the working surface 72 of the forming unit 71) could instead occur simultaneously, or that the photosensitive resin could be applied to the top surface (that is, the paper-facing side 51) of the reinforcing structure before the point where the reinforcing structure 33 is first placed in contact with the forming unit 71. The process of the present invention is intended to include all possible arrangements and sequences of the basic steps described herein. Preferably, however, the coating of the reinforcing structure 33 takes place in the order shown in the drawings.

Figure 28:
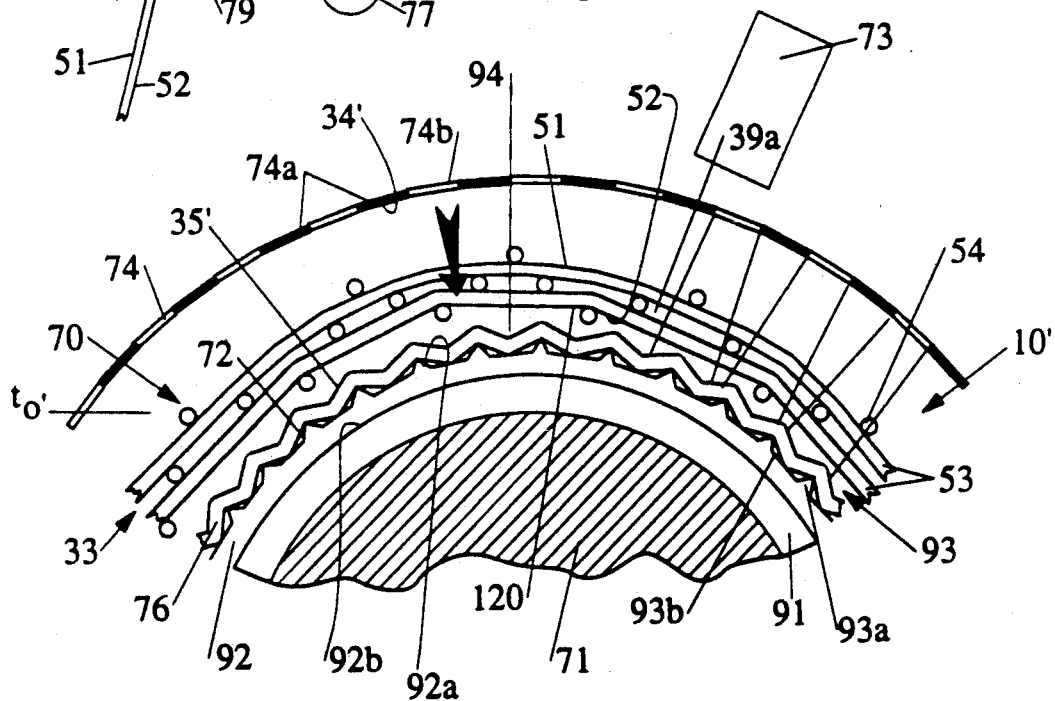
FIG. 28 is a schematic representation of the forming unit in FIG. 27 which has been further enlarged to show in detail the manner in which the backside texturing is formed during the casting process.
Figure 29:
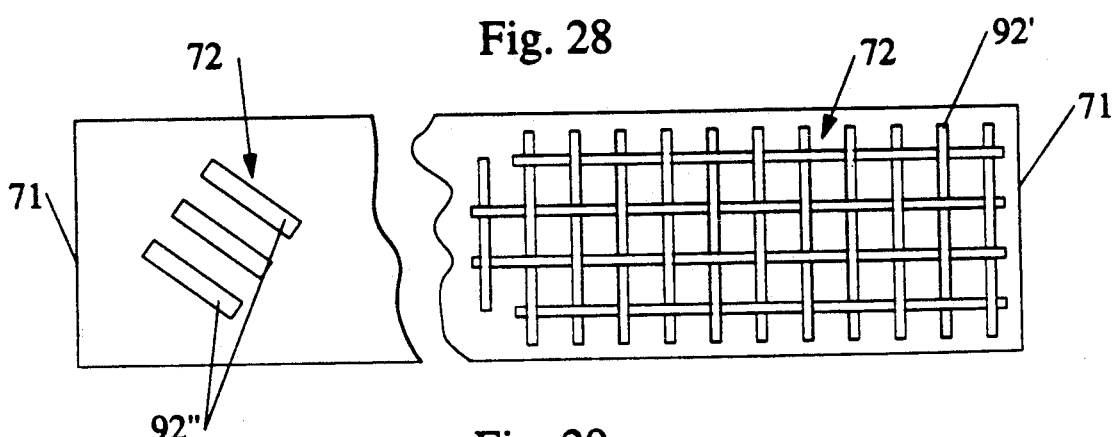
FIG. 29 is a schematic front view of two alternative embodiments of the casting drum shown in FIG. 27, in which the textured casting surface is alternatively provided by either placing strips of material, or a woven fabric (only a portion of which is shown) on top of the casting drum.

As shown in FIG. 28, the resin (principally from the backside coating process) is forced by the resin which is applied on the top surface of the reinforcing structure 33 in the post-fill stage into the valleys, or depressions 93b, in the textured surface at the points designated 94. This resin displaces the air lying in these valleys or depressions. When the steps described below are performed, the papermaking belt will have a texture on the backside which is roughly the mirror image of the texture on the casting surface.

Fifth Step

The fifth step in the process of this invention is controlling the thickness of the overburden $t_o'$ of the resin coating 70 to a preselected value. In the preferred embodiment of the belt making apparatus shown in the drawings, this step takes place at approximately the same time, i.e., simultaneously, with the second stage of applying a coating of liquid photosensitive resin to the reinforcing structure 33.

The preselected value of the thickness of the overburden corresponds to the thickness desired for the papermaking belt 10. This thickness, also naturally, follows from the expected use of the papermaking belt. When the papermaking belt 10 is to be used in the papermaking process described hereinafter, it is preferred that the thickness, t, of the papermaking belt 10 be from about 0.01 mm to about 3.0 mm. Other applications, of course, can require thicker papermaking belts which can be 3 centimeters thick or thicker.

Any suitable means for controlling the thickness can be used. The means used for controlling the thickness of the overburden illustrated in FIG. 25 is the use of nip roll 81, which also serves as a mask guide roll. The clearance between the nip roll 81 and the forming unit 71 can be controlled mechanically by any conventional means which are not shown. The nip roll 81, in conjunction with the mask 74 and the mask guide roll 82, tends to smooth the surface of liquid photosensitive resin 70 and to control its thickness.

Sixth Step

The sixth step in the process of this invention can be considered as either a single step or as two separate steps which comprise: (1) providing a mask 74 having opaque 74a and transparent regions 74b in which the opaque regions 74a together with the transparent regions 74b define a preselected pattern in the mask; and (2) positioning the mask 74 between the coating of liquid photosensitive resin 70 and an actinic light source 73 so that the mask 74 is in contacting relation with the first surface 34' of the coating of liquid photosensitive resin 70. The mask 74 can be positioned so that it is positioned a finite distance away from the first surface 34' of the coating 70. Preferably, however, for the reasons described below, it is in contact with the first surface 34' of the coating 70.

The purpose of the mask 74 is to protect or shield certain areas of the liquid photosensitive resin 70 from exposure to light from the actinic light source. Naturally, if certain areas are shielded, it follows that certain areas are not shielded and that liquid photosensitive resin 70 in those unshielded areas will be exposed later to activating light and will be cured. After the steps described herein are performed, the shielded regions will normally comprise the preselected pattern formed by the conduits 36 in the hardened resin framework 32.

The mask 74 can be made from any suitable material which can be provided with opaque regions 74a and transparent regions 74b. A material in the nature of a flexible photographic film is suitable for use as a mask 74. The flexible film can be polyester, polyethylene, or cellulosic or any other suitable material. The opaque regions 74a should be opaque to light which will cure the photosensitive liquid resin. For the preferred liquid photosensitive resin used herein, the opaque regions 74a should be opaque to light having a wavelength of between about 200 and about 400 nanometers. The opaque regions 74a can be applied to mask 74 by any convenient means such as by a blue printing (or ozalid processes), or by photographic or gravure processes, flexographic processes, or rotary screen printing processes. Preferably, the opaque regions 74b are applied to the mask by a blueprinting (on ozalid) process.

The mask 74 can be an endless loop (the details of which are conventional, and are, therefore, not shown) or it can be supplied from one supply roll transverse through the system to a takeup roll, neither of which is shown in the illustration since they are also conventional. The mask 74 travels in the direction indicated by directional arrow D3, turns under nip roll 81 where it is brought into contact with the surface of liquid photosensitive resin 70, and then travels to mask guide roll 82 in the vicinity of which it is removed from contact with the resin 70. In this particular embodiment, the control of the thickness of the resin 70 and the positioning of the mask 74 occur simultaneously.

Seventh Step

The seventh step of the process of this invention comprises curing the unshielded portions of the coating of liquid photosensitive resin in those regions left unshielded by the transparent regions 74b of the mask 74 and leaving the shielded portions uncured by exposing the coating of liquid photosensitive resin 70 to light of an activating wavelength through the mask 74 to form a partially-formed composite belt 10'.

In the embodiment illustrated in FIG. 25, the barrier film 76, the reinforcing structure 33, the liquid photosensitive resin 70, and the mask 74 all form a unit which travels together from nip roll 81 to the vicinity of mask guide roll 82. Intermediate the nip roll 81 and the mask guide roll 82 and positioned at a location where the barrier film 76 and the reinforcing structure 33 are still adjacent the forming unit 71, the liquid photosensitive resin 70 is exposed to light of an activating wavelength which is supplied by an exposure lamp 73.

The exposure lamp 73, in general, is selected to provide illumination primarily within the wavelength which causes curing of the liquid photosensitive resin 70. That wavelength is a characteristic of the liquid photosensitive resin 70. Any suitable source of illumination, such as mercury arc, pulsed xenon, electrodeless, and fluorescent lamps, can be used. As described above, when the liquid photosensitive resin 70 is exposed to light of the appropriate wavelength, curing is induced in the exposed portions of the resin 70. Curing is generally manifested by a solidification of the resin in the exposed areas. Conversely, the unexposed regions remain fluid.

In addition to inducing the curing of the photosensitive liquid resin 70 in those areas which are unshielded by the transparent regions 74b of the mask 74, as will be seen in conjunction with the description of the figures which follow, in this step, exposing the coating of photosensitive resin 70 to light having an activating wavelength also induces the curing of those portions of the liquid photosensitive resin which penetrated into the surface texture of the working surface 72 of the forming unit 71 and which are unshielded by the transparent regions 74b of the mask 74. These portions will then be cured into a shape defined by the surface texture provided by the working surface of the forming unit. These portions cured into these shapes will comprise the passageways and surface texture irregularities in the backside network 35a of the second surface 35 of the resinous framework 32.

The intensity of the illumination and its duration depend upon the degree of curing required in the exposed areas. The absolute values of the exposure intensity and time depend upon the chemical nature of the resin, its photo characteristics, the thickness of the resin coating, and the pattern selected. For the preferred resin, Merigraph resin EPD 1616, this amount ranges from approximately 100 to approximately 1,000 millijoules/cm$^2$, with the preferred range being between approximately 300 and approximately 800 millijoules/cm$^2$, and the most preferred range being between approximately 500 and approximately 800 millijoules/cm$^2$.

The intensity of the exposure and the angle of incidence of the light can have an important effect on the presence or absence of taper in the walls 44 of the conduits 36. In addition to having an effect on the tapering of the walls 44 of the conduits 36, the intensity of the exposure and the angle of incidence of the light will affect the permeability of the hardened framework 32 to air. This permeability to air ("air permeability") is of importance to the use of the papermaking belt of the present invention in blow-through drying papermaking processes. It is apparent that if there is a high degree of collimation of the light of the activating wavelength, the walls 44 of the conduits 36 will be less tapered. Less tapered (or more nearly vertical) conduit walls will provide the papermaking belt with a higher air permeability than inwardly tapered walls (for a given first surface knuckle area) because the total area of the papermaking belt through which the air can flow is greater when the walls 44 of the conduits 36 are not tapered inwardly.

In the preferred embodiment of the present invention, the angle of incidence of the light is collimated to better cure the photosensitive resin in the desired areas, and to obtain the desired angle of taper in the walls 44 of the finished papermaking belt. Other means of controlling the direction and intensity of the curing radiation, include means which employ refractive devices (i.e., lenses), and reflective devices (i.e., mirrors). The preferred embodiment of the present invention employs a subtractive collimator (i.e., an angular distribution filter or a collimator which filters or blocks UV light rays in directions other than those desired). Any suitable device can be used as a subtractive collimator. A dark colored, preferably black, metal device formed in the shape of a series of channels through which light directed in the desired direction may pass is preferred. In the preferred embodiment of the present invention, the collimator is of such dimensions that it transmits light so the resin network when cured has a projected surface area of 35% on the topside of the papermaking belt, and 65% on the backside.

Eighth Step

The eighth step in the process in the present invention is removing substantially all of the uncured liquid photosensitive resin from the partially-formed composite belt 10' to leave a hardened resin framework 32 around at least a portion of the reinforcing structure 33.

In this step, the resin which has been shielded from exposure to light is removed from the partially-formed composite belt 10' in the manner described below to provide the framework 32 with a plurality of conduits 36 in those regions which were shielded from the light rays by the opaque regions 74a of the mask 74 and passageways 37 that provide surface texture irregularities 38 in the backside network 35a of the framework 32 corresponding to the places where the second surface 35' of the coating penetrated into the texture of the working surface 72 of the forming unit 71.

In the embodiment shown in FIG. 25, at a point in the vicinity of the mask guide roll 82, the mask 74 and the barrier film 76 are physically separated from the partially-formed composite belt 10' which comprises the reinforcing structure 33 and the now partly-cured resin 70, along with a certain amount of uncured resin. The composite of the reinforcing structure 33 and the partly cured resin 70 travels to the vicinity of the first resin removal shoe 83a. A vacuum is applied to one side of the composite belt 10' at the first resin removal shoe 83a so that a substantial quantity of the uncured liquid photosensitive resin is removed from the composite belt 10'.

As the composite belt 10' travels farther, it is brought into the vicinity of resin wash shower 84 and resin wash station drain 85 at which point the composite belt 10' is thoroughly washed with water or other suitable liquid to remove essentially all of the remaining uncured liquid photosensitive resin which is discharged from the system through resin wash station drain 85. At the second resin removal shoe 83b, any residual wash liquid and uncured liquid resin is removed from the composite belt 10' by the application of vacuum. At this point, the composite belt 10' now comprises the reinforcing structure 33 and the associated hardened resin framework 32 and represents the papermaking belt 10 which is the product of this process.

Optionally, and preferably, as shown in FIG. 25, there can be a second exposure of the resin to activating light (hereinafter sometimes referred to as the "post-cure step") so as to complete the curing of the resin and to increase the hardness and durability of the cured resin framework 32. The post-cure step takes place at the place designated by the reference to the following FIG. 26. FIG. 26 is an enlarged schematic representation of this post-cure step.

As shown in FIG. 26, the composite belt 10' is subjected to a second exposure of light of the activating wavelength by post cure UV light source 73a. This second exposure, however, takes place when the composite belt 10' is submerged under water 86. In order to submerge the composite belt 10', as shown in FIG. 26, the composite belt 10' is diverted somewhat from the path it had been traveling along by rollers 87a, 87b, 87c, and 87d into the water 86 provided by water bath 88. It has been found that it is important that the composite belt 10' be submerged for this post-cure exposure; otherwise, the finished belt 10 will be inordinately sticky or tacky. In addition, it has also been found necessary to add Sodium Sulfite (Na$_2$SO$_3$) to remove as much of the dissolved Oxygen from the water as possible to aid in the complete polymerization of the resin. Sodium Sulfite is added in the approximate amount of 2 percent or less by weight of the water in the post cure bath 88.

In addition, FIG. 26 shows that a mirror 89 is placed on the bottom surface 90 of the water bath 88 in this post-cure process. The mirror 89 serves to reflect the UV light which reaches the mirror 89 back onto the underside or backside 12 of the composite belt 10'. This step is particularly important in fully curing the portion of the resin which forms the passageways and irregularities in the backside network 35a of the second surface 35 of the framework 32 of the finished papermaking belt 10. As shown in the preceding figure, all of the UV light has been supplied from sources located above the top side of the composite belt 10'. The amount of UV light which is supplied during this post-cure process, again is dependent upon the particular resin involved, as well as the depth and pattern of curing desired. For the preferred resin, Merigraph resin EPD 1616, the dosages specified above for the pre-cure step are also suitable for the post-cure step. It is not necessary, however, to collimate the light in the post-cure stage because the conduits or channels have already been suitably formed in the framework.

The process continues until such time as the entire length of reinforcing structure 33 has been treated and converted into the papermaking belt 10.

Should it be desired to construct a papermaking belt having different patterns superimposed one on another or having patterns of different thicknesses, the reinforcing structure can be subjected to multiple passes through the process. Multiple passes through the process of this invention can also be used to construct papermaking belts of relatively great thickness.

3. The Papermaking Process

The papermaking process which utilizes the improved papermaking belt 10 of the present invention is described below, although it is contemplated that other processes may also be used to make the paper products described herein. By way of background, a process for making paper which does not include the improvements of the present process or utilize the improved papermaking belt 10 of the present invention is set out in detail in U.S. Pat. No. 4,529,480, entitled "Tissue Paper" which issued to Paul D. Trokhan on Jul. 16, 1985. The Trokhan patent is incorporated by reference herein to the extent it is consistent with this description. The improvements to the process described in the Trokhan patent are provided below.

The overall papermaking process which uses the papermaking belt of the present invention comprises a number of steps or operations which occur in the general time sequence as noted below. In the following paragraphs, each step will be discussed in detail in reference to FIG. 1. It is to be understood, however, that the steps described below are intended to assist the reader in understanding the process of the present invention, and that the invention is not limited to processes with only a certain number or arrangement of steps. In this regard, it is noted that it is possible to combine the following steps so that they are performed concurrently. Likewise, it is possible to separate the following steps into two or more steps without departing from the scope of this invention.

FIG. 1 is a simplified, schematic representation of one embodiment of a continuous papermaking machine useful in the practice of the papermaking process of the present invention. The papermaking belt 10 of the present invention is shown in the form of an endless belt. The particular papermaking machine illustrated in FIG. 1 is a Fourdrinier wire machine which is generally similar in configuration and in the arrangement of its belts to the papermaking machine disclosed in U.S. Pat. No. 3,301,746, issued to Sanford and Sisson on Jan. 31, 1967, which is incorporated by reference herein.

It is also contemplated that the twin wire papermaking machine illustrated in FIG. 1 of U.S. Pat. No. 4,102,737, issued to Morton on Jul. 25, 1978, which patent is incorporated by reference herein, could be used to practice the present invention. If the twin wire papermaking machine disclosed in U.S. Pat. No. 4,102,737, Morton, is used to practice the present invention, the papermaking belt of the present invention would replace the drying/imprinting fabric represented by reference numeral 4 in the drawing figures of the Morton patent. All remaining references to drawing figures, however, will be to the drawings which accompany the present specification.

First Step

The first step in the practice of the papermaking process of the present invention is the providing of an aqueous dispersion of papermaking fibers 14.

The equipment for preparing the aqueous dispersion of papermaking fibers 14 is well-known and is therefore not shown in FIG. 1. The aqueous dispersion of papermaking fibers 14 is provided to a headbox 13. A single headbox is shown in FIG. 1. However, it is to be understood that there may be multiple headboxes in alternative arrangements of the papermaking process of the present invention. The headbox(es) and the equipment for preparing the aqueous dispersion of papermaking fibers are preferably of the type disclosed in U.S. Pat. No. 3,994,771, issued to Morgan and Rich on Nov. 30, 1976, which is incorporated by reference herein. The preparation of the aqueous dispersion and the characteristics of the aqueous dispersion are described in greater detail in U.S. Pat. No. 4,529,480 issued to Trokhan on Jul. 16, 1985, which is incorporated herein by reference.

The aqueous dispersion of papermaking fibers 14 supplied by the headbox 13 is delivered to a forming belt, such as the Fourdrinier wire 15 for carrying out the second step of the papermaking process. The Fourdrinier wire 15 is supported by a breast roll 16 and a plurality of return rolls designated 17 and 17a. The Fourdrinier wire 15 is propelled in the direction indicated by directional arrow A by a conventional drive means which is not shown in FIG. 1. There may also be associated with the papermaking machine shown in FIG. 1 optional auxiliary units and devices which are commonly associated with papermaking machines and with Fourdrinier wires, including forming boards, hydrofoils, vacuum boxes, tension rolls, support rolls, wire cleaning showers, and the like, which are conventional, and are, therefore, also not shown in FIG. 1.

Second Step

The second step in the papermaking process is forming an embryonic web 18 of papermaking fibers on a foraminous surface from the aqueous dispersion 14 supplied in the first step. The Fourdrinier wire 15 serves as the foraminous surface in the papermaking machine shown in FIG. 1. As used herein, the "embryonic web" is the web of fibers which is subjected to rearrangement on the papermaking belt 10 of the present invention during the course of the papermaking process.

The characteristics of the embryonic web 18 and the various possible techniques for forming the embryonic web 18 are described in U.S. Pat. No. 4,529,480 which is incorporated by reference herein. In the case of the process shown in FIG. 1, the embryonic web 18 is formed from the aqueous dispersion of papermaking fibers 14 between breast roll 16 and return roll 17 by depositing the aqueous dispersion 14 onto the Fourdrinier wire 15, and removing a portion of the aqueous dispersing medium. Conventional vacuum boxes, forming boards, hydrofoils, and the like which are not shown in FIG. 1 are useful in effecting the removal of water from the aqueous dispersion 14.

After the embryonic web 18 is formed, it travels with Fourdrinier wire 15 about the return roll 17 and is brought into the proximity of a second papermaking belt, the papermaking belt 10 of the present invention.

Third Step

The third step in the papermaking process is contacting (or associating) the embryonic web 18 with the paper-contacting side 11 of the papermaking belt 10 of the present invention.

The purpose of this third step is to bring the embryonic web 18 into contact with the paper-contacting side of the papermaking belt 10 on which the embryonic web 18, and the individual fibers therein, will be subsequently deflected, rearranged, and further dewatered. The embryonic web 18 is brought into contact with the papermaking belt 10 of the present invention by the Fourdrinier wire 15. The Fourdrinier wire 15 brings the embryonic web 18 into contact with, and transfers the embryonic web 18 to the papermaking belt 10 of the present invention in the vicinity of vacuum pickup shoe 24a.

In the embodiment illustrated in FIG. 1, the papermaking belt 10 of the present invention travels in the direction indicated by directional arrow B. The papermaking belt 10 passes around the papermaking belt return rolls 19a and 19b, impression nip roll 20, papermaking belt return rolls 19c, 19d, 19e and 19f, and emulsion distributing roll 21 (which distributes an emulsion 22 onto the papermaking belt 10 from an emulsion bath 23). The loop that the papermaking belt 10 of the present invention travels around also includes a means for applying a fluid pressure differential to the paper web, which in the preferred embodiment of the present invention, comprises vacuum pickup shoe 24a and a vacuum box such as multislot vacuum box 24. Also on the loop is a predryer 26. In addition, in between papermaking belt return rolls 19c and 19d, and also in between papermaking belt return rolls 19d and 19e, are water showers 102 and 102a, respectively. The purpose of the water showers 102 and 102a is to clean the papermaking belt 10 of any paper fibers, adhesives, and the like, which remain attached to the section of the papermaking belt 10 which has traveled through the final step in the papermaking process. Associated with the papermaking belt 10 of the present invention, and also not shown in FIG. 1 are various additional support rolls, return rolls, cleaning means, drive means, and the like commonly used in papermaking machines and all well known to those skilled in the art.

The function of the emulsion distributing roll 21 and emulsion bath 23 will be discussed in conjunction with the third step for convenience. The emulsion distributing roll 21 and the emulsion bath 23 continuously apply an effective amount of a chemical compound (or compounds) to the belt 10 during the papermaking process. The chemical compounds can be applied to the papermaking belt 10 at any point during the papermaking process, although it is preferred the chemicals be added to the paper-contacting side 11 of the belt 10 at a particular point in the belt's revolution when the belt 10 is not carrying a paper web. This normally will be after (as will be described more fully herein) the predried paper web 27 has been transferred off the papermaking belt 10 to the surface of the Yankee dryer drum 28 and the belt 10 is returning to contact another embryonic web 18 (i.e., in the vicinity of emulsion distribution roll 21).

The chemical compound or compounds are preferably applied to the papermaking belt 10 in the form of an emulsion, such as by emulsion 22 shown in FIG. 1. These compound(s) serve the dual purpose of: (1) acting as a release agent, or release emulsion (a coating on the papermaking belt 10 of the present invention so the paper releases from and does not stick to the belt after the steps of the papermaking process have been performed on the paper web); and, (2) treating the belt to extend its useful life by reducing the tendency of the resinous framework 32 to degrade due to oxidation (that is, the emulsion 22 also serves as an antioxidant). Preferably, the chemical compound(s) are applied uniformly to the paper-contacting side 11 of the belt 10 so substantially the entire paper-contacting side 11 benefits from the chemical treatment.

The preferred emulsion 22 is primarily comprised of five compounds, although it is contemplated that other or additional suitable compounds could be used. The preferred composition contains water, a high-speed turbine oil known as "Regal Oil", Dimethyl distearyl ammoniumchloride, cetyl alcohol, and an antioxidant.

As used herein, the term "Regal Oil" refers to the compound which is comprised of approximately 87% saturated hydrocarbons and approximately 12.6% aromatic hydrocarbons with traces of additives, which is manufactured as product number R&O 68 Code 702 by the Texaco Oil Company of Houston, Tx. The purpose of the Regal Oil in the composition described above is to provide the emulsion with properties which allow it to act as a release agent.

Dimethyl distearyl ammoniumchloride is sold under the tradename ADOGEN TA 100 by the Sherex Chemical Company, Inc., of Rolling Meadows, Ill. Hereinafter, Dimethyl distearyl ammoniumchloride will be referred to as ADOGEN for convenience. ADOGEN is used in the emulsion as a surfactant to emulsify or stabilize the oil particles (of the Regal Oil) in the water. As referred to herein, the term "surfactant" refers to a surface active agent, one end of which is hydrophilic, and the other end of which is hydrophobic, which migrates to the interface between a hydrophilic substance and a hydrophobic substance to stabilize the two substances.

As used herein, "cetyl alcohol" refers to a $C_{16}$ linear fatty alcohol. Cetyl alcohol is manufactured by The Proctor & Gamble Company of Cincinnati, Ohio. Cetyl Alcohol, like ADOGEN is used as a surfactant in the emulsion utilized in the present invention.

As used herein, the term "antioxidant" refers to a compound, which when applied to the surface of an article, the surface of which is subject to oxidation, reduces the article's tendency to oxidize (i.e., combine with oxygen). In particular, in this specification, the term "antioxidant" refers to compounds which reduce the tendency of the cured resin network of the papermaking belt 10 of the present invention to oxidize. A preferred antioxidant is Cyanox 1790 which can be purchased from American Cyanamid of Wayne, N.J. 07470.

The relative percentages of the compounds as used in the emulsion, are set out in the following table:

| Component | Volume (gal.) | Weight (lbs.) |
| --- | --- | --- |
| Water | 518 | 4,320.0 |
| REGAL OIL | 55 | 421.8 |
| ADOGEN | N/A* | 24 |
| Cetyl Alcohol | N/A* | 16 |
| Cyanox 1790 | N/A* | 5.8 |

* N/A - Component is added in solid form

Fourth Step

The fourth step in the papermaking process involves applying a fluid pressure differential of a suitable fluid to the embryonic web 18 with a vacuum source to deflect at least a portion of the papermaking fibers in the embryonic web 18 into the conduits 36 of the papermaking belt 10 and to remove water from the embryonic web 18 through the conduits 36 to form an intermediate web 25 of papermaking fibers. The deflection also serves to rearrange the fibers in the embryonic web 18 into the desired structure.

The preferred method of applying a fluid pressure differential (or "differential fluid pressure"), as will also be more fully described herein, is by disposing the embryonic web 18 in such a way that the web is exposed to the vacuum through the conduits 36 by the application of vacuum from the backside 12 of the papermaking belt 10 of the present invention. In FIG. 1, this preferred method is illustrated by the use of vacuum pickup shoe 24a and the multislot vacuum box 24. Preferably, a vacuum pressure of between approximately 8 and 12 inches (20.32 cm and 30.48 cm) of mercury is applied at the vacuum pickup shoe 24a and a vacuum pressure of between approximately 15 and 20 inches (38.1 cm and 50.8 cm) of mercury is applied at the multislot vacuum box 24. In the preferred embodiment of the present process, therefore, the fluid pressure differential will typically be a negative pressure (i.e., less than atmospheric pressure), and the suitable fluid is air. Alternatively, or additionally, positive pressure in the form of air or steam pressure can be applied through Fourdrinier wire 15 to the embryonic web 18 in the vicinity of pickup shoe 24a or vacuum box 24. The means for applying such a positive pressure are conventional, and are, therefore, not shown in FIG. 1.

Figure 1B:
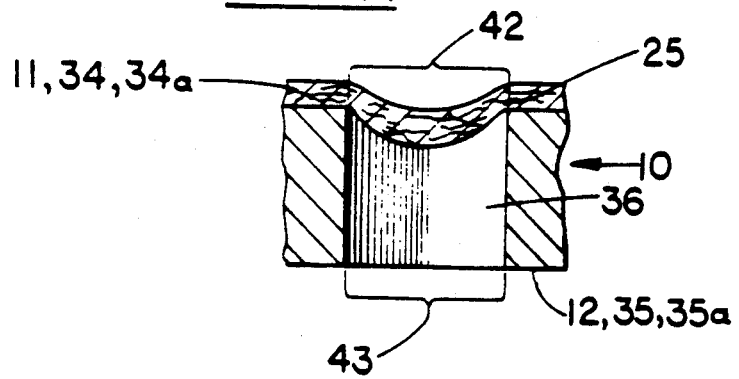
FIG. 1B is a simplified representation in cross-section of the portion of the embryonic web shown in FIG. 1A after the fibers of the embryonic web have been deflected into one of the conduits of the papermaking belt.

The deflection of the fibers into the conduits 36 is illustrated in FIGS. 1A and 1B. FIG. 1A is a simplified representation of a cross-section of a portion of a papermaking belt 10 and embryonic web 18 after the embryonic web 18 has been associated with the papermaking belt 10, but before the deflection of the fibers into conduits 36 occurs. As shown in FIG. 1A, the embryonic web 18 is still in contact with the Fourdrinier wire 15 (or more specifically, sandwiched between the Fourdrinier wire 15 and the papermaking belt 10 of the present invention). In FIG. 1A, only one conduit 36 is shown and the embryonic web 18 is shown associated with the paper side network surface 34a of the framework 32 papermaking belt 10.

The portion of the papermaking belt depicted in FIGS. 1A and 1B has been simplified by omitting the reinforcing structure which is generally part of the preferred embodiment of the papermaking belt of the present invention, and also by showing the walls 44 of the conduits 36 as straight vertical lines in cross-section, when in the preferred embodiment of the present invention as described above, the profile of the walls 44 of the conduits is somewhat more complex. In addition, the opening of conduit 36 in the first surface 34, first conduit opening 42, and its opening in second surface 35, second conduit opening 43 are shown essentially equal in size and shape when in the preferred embodiment of the present invention the openings of the conduits in the second surface 35 will be smaller than the openings of the conduits in the first surface 34 of the framework 32.

FIG. 1B, like FIG. 1A, is a simplified cross-sectional view of a portion of the papermaking belt 10. This view, however, illustrates the transformation of the embryonic web 18 into intermediate web 25 by the deflection of the fibers of the embryonic web 18 into the conduit 36 under the application of a fluid pressure differential. FIG. 1B shows that a substantial portion of the fibers in embryonic web 18 and, thus, embryonic web 18 itself, has been displaced into the conduit 36 below the paper side network surface 34a into conduit 36 to form the intermediate web 25. Rearrangement of the individual fibers in embryonic web 18 (the details of which are not shown) occurs during deflection.

FIG. 1B also shows that at the point when the fibers in the embryonic web 18 have been deflected into the conduit 36 and rearranged, the embryonic web 18 is no longer in contact with the Fourdrinier wire 15. As shown in FIG. 1, the web 18 becomes separated from the Fourdrinier wire 15 immediately after leaving the vicinity of the pickup shoe 24a.

Either at the time the fibers are deflected into the conduits 36 or after such deflection occurs, water is removed from the embryonic web 18 through the conduits 36. Water removal occurs under the action of the fluid pressure differential. It is important, however, that there be essentially no water removal from the embryonic web 18 prior to the deflection of the fibers into the conduits 36. As an aid in achieving this condition, at least those portions of the conduits 36 surrounded by the paper side network 34a, are generally isolated from one another. This isolation, or compartmentalization, of conduits 36 is of importance to insure that the force causing the deflection, such as an applied vacuum, is applied relatively suddenly and in a sufficient amount to cause deflection of the fibers. This is to be contrasted with the situation in which the conduits 36 are not isolated. In this latter situation, vacuum will encroach from adjacent conduits 36 which will result in a gradual application of the vacuum and the removal of water without the accompanying deflection of the fibers.

In the machine illustrated in FIG. 1, water removal initially occurs at the pickup shoe 24a and vacuum box 24. Since the conduits 36 are open through the thickness of a papermaking belt 10, water withdrawn from the embryonic web 18 passes through the conduits 36 and out of the system. Water removal continues until the consistency of the web associated with conduits 36 is increased to from about 20% to about 35%.

Fifth Step

The fifth step is traveling the papermaking belt 10 and the embryonic web 18 over the vacuum source described in the fourth step. Preferably, the fifth step will occur while the fourth step is taking place. The belt 10 carries the embryonic web 18 on its paper-contacting side 11 over the vacuum source. At least a portion of the textured backside 12 of the belt 10 is generally in contact with the surface of the vacuum source as the belt 10 travels over the vacuum source.

The step of traveling the papermaking belt 10 of the present invention over the vacuum source reduces the undesirable accumulation of paper fibers on the vacuum box lips. While not wishing to be bound by any particular theory, it is believed that one of the keys in achieving this reduction in the process of the present invention is controlling the relative suddenness of the deflection during the preceding step. The deflection of the fibers is controlled by using a papermaking belt which has a textured backside 12. The textured backside surface allows a certain amount of air to enter across the backside 12 of the papermaking belt 10 when the backside 12 is in contact with the surfaces of the pickup shoe 24a and the vacuum box 24. The backside network 35a of the belt 10 has passageways 37 which provide spaces through which at least some of the this air can enter. This is to be contrasted with the prior deflection member which was provided with bottom surface which was relatively planar. The planar surface tended to form a seal on the vacuum box used to deflect the fibers of the embryonic web, resulting in an extremely sudden application of vacuum pressure when the seal was broken. Thus, controlling the deflection of the fibers in the embryonic web 18 may be a step which inherently occurs in conjunction with the fifth step, or it may be considered to be a separate step.

It is also believed that these passageways 37, which provide surface texture irregularities 38 in the backside 12 of the papermaking belt 10 have a cleaning effect on the lips or surfaces of the vacuum dewatering equipment used in the papermaking process. This cleaning action tends to remove any undesirable accumulation of papermaking fibers on this vacuum equipment. This cleaning action is believed to occur when the vacuum source has at least one surface that the papermaking belt travels over during the deflection step. Thus, the cleaning of the surfaces of the vacuum dewatering equipment may be a step which inherently occurs in conjunction with the fifth step, or it may be considered to be a separate step. If considered as an additional step, this step would comprise contacting the surface of said vacuum source with the textured backside 12 of the belt 10 to clean off any papermaking fibers which have accumulated on the surface of said vacuum source.

Following the application of the vacuum pressure and the traveling of the papermaking belt 10 and the embryonic web 18 over the vacuum source, the embryonic web 18 is in a state in which it has been subjected to a fluid pressure differential and deflected but not fully dewatered, thus it is now referred to as the "intermediate web 25."

Sixth Step

The sixth step in the papermaking process is an optional step which comprises drying the intermediate web 25 to form a predried web of papermaking fibers. Any convenient means conventionally known in the papermaking art can be used to dry the intermediate web 25. For example, flow-through dryers, nonthermal, capillary dewatering devices, and Yankee dryers, alone and in combination, are satisfactory.

A preferred method of drying the intermediate web 25 is illustrated in FIG. 1. After leaving the vicinity of vacuum box 24, the intermediate web 25, which is associated with the papermaking belt 10, passes around the papermaking belt return roll 19a and travels in the direction indicated by directional arrow B. The intermediate web 25 then passes through optional predryer 26. This predryer 26 can be a conventional flow-through dryer (hot air dryer) well known to those skilled in the art.

The quantity of water removed in predryer 26 is controlled so that predried web 27 exiting the predryer 26 has a consistency of from about 30% to about 98%. Predried web 27, which is still associated with the papermaking belt 10, passes around papermaking belt return roll 19b and travels to the region of impression nip roll 20.

Seventh Step

The seventh step in the papermaking process is impressing the paper side network 34a of the papermaking belt 10 of the present invention into the predried web by interposing the predried web 27 between the papermaking belt 10 and an impression surface to form an imprinted web of papermaking fibers.

If the intermediate web 25 was not subjected to the optional sixth predrying step, this seventh step will be performed on the intermediate web 25.

The seventh step is carried out in the machine illustrated in FIG. 1 when the predried web 27 then passes through the nip formed between the impression nip roll 20 and the Yankee drier drum 28. As the predried web 27 passes through this nip, the network pattern formed by the paper side network 34a on the paper-contacting side 11 of the papermaking belt 10 is impressed into predried web 27 to form imprinted web 29.

Eighth Step

The eighth step in the papermaking process is drying the imprinted web 29. The imprinted web 29 separates from the papermaking belt 10 of the present invention after the paper side network 34a is impressed into the web to from imprinted web 29. As the imprinted web 29 separates from the papermaking belt 10 of the present invention, it is adhered to the surface of Yankee dryer drum 28 where it is dried to a consistency of at least about 95%.

The section of the belt 10 which has been carrying the web passes around papermaking belt 10 return rolls 19c, 19d, 19e, and 19f and through showers 102 and 102a located therebetween where it is cleaned. From the showers, the section of the belt moves on to the emulsion roll 21 where it receives another application of emulsion 22 prior to contacting another portion of the embryonic web 18.

Ninth Step

The ninth step in the papermaking process is the foreshortening of the dried web (imprinted web 29). This ninth step is an optional, but highly preferred, step.

As used herein, foreshortening refers to the reduction in length of a dry paper web which occurs when energy is applied to the dry web in such a way that the length of the web is reduced and the fibers in the web are rearranged with an accompanying disruption of fiber-fiber bonds. Foreshortening can be accomplished in any of several well-known ways. The most common, and preferred, method is creping.

In the creping operation, the dried web 29 is adhered to a surface and then removed from that surface with a doctor blade 30. As shown in FIG. 1, the surface to which the web is usually adhered also functions as a drying surface. Typically, this surface is the surface of a Yankee dryer drum 28 as shown in FIG. 1.

The adherence of the imprinted web 29 to the surface of Yankee dryer drum 28 is facilitated by the use of a creping adhesive. Typical creping adhesives can include any suitable glue, such as those based on polyvinyl alcohol. Specific examples of suitable adhesives are described in U.S. Pat. No. 3,926,716 issued to Bates on Dec. 16, 1975, incorporated by reference herein. The adhesive is applied either to predried web 27 immediately prior to its passage through the above described nip, or more preferably to the surface of Yankee dryer drum 28 prior to the point at which the web is pressed against the surface of Yankee dryer drum 28 by the impression nip roll 20. The particular means of glue application and the technique for applying the glue used in the practice of the present invention are conventional, and are, therefore, now shown in FIG. 1. Any technique for applying the creping adhesives known to those skilled in the art, such as spraying, can be used.

In general, only the nondeflected portions of the web 29 which have been associated with paper side network 34a on the paper-contacting side 11 of the papermaking belt 10 are directly adhered to the surface of Yankee dryer drum 28. The pattern of the paper side 34a network and its orientation relative to the doctor blade 30 will in major part dictate the extent and the character of the creping imparted to the web.

The physical characteristics of the paper web 31 which is made by the process of the present invention are described in the aforementioned U.S. Pat. No. 4,529,480 entitled "Tissue Paper", which issued to Trokhan on Jul. 16, 1985, and which is incorporated herein by reference. The network region and the plurality of domes in the paper web 31, however, will be formed into linear Idaho pattern" rather than in the hexagon pattern shown in the drawings of U.S. Pat. No. 4,529,480 due to the difference in the shape of conduits in the preferred embodiment of the papermaking belt 10 of the present invention.

The paper web 31, which is the product of this invention, can be optionally calendered and is either rewound with or without differential speed rewinding or is cut and stacked all by conventional means which are not illustrated in FIG. 1. The paper web 31 is then ready for use.

4. Test Methods

It has been found that belts with a certain amount of backside texture will achieve the desired goals of reducing the undesirable accumulation of paper fibers on the surfaces of the vacuum dewatering equipment and controlling the other problems associated with the fiber accumulation. The amount and character of backside texturing which must be present for the desired results to be obtained when using the papermaking belt 10 of the present invention is a quality of the belt which is referred to as the fluid passage capacity of the belt, or more particularly, of the textured backside surface 12 of the belt. As used herein, the term "fluid passage capacity" refers to a measurement of the air which travels (or "air leakage") across the backside 12 of the papermaking belt 10 under the conditions of the test described below which has been developed for this particular purpose.

The air leakage across the backside 12 of the papermaking belt 10 will hereinafter sometimes be referred to as the "X-Y" air leakage. The "X-Y" language is derived from the fact that if the papermaking belt 10 of the present invention were placed in a Cartesian coordinate system with the backside 12 of the papermaking belt 10 lying in the plane formed by the x and y axes, the air leakage which is of interest would be that which passes along the backside 12 surface of the belt 10 in any direction in the X-Y plane.

Figure 32:
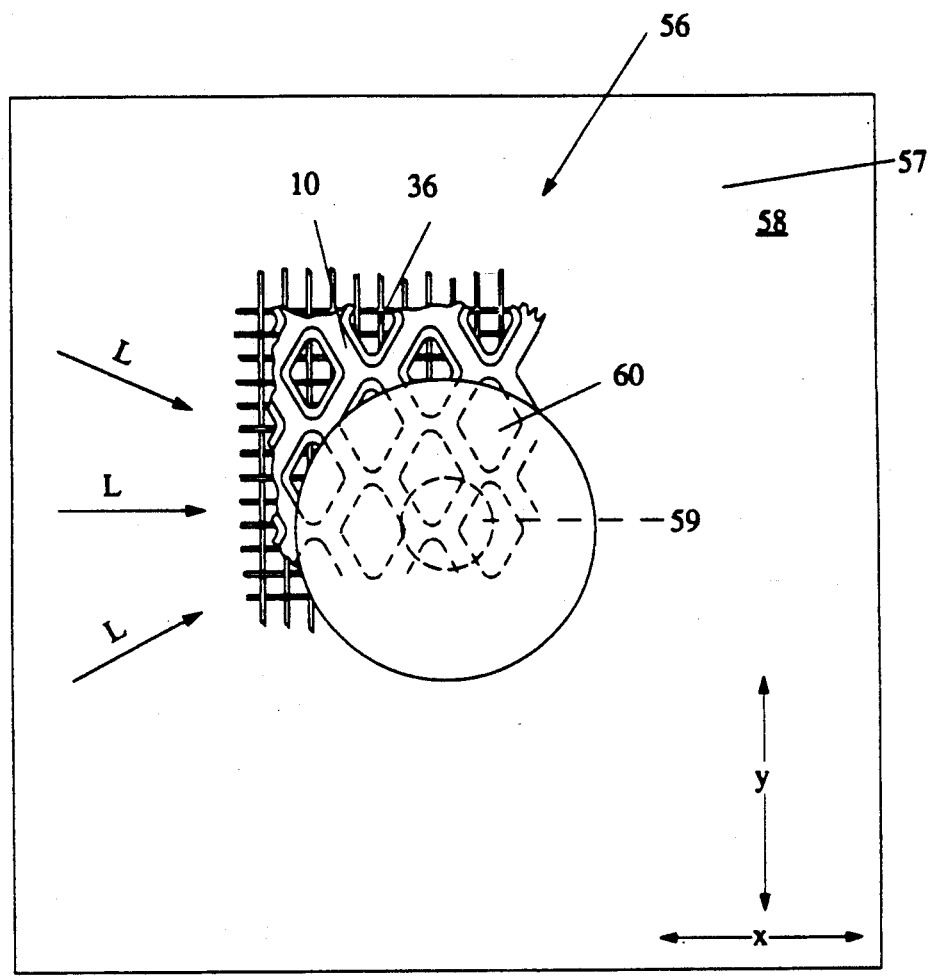
FIG. 32 is a schematic plan view of a portion of the testing apparatus which is used to measure air leakage across the backside of the papermaking belt of the present invention.
Figure 33:
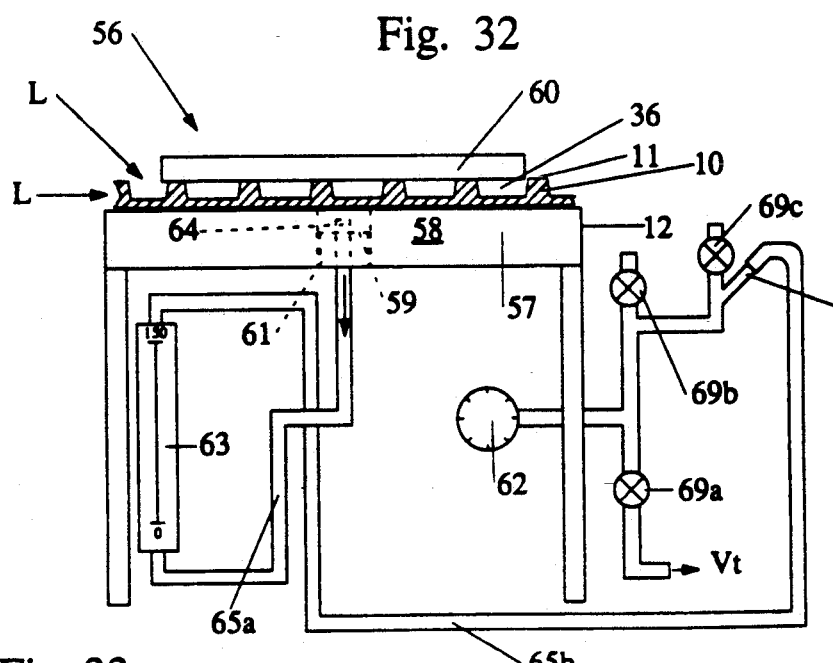
FIG. 33 is a schematic side view of the testing apparatus shown in FIG. 32.

The X-Y or backside air leakage test utilizes a device which is depicted schematically in FIGS. 32 and 33. FIG. 32 is a schematic plan view of the top surface of the backside leakage testing device 56. All of the hoses and tubing generally associated with the testing device have been omitted from FIG. 32 for simplicity. These hoses and tubes are best seen in the side view of the device shown in FIG. 33. As shown in these figures, the backside leakage testing device 56 has as its basic components, a stand 57, which includes a first plate 58 having a hole 59 in the center; a smooth round second plate 60 separate from the stand, which can be placed over the hole 59 in the first plate 58; a liquid-filled vacuum gauge 62; and, a flow meter 63.

In its preferred form, the plate which forms the top of the stand (i.e., the first plate 58) is square, 8 inches by 8 inches (20.32 cm × 20.32 cm), and ½ inch (1.27 cm) thick. The first plate 58 provides a flat, nondeformable, and fluid-impervious (i.e., impervious to gases and liquids) surface. It is preferably made of stainless steel with a mirrored finish and an extremely smooth surface. It is particularly important that there be no scratches or other defects on the surface of this plate to obtain accurate readings. Such surface defects will allow additional air leakage to occur which will result in higher readings than if the first plate 58 did not have such defects. The diameter of the hole in the center of this plate is 1.0 inch (2.54 cm). In addition, in the stand used for the test described herein, a circle approximately 3.5 inches (8.89 cm) in diameter is inscribed into the first plate 58 which is centered around the hole 59. The purpose of this circle is to provide a guideline for centering the second plate 60 over the hole 59. It is not believed that this circle has an effect on the accuracy of the readings.

The round second plate 60 which is not a part of the stand is, in its preferred form, also made of stainless steel, and is 3 inches (7.62 cm) in diameter, and ½ inch (1.27 cm) thick. The second plate 60 weights 405 grams. The weight must be sufficient to retain the sample of the belt which is being tested on the stand without unduly compressing the same.

As shown in FIG. 33, an adapter 61 fits inside the hole 59 in the first plate 58 so a tube or hose can be inserted into the hole 59 and retained therein. The adapter 61 has a short tube 64 which extends from at least one of its ends. This tube 64 extends toward the opening of the hole 59 along the surface of the first plate 58 on which the section of the belt being tested rests. The inside diameter of the tube 64 which extends from the adapter 61 is 0.312 inches (0.793 cm).

A hose 65a runs from the other end of the adapter 61 to the bottom of a flow meter 63. The flow meter 63 is used to measure the rate of air flow through the portion of the papermaking belt 10 being tested. The flow meter 63 has a numbered scale which runs between 0 and 150. As with most flow meters, no specific units are indicated on the scale. Therefore, as will be described more fully below, the flow meter 63 has been calibrated to some known unit. A suitable flow meter is one which is marked FM 102-05 manufactured by the Cole Parmer Company, Chicago, Ill. 60648.

Another hose 65b runs from the top of the flow meter 63 to a tube 68 which is ultimately connected to a vacuum source which pulls a vacuum in the direction of the arrow $V_T$. The vacuum source itself is conventional, and is, therefore, not shown in FIG. 33. There are several branches of the tube 68 which runs from the hose 65b to the vacuum source. Included on these branches are a shut-off valve 69a, a coarse adjustment valve 69b, and a fine adjustment valve 69c, as well as the liquid-filled vacuum gauge 62 which is calibrated for pressures of between 0 and 30 inches (0–76.2 cm) of mercury. Any gauge which accurately measures vacuum in inches of mercury is suitable. An example of such a vacuum gauge is a model which is marked AISI 316 Tube & socket No. 250.2274A manufactured under the trademark Ashcroft Duragauge in Stratford, Conn.

In operation, a section of the papermaking belt 10 is placed across the top of the hole 59 in the plate 58 of the X-Y leakage test stand 57. The section of the papermaking belt 10 is placed on the plate 58 with its paper-contacting side 11 up (i.e., facing away from the plate 58) and its backside 12 directly on the plate 58. The section of the papermaking belt 10 should be sufficient in size so that it is at least larger than the round second plate 60 in all dimensions. Only a portion of the piece of the papermaking belt 10 is shown in FIGS. 32 and 33, however, for purposes of illustration. In addition, it should also be noted that for purposes of illustration, the portion of the papermaking belt 10 shown in these figures has been greatly exaggerated relative to the size of the leakage tester 56.

The second plate 60 is then placed on top of the paper-contacting side 11 of the papermaking belt 10 to hold the belt in place and to cover the conduits 36 of the portion of the papermaking belt 10 being tested to prevent the air from entering through the conduits 36. Vacuum pressure is applied and the valves 69a, 69b, and 69c are adjusted so that the pressure differential measured by the vacuum gauge 62 is preset at approximately 7 inches (17.78 cm) of mercury. Readings have, however, been taken when the vacuum gauge 62 was preset at 5 inches (12.7 cm) of mercury before a completely standardized procedure was established. The readings taken at 5 inches (12.7 cm) of mercury can be converted to readings taken at 7 inches of mercury by inserting the readings taken at 5 inches (12.7 cm) of mercury into the following equation where x is the reading taken at 5 inches (12.7 cm) of mercury and y is the corresponding reading at 7 inches (17.7 cm) of mercury:

$$y = 2.6720 + 1.2361x$$

When vacuum pressure has thus been applied, a direct reading is taken on the flow meter 63. The number which is read directly from the flow meter 63 is a measure of the X-Y leakage across the backside 12 of the section of the papermaking belt 10, or more particularly, of the volume of air which enters around the circumference of the second plate 60 (such as in the direction indicated by arrows L) and moves across the backside 12 of the section of the papermaking belt 10 being tested. The units of this reading have been named "Marlatts" after Henry Marlatt of Mehoopany, Pa., an individual responsible for obtaining some of the readings of air leakage using the above-described test. A conversion from Marlatts into standard cubic centimeters/minute can be made by inserting the reading measured in Marlatts into the following equation where x is the reading in Marlatts and y is the corresponding value in standard cc/minute:

$$y = 36.085 + 52.583x - 0.07685x^2.$$

Figure 34:
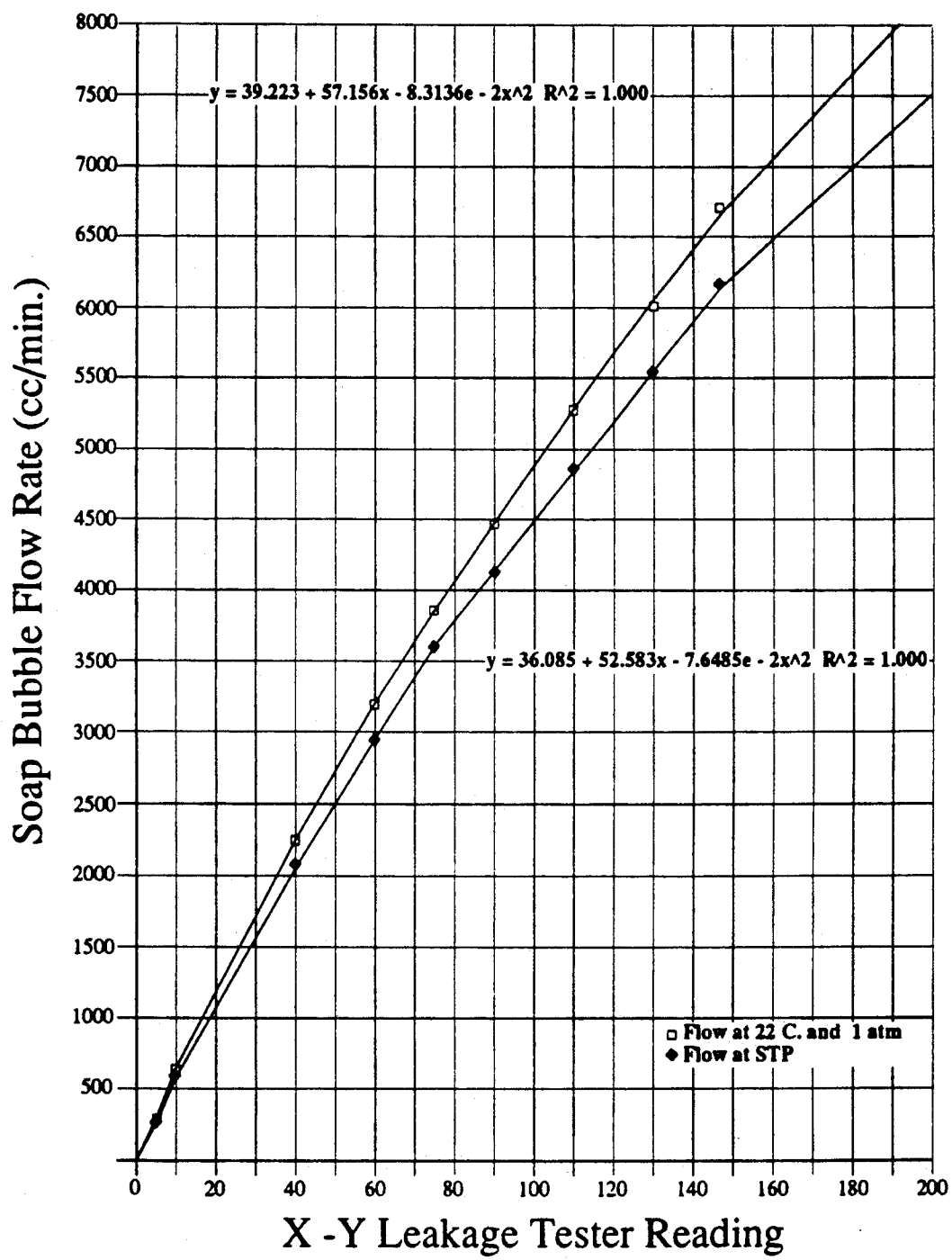
FIG. 34 is a graphical representation of the calibration of the flow meter used in the apparatus shown in preceding two figures.

This equation for converting Marlatts into standard cc/min. was developed by calibrating the flow meter to standard cc/min. using a Buck Optical Soap Bubble Meter. The relationship between the direct readings taken on the flow meter 63 in Marlatts and the corresponding reading in standard cc/min is depicted graphically in FIG. 34.

Preferably, the fluid passage capacity (or amount of air leakage measured using the test described above) should not be less than about 35 Marlatts (approximately 1,800 standard cc/min.). Belts having a fluid passage capacity of 35 Marlatts begin to achieve some of the benefits of reducing the accumulation of paper fibers in the vacuum dewatering equipment used in the papermaking process. In other words, the passageways 37 in the second surface 35 of the framework 32, together with the other elements which comprise the backside texture, should be sufficient in size, or capacity, to permit at least about 1,800 standard cc/min. of air or other fluid to travel (or escape) across the textured backside surface of the belt when the backside 12 of the belt 10 is placed in contact with a flat, nondeformable, fluid-impervious surface and the conduits 36 are covered to prevent the air or fluid from escaping through the conduits 36, and a fluid pressure differential of approximately 7 inches (17.78 cm) of mercury less than atmospheric pressure is applied to the backside 12 of the belt 10.

The amount of air leakage which is present in papermaking belts which will perform at an acceptable level in the papermaking process is an air leakage of generally greater than approximately 40 Marlatts (approximately 2,000 standard cc/min.) at 450–550 cfm air permeability, the preferred minimum range of air permeabilities for the composite belt. Preferably, a belt should have an air leakage reading of at least approximately 70 Marlatts (approximately 3,300 standard cc/min.), and most preferably, the belt should have an air leakage reading of at least approximately 100 Marlatts (approximately 4,500 standard cc/min.) under the same conditions (450–550 cfm air permeability).

The upper limit on the desirable amount of backside texturing is that amount of texturing which would permits the maximum amount of air to travel across the backside 12 of the papermaking belt 10 without the undesirable result of decreasing the vacuum pressure differential below that amount necessary to cause the fibers of the paper web to be deflected into the conduits 36 of the papermaking belt 10. It is believed that this amount could be as great as 250 Marlatts (approximately 8,400 standard cc/min.), or more.

FIGS. 36A–C and 37A–C are enlarged photographs of papermaking belts made according to two alternative versions of the process of the present invention. The photograph of the belt shown in FIGS. 36A–C and 37A–C can be compared to the photographs of the prior smooth backsided belt shown in FIGS. 35A and B.

Several matters should be noted when examining the enlarged photographs of these belts. First, it should be apparent that due to the level of magnification used, the portions of the belts shown in the photographs are generally very small portions of those belts. The portions of the belts which are shown in the photographs (and particularly the backside texturing on those belts) are believed to be fairly representative of the characteristics of the entire belt. This does not mean, however, that sections of the belt which are more representative of the overall characteristics of the entire belt than the portions of the belts depicted in the photographs, do not exist.

In addition, it should be noted that the portions of the belts shown in the photographs will more than likely not correspond identically with the portions of the belt shown in the other photographs taken from different angles due to the difficulty of examining and photographing the minute features of such an article under magnification. In other words, the portions of the belt which form the paper-contacting side 11 and the backside 12 may not actually lie directly above and below each other in the belt 10. Likewise, the cross-section photographs of the belt may not be cross-sections of the same portions of the belt shown in the top and bottom side photographs. With this is mind, the enlarged photographs of the belts will now be examined.

Figure 35A:
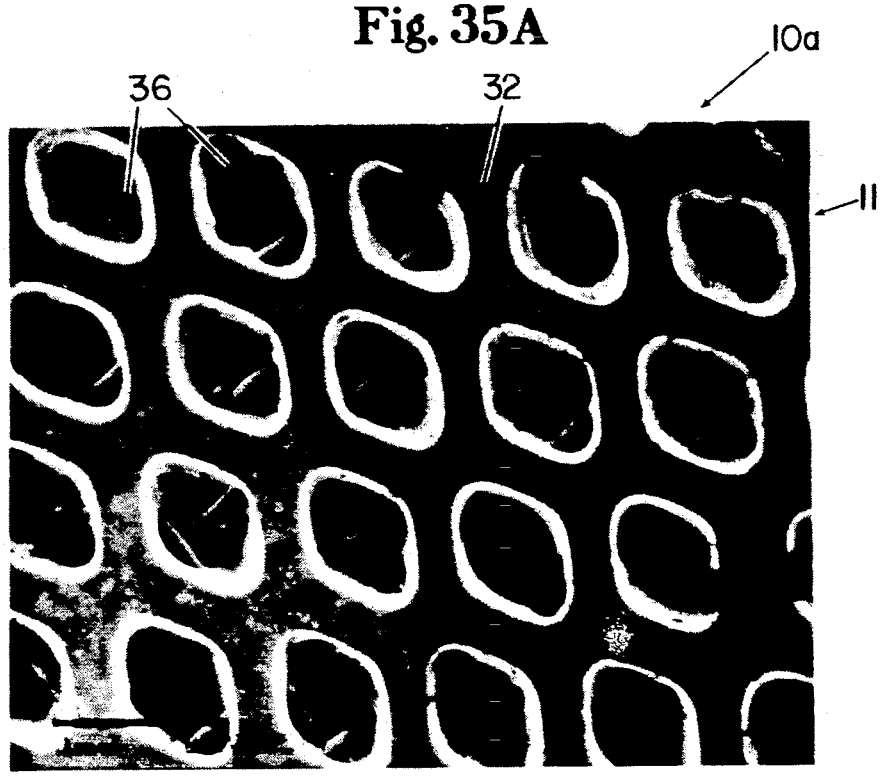
FIG. 35A is a plan view photograph, enlarged about 25 times actual size, of the top side of a papermaking belt which does not contain the improvements disclosed herein.
Figure 35B:
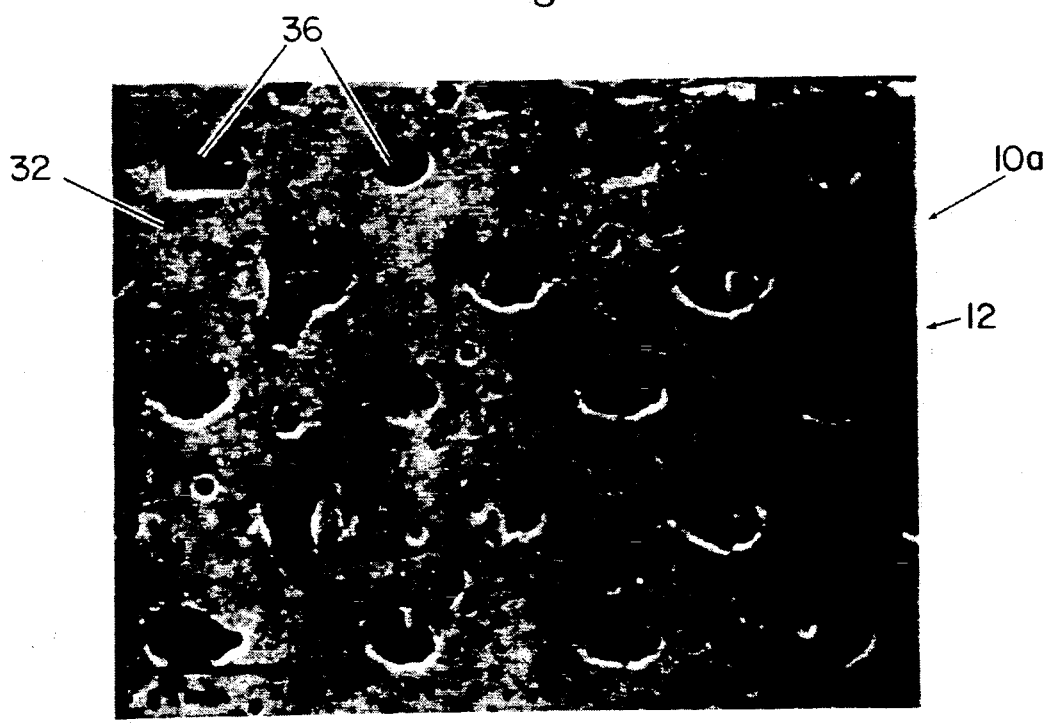
FIG. 35B is a plan view photograph, enlarged about 25 times actual size, of the backside of a papermaking belt which does not contain the improvements disclosed herein.

FIGS. 35A and 35B are plan view photographs, each enlarged about 25 times actual size, of the paper-contacting side 11a and the backside 12a, respectively, of a papermaking belt 10a which does not contain the improvements disclosed herein. The belt shown in FIGS. 35A and 35B differs somewhat in dimensions from the belts formed by the process of the present invention because the belt shown in FIGS. 35A and 35B is a 711 linear Idaho belt. The belt shown in FIGS. 35A and B, therefore, has smaller-sized conduits 36, and a greater number of conduits per square inch.

The backside 12a of the belt 10a shown in FIG. 35B shows one of the problems which occurred in casting belts having smaller conduits. The conduits 36 tended to close up on the backside 12a. Ideally, the backside 12a of the belt 10a in FIG. 35B should appear nearly identical to the paper-contacting side 11a shown in FIG. 35A. If the walls 44 of the conduits 36 are tapered, in the backside the conduits should appear smaller and the area of the backside network surface should be greater. The departure from the hypothetical in the ideal belt is also caused partially by minor imperfections in the belt which appeared to be greatly exaggerated in these photographs. When backside 12 of the belt 10a shown in FIG. 1B is examined macroscopically, the conduit openings in the backside 12a of the belt 10a appear to be very similar to the conduit openings in the paper-contacting side 11a of the belt 10a. However, such as examination of the belt 10a reveals that a very thin film of resinous material covers the conduits which may at least partially account for the differences in the appearance of the backside 12a of the belt 10a.

Figure 36A:
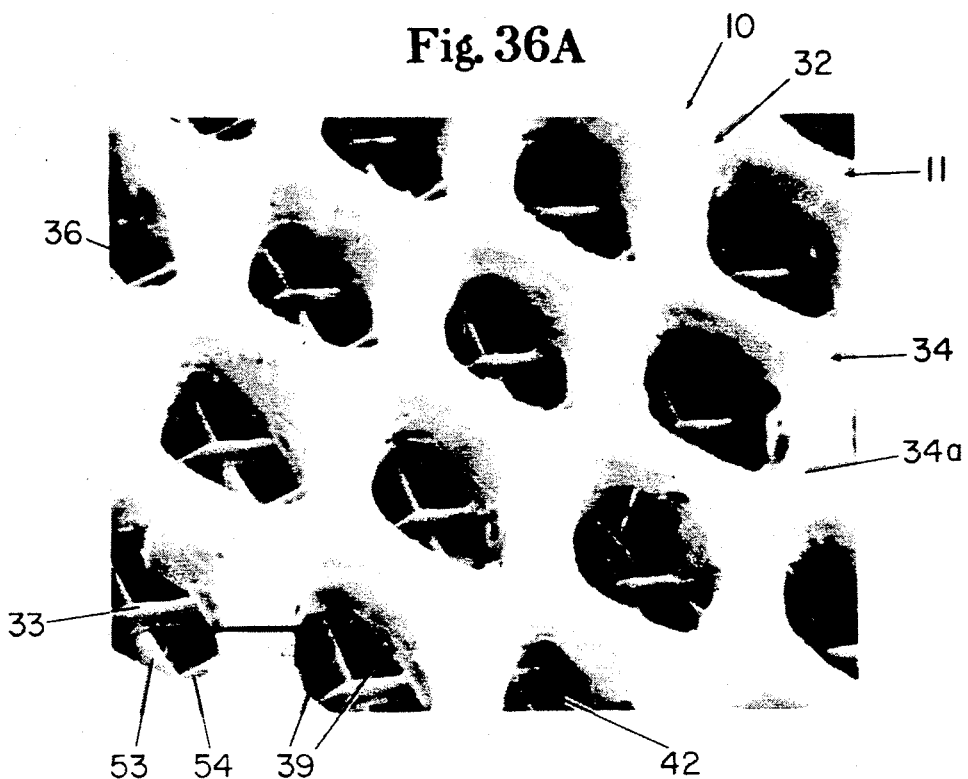
FIG. 36A is a photograph, enlarged about 25 times, of the top side of a papermaking belt made by one alternative embodiment of the present invention. The photograph was taken at an angle of approximately 35 degrees relative to an imaginary line drawn normal to the surface of the top side.
Figure 36B:
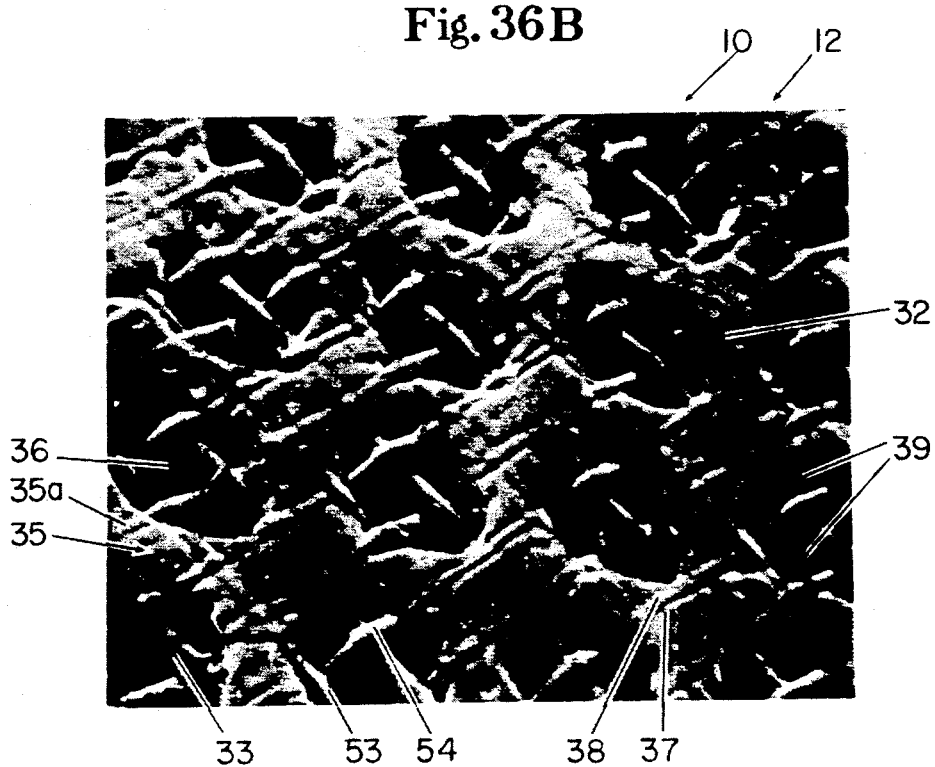
FIG. 36B is a photograph, enlarged about 25 times, of the backside of the papermaking belt shown in FIG. 36A. The photograph was taken at an angle of approximately 35 degrees relative to an imaginary line drawn normal to the surface of the backside.
Figure 36C:
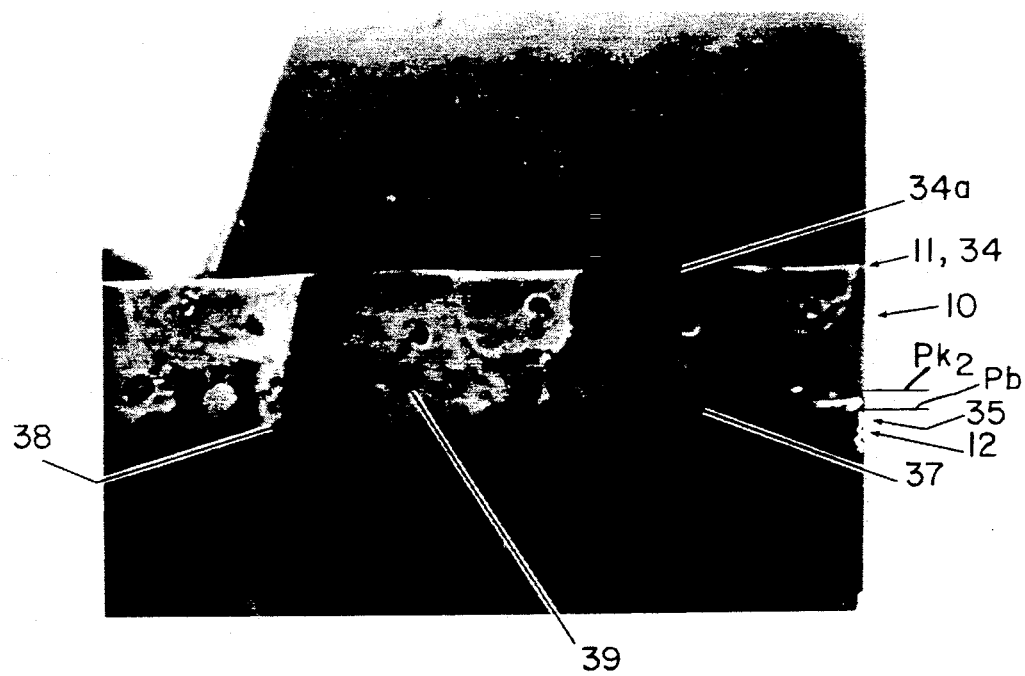
FIG. 36C is a sectional edge view photograph, enlarged about 25 times, of the papermaking belt shown in FIGS. 36A and 36B.

The photographs of the belt 10 shown in FIGS. 36A-C depict a belt which was made in accordance with one alternative embodiment of the process of the present invention. The backside texture of the belt shown in these figures was created by utilizing a monolayer woven fabric as the textured surface. The monolayer woven fabric had a 18×20 (number of warp yarns per inch by number of weft yarns per inch) weave. This woven fabric was placed on top of a barrier film which was introduced into the system similarly to the barrier film 76 shown in FIG. 27. The fabric was then covered to prevent it from being contaminated by resin by a second highly conformable barrier film. This second barrier film was introduced similarly to the way the first barrier film was brought into the system. (Although the second barrier film supply roll was located so that this second barrier film was positioned between the monolayer woven fabric and the reinforcing structure). The second barrier film was made from a material known as Ethyl Visqueen, a 1 mil polyethylene film.

The photographs of the belt 10 shown in FIGS. 36A-36C have been enlarged about 25 times the actual size of the belt. FIG. 36A is a photograph of the paper-contacting side 11 of the belt 10 taken at an angle of approximately 35 degrees relative to an imaginary line drawn normal to the surface of the paper-contacting side (i.e., relative to the z-direction). FIG. 36B is a photograph of the backside 12 of the belt 10 shown in FIG. 36A and FIG. 36C is a sectional view of the belt 10 shown in FIGS. 36A and 36B.

FIG. 36A shows that the paper side network 34a (upon which the paper web will be carried) is macroscopically monoplanar, patterned and continuous. As shown in FIG. 36A, the paper side network 34a is also microscopically monoplanar, patterned and continuous at the level of magnification at which the photograph was taken. The paper side network surface 34a surrounds and defines the openings 42 of a plurality of conduits 36 into which the fibers in the embryonic web can be deflected and rearranged into the form of the improved paper web. The reinforcing structure 33 can be seen in the holes or openings 41 found by the conduits 36. The reinforcing structure 33 is comprised of a plurality of machine direction warp yarns 53 which are interwoven with a plurality of cross-machine direction weft yarns 54 to leave interstices 39 therebetween. As shown in FIG. 36A, the interstices 39 are generally several times smaller than the conduits 36. The reinforcing structure 33 strengthens the framework 32 without interfering with the drainage of water and the passage of air through the conduits 36.

The backside 12 of the belt 10 is shown in FIG. 36B and 36C. FIGS. 36B and 36C shows the backside texturing which is formed by one version of the process of the present invention. As shown in FIG. 36B, the backside 12 of the belt 10 shown in FIG. 36B has a backside network 35a which exhibits some of patterned and continuous properties of the paper side network 34a. The backside network 35a, however, is clearly not monoplanar. In FIG. 36B, it appears that this departure from a monoplanar character is to some extent due to the fact that the yarns of the reinforcing structure 33 appear to cause the backside network 35a to bulge outward. These bulges comprise the passageways 37 that provide surface texture irregularities 38 in the backside network 35a.

FIG. 36C shows that in addition to the passageways 37 and irregularities 38 formed by these bulges, a multiplicity of passageways 37 are disposed inward of the plane defined by the machine-facing side of the reinforcing structure $p_{k2}$ in the interstices 39 so that a portion of the projected area of the passageways corresponds with a portion of the projected open area of the reinforcing structure 33. FIG. 36C also shows that a multiplicity of the passageways 37 are positioned outward of the plane defined by the machine-facing side of the reinforcing structure $P_{k2}$. FIGS. 36B and 36C show that (at least those) passageways 37 formed by the bulges around the yarns of the reinforcing structure 33 are regularly spaced and positioned in the backside network 35a in a pattern.

Figure 37A:
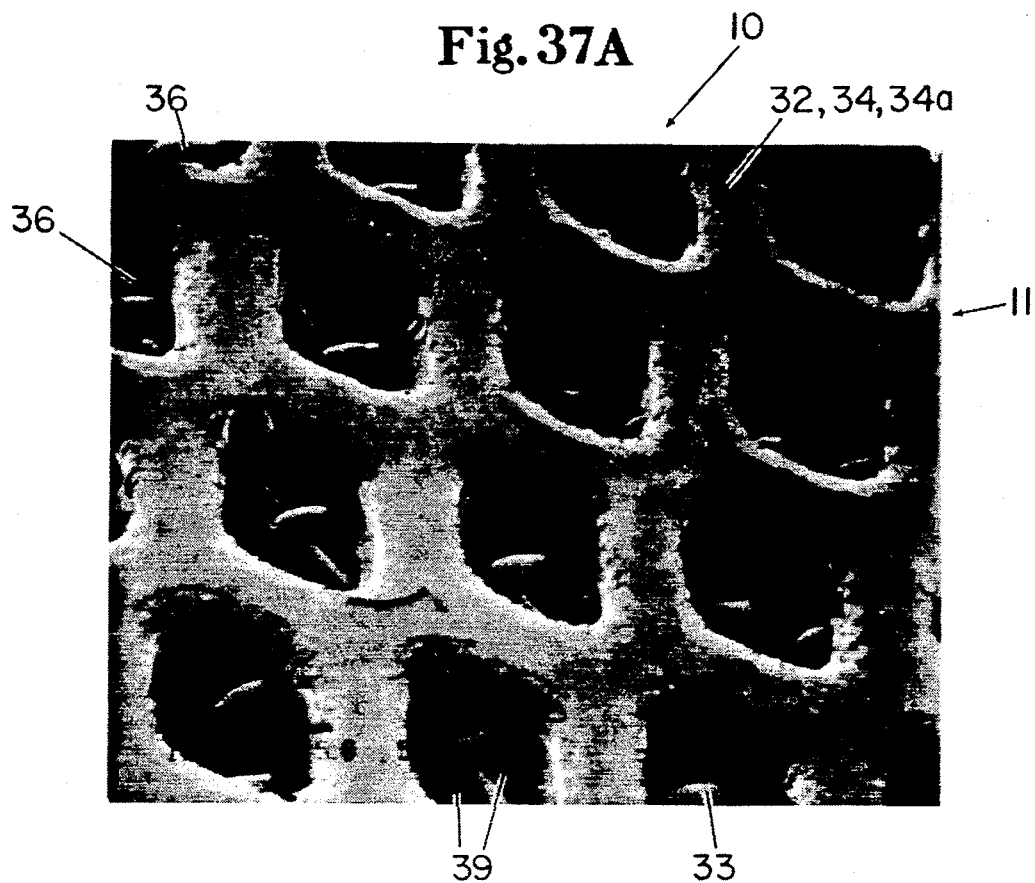
FIG. 37A is a photograph, enlarged about 25 times, of the top side of a papermaking belt made by another alternative embodiment of the present invention. The photograph was taken at an angle of approximately 35 degrees relative to an imaginary line drawn normal to the surface of the top side.
Figure 37B:
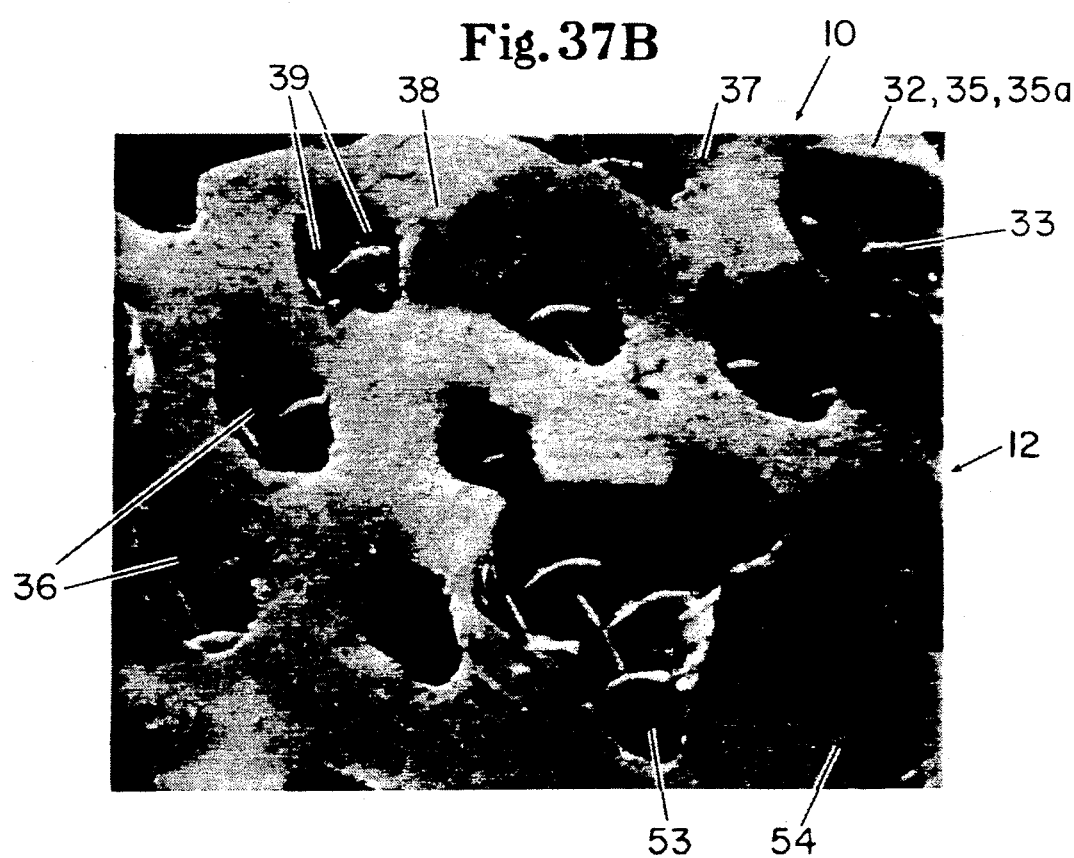
FIG. 37B is a photograph, enlarged about 25 times, of the backside of the papermaking belt shown in FIG. 37A. The photograph was taken at an angle of approximately 35 degrees relative to an imaginary line drawn normal to the surface of the backside.
Figure 37C:
FIG. 37C is a sectional edge view photograph, enlarged about 25 times, of the papermaking belt shown in FIGS. 37A and 37B.

The photographs of the belt 10 shown in FIGS. 37A-C depict a belt which was made in accordance with another alternative embodiment of the process of the present invention. The backside texture of the belt shown in these figures was made utilizing a textured barrier film instead of a separate textured element or surface. The textured barrier film was made of a material known as Cracked Ice Embossed (CIE) 142 film available from the Borden Chemical Company. The Cracked Ice Embossed (CIE) 142 film has a texture distributed randomly across its surface.

The angles from which the photographs shown in FIGS. 37A-C were taken are similar to those from which FIGS. 36A-C were taken. The characteristics of the paper side 11 of the belt 10 shown in FIG. 37A are also generally similar to the paper side 11 of the belt 10 shown in FIG. 36A. The characteristics of the backside 12 (and particularly, the backside network 35a) are quite different form the belt shown in FIGS. 36A-C.

The backside 12 of the belt 10 made by the second version of the process of the present invention is shown in FIGS. 37B and 37C. The backside network 35a is neither monoplanar or continuous. In FIG. 37B, the backside texture of the belt 10 shown appears to fall into two general categories.

The first category of backside texture appears to resemble a plurality of projections or protrusions from the plane defined by the machine-facing side of the reinforcing structure $P_{k2}$. As shown in FIG. 37C, these protrusions appear in cross-section to provide passageways 37 which are characterized by one continuous curved wall. As also best shown in FIG. 37C, surrounding, or bordering these passageways 37 are the surface texture irregularities 38 which resemble ridges in cross-section. All of the passageways 37 shown in FIG. 37C are positioned outward from the plane defined by the machine-facing side of the reinforcing structure $P_{k2}$.

The second category of texture is at those places where chunks or pieces of the backside network 35a appear to have been removed entirely. It is believed that this second type of texture may have been created when portions of the liquid photosensitive resin coating adhered to the Cracked Ice Embossed film, and were removed when the composite papermaking belt separated from the Cracked Ice Embossed film after the composite belt left the casting drum. The places where the pieces of the backside network 35a appear to have been removed leave passageways 37 which interconnect several conduits 36 along the backside 12 of the belt 10. Despite this interconnection, as shown in FIG. 37A, the paper side network 34a has remained relatively intact and provides discrete, isolated conduits 36. Both categories of texture appear to occur fairly randomly.

While particular embodiments of the present invention have been illustrated and described, it would be obvious to those skilled in the art that various other changes and modifications can be made without departing from the spirit and scope of the invention. It is therefore intended to cover in the appended Claims all such changes and modifications that are within the scope of this invention.

What is claimed is:

1. A method of making a papermaking belt for use in a papermaking machine and having a textured backside, said papermaking belt comprising a reinforcing structure and a resinous framework having a first surface, a second surface opposite said first surface, and conduits extending between said first surface and said second surface, said first surface having a paper side network formed therein defining said conduits, said second surface having a backside network with passageways, distinct from said conduits, that provide surface texture irregularities in said backside network to reduce build-up of paper fibers on said papermaking machine, the method comprising the steps of:

(a) providing a forming unit with a textured working surface;
   (b) providing a reinforcing structure having a paper-facing side, a machine-facing side opposite said paper-facing side, and interstices;
   (c) bringing at least a portion of said machine-facing side of said reinforcing structure into contact with said working surface of said forming unit;
   (d) applying a coating of liquid photosensitive resin to at least one side of said reinforcing structure, said coating being applied so that at least a portion of said second surface of said coating is positioned adjacent said working surface of said forming unit, said paper-facing side of said reinforcing structure is positioned between said first and second surfaces of said coating, and the portion of said coating which is positioned between said first surface of said coating and said paper-facing side of said reinforcing structure forms a resinous overburden, wherein at least a portion of said coating penetrates into the texture of the working surface of said forming unit, said texture creating areas in said second surface of said coating which are defined by said textured surface;
   (e) controlling the thickness of said overburden to a preselected value;
   (f) providing a mask having opaque and transparent regions, said opaque regions together with said transparent regions defining a preselected pattern in said mask;
   (g) positioning said mask between said coating of liquid photosensitive resin and an actinic light source so that said mask is in contacting relation with said first surface of said coating, said opaque regions of said mask protecting a portion of said coating from the light rays of said light source and said transparent regions leaving other portions of said coating unprotected;
   (h) curing said unprotected portions of said coating of liquid photosensitive resin and leaving said protected portions uncured by exposing said coating of liquid photosensitive resin to said light source through said mask to form a partially-formed composite belt; and
   (i) removing substantially all uncured liquid photosensitive resin from said partially-formed composite belt to leave a hardened resin framework around at least a portion of said reinforcing structure, which framework has a plurality of conduits in those regions which were protected from said light rays by the opaque regions of the mask and passageways that provide surface texture irregularities in the backside network of said framework corresponding to the places where the second surface of the coating penetrated into the texture of the working surface of the forming unit.

2. The method of claim 1 additionally comprising the step of interposing a barrier film between said reinforcing structure and the forming unit, so that said barrier film protects the forming unit from becoming contaminated with resin.

3. The method of claims 1 wherein the step (a) of providing a forming unit with a textured working surface comprises (i) providing a forming unit, (ii) providing an element with a textured surface and a forming unit-contacting surface, and (iii) placing said forming unit-contacting surface of said element on said forming unit.

4. The method of claim 3 wherein said element having a textured surface comprises a barrier film which protects said forming unit from becoming contaminated with resin.

5. The method of claim 3 additionally comprising the step of placing a barrier film over said textured surface of said element so that said barrier film protects said element from becoming contaminated with resin.

6. A method of making a papermaking belt for use in a papermaking machine and having a textured backside, said papermaking belt comprising a reinforcing structure and a resinous framework having a first surface, a second surface opposite said first surface, and conduits extending between said first surface and said second surface, said first surface having a paper side network formed therein defining said conduits, said second surface having a backside network with passageways, distinct from said conduits, that provide surface texture irregularities in said backside network to reduce build-up of paper fibers on said papermaking machine, the method comprising the steps of:
   (a) providing a forming unit with a textured working surface;
   (b) providing a reinforcing structure having a paper-facing side, a machine-facing side opposite said paper-facing side, and interstices;
   (c) applying a first coating of liquid photosensitive resin to at least said machine-facing side of said reinforcing structure to at least partially fill the void areas of said reinforcing structure;
   (d) bringing at least a portion of said machine-facing side of said reinforcing structure into contact with said working surface of said forming unit;
   (e) applying a second coating of liquid photosensitive resin to said paper-facing side of said reinforcing structure so that said first coating together with said second coating forms a single coating which has a first surface and a second surface and said coating substantially fills the void areas of the reinforcing structure, said coating being distributed so that at least a portion of said second surface of said coating is positioned adjacent said working surface of said forming unit, said paper-facing side of said reinforcing structure is positioned between said first and second surfaces of said coating, and the portion of said coating positioned between said first surface of said coating and the paper-facing side of said reinforcing structure forms a resinous overburden, wherein at least a portion of said coating penetrates into the texture of the working surface of said forming unit, said texture coating areas in said second surface of said coating which are defined by said textures surface;
   (f) controlling the thickness of said overburden to a preselected value;
   (g) providing a mask having opaque and transparent regions, said opaque regions together with said transparent regions defining a preselected pattern in said mask;
   (h) positioning said mask between said coating of liquid photosensitive resin and an actinic light source so that said mask is in contacting relation with said first surface of said coating, said opaque regions of said mask protecting a portion of said coating from the light rays of said light source, and said transparent regions leaving other portions of said coating unprotected;
   (i) curing said portions of liquid photosensitive resin in the regions left unprotected by said transparent regions of said mask by exposing said coating of liquid photosensitive resin to light having an activating wavelength through said mask to form a partially-formed composite belt; and,
   (j) removing substantially all uncured liquid photosensitive resin from said partially-formed composite belt to leave a hardened resin framework around at least a portion of said reinforcing structure, which framework has a plurality of conduits in those regions which were protected from said light rays by the opaque regions of the mask and passageways that provide surface texture irregularities in the backside network of said framework corresponding to the places where the second surface of the coating penetrated into the texture of the working surface of the forming unit.

7. The method of claim 6 additionally comprising the step of interposing a barrier film between said reinforcing structure and the forming unit, so that said barrier film protects the forming unit from becoming contaminated with resin.

8. The method of claims 6 wherein the step (a) of providing a forming unit with a textured working surface comprises (i) providing a forming unit, (ii) providing an element with a textured surface and a forming unit-contacting surface, and (iii) placing said forming unit-contacting surface of said element on said forming unit.

9. The method of claim 8 wherein said element having a textured surface comprises a barrier film which protects said forming unit from becoming contaminated with resin.

10. The method of claim 8 additionally comprising the step of placing a barrier film over said textured surface of said element so that said barrier film protects said element from becoming contaminated with resin.

* * * * *

UNITED STATES PATENT AND TRADEMARK OFFICE
CERTIFICATE OF CORRECTION

PATENT NO. : 5,260,171
DATED : NOVEMBER 9, 1993
INVENTOR(S) : JOHN A. SMURKOSKI, GARY L. LEGGITT, GREGORY L. WILSON

It is certified that error appears in the above-identified patent and that said Letters Patent is hereby corrected as shown below:

Column 8, line 27    delete "multiplayer" and insert therefor --multilayer--.

Column 60, line 52   delete "Proctor" and insert therefor --Procter--.

Column 66, line 42   delete "weights" and insert therefor --weighs--.

Column 69, line 40   delete "in the."

Signed and Sealed this

Eighth Day of November, 1994

Attest:

BRUCE LEHMAN

*Attesting Officer*   *Commissioner of Patents and Trademarks*